United States Patent [19]

Morishita

[11] Patent Number: 5,159,424
[45] Date of Patent: Oct. 27, 1992

[54] SEMICONDUCTOR DEVICE HAVING A HIGH CURRENT GAIN AND A HIGHER GE AMOUNT AT THE BASE REGION THAN AT THE EMITTER AND COLLECTOR REGION, AND PHOTOELECTRIC CONVERSION APPARATUS USING THE DEVICE

[75] Inventor: Masakazu Morishita, Atsugi, Japan
[73] Assignee: Canon Kabushiki Kaisha, Tokyo, Japan
[21] Appl. No.: 448,211
[22] Filed: Dec. 8, 1989
[30] Foreign Application Priority Data

| Dec. 10, 1988 | [JP] | Japan | 63-312725 |
| Dec. 10, 1988 | [JP] | Japan | 63-312726 |
| Mar. 29, 1989 | [JP] | Japan | 1-77439 |
| Mar. 29, 1989 | [JP] | Japan | 1-77441 |
| Mar. 30, 1989 | [JP] | Japan | 1-79932 |

[51] Int. Cl.$^5$ .................................... H01L 29/72
[52] U.S. Cl. ........................ 357/34; 357/16; 357/30; 357/35
[58] Field of Search ........... 357/16, 34, 35, 30 E, 357/30 P, 30 N, 60, 61, 90, 63

[56] References Cited

U.S. PATENT DOCUMENTS

| 3,211,970 | 10/1965 | Christian | 317/235 |
| 3,275,906 | 9/1966 | Matsukura et al. | 317/234 |
| 4,467,519 | 8/1984 | Glang et al. | 357/34 |
| 4,633,287 | 12/1986 | Yamazaki | 357/30 |
| 4,649,409 | 3/1987 | Roppongi et al. | 357/34 |
| 4,672,413 | 6/1987 | Gardner | 357/6 |
| 4,716,445 | 12/1987 | Sone | 357/34 |
| 4,771,013 | 9/1988 | Curran | 357/34 |
| 4,771,326 | 9/1988 | Curran | 357/34 |
| 4,825,259 | 4/1989 | Plummer et al. | 357/34 |
| 4,879,252 | 11/1989 | Komatsu | 357/34 |
| 4,951,115 | 8/1990 | Harame et al. | 357/34 |
| 5,006,912 | 4/1991 | Smith et al. | 357/34 |

FOREIGN PATENT DOCUMENTS

| 63-116465 | 5/1988 | Japan | 357/34 |
| 2-158178 | 6/1990 | Japan | 357/34 |
| 8808206 | 10/1988 | PCT Int'l Appl. | 357/34 |

OTHER PUBLICATIONS

G. L. Patton et al., "Silicon-Germanium-Base Heterojunction Bipolar Transistors By Molecular Beam Epitaxy," IEEE Electron Device Letters, vol. 9, No. 4, Apr. 1988, pp. 165-167.
C. Smith et al., "Prospects for a hetero-structure bipolar transistor made with Si molecular beam epitaxy," Proceedings of the 1987 Bipolar Circuits and Technology Meeting, Sep. 21-22, 1987, pp. 57-60.
T. Tatsumi et al., "Si/Ge$_{0.3}$Si$_{0.7}$Si heterojunction bipolar transistor made with Si molecular beam epitaxy," Applied Physics Letters, vol. 52, No. 11, Mar. 14, 1988, pp. 895-897.
G. D. Shen et al., "Bidirectional Bistability in n-p-n Si/Si$_{1-x}$Ge$_x$/Si Structures," IEEE Electron Device Letters, vol. 9, No. 9, Sep. 1988, pp. 453-456.
H. Temkin et al., "Ge$_x$Si$_{1-x}$ strained-layer heterostructure bipolar transistors," Applied Physics Letters, vol. 52, No. 13, Mar. 28, 1988, pp. 1089-1091.
Patent Abstracts of Japan, vol. 11, No. 306, Oct. 6, 1987, JP-A-62 098 663.
W. Bock et al., "Optical Detection Up to 2.5 Gbit/s With A Standard High-Speed Self-Aligned Silicon Bipolar Transistor," Electronics Letters, vol. 24, No. 13, Jun. 23, 1988, pp. 808-810.
H. U. Schreiber et al., "Si/SiGe Heterojunction Bipolar Transistor with Base Doping Highly Exceeding Emitter Doping Concentration", Electronics Letters, vol. 25, No. 3, Feb. 2, 1989, pp. 185-186.

Primary Examiner—William Mintel
Assistant Examiner—Minh Loan Tran
Attorney, Agent, or Firm—Fitzpatrick, Cella, Harper & Scinto

[57] ABSTRACT

A semiconductor device comprises at least an emitter region of a first conductivity type, a base region of a second conductivity type, and a collector region of a first conductivity type. The base region essentially consists of Si$_{1-x}$Ge$_x$ ($0<X<1$), further comprises regions formed in a depletion layer close to an interface between the base region and the collector region or in the collector region and in a depletion layer close to an interface between the base region and the emitter region or in the emitter region, and has a larger Ge amount at the base region side and a smaller Ge amount at the emitter and collector sides.

27 Claims, 40 Drawing Sheets

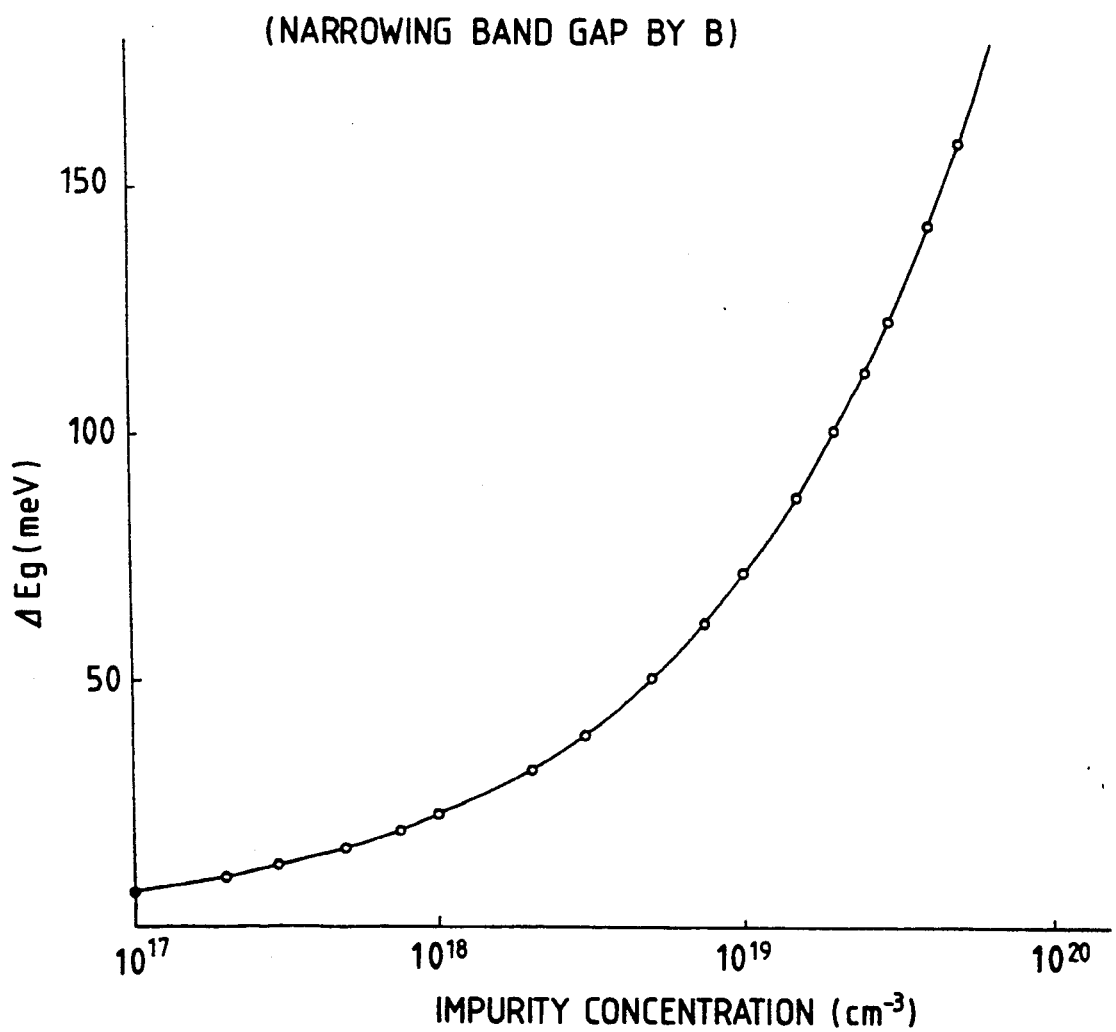

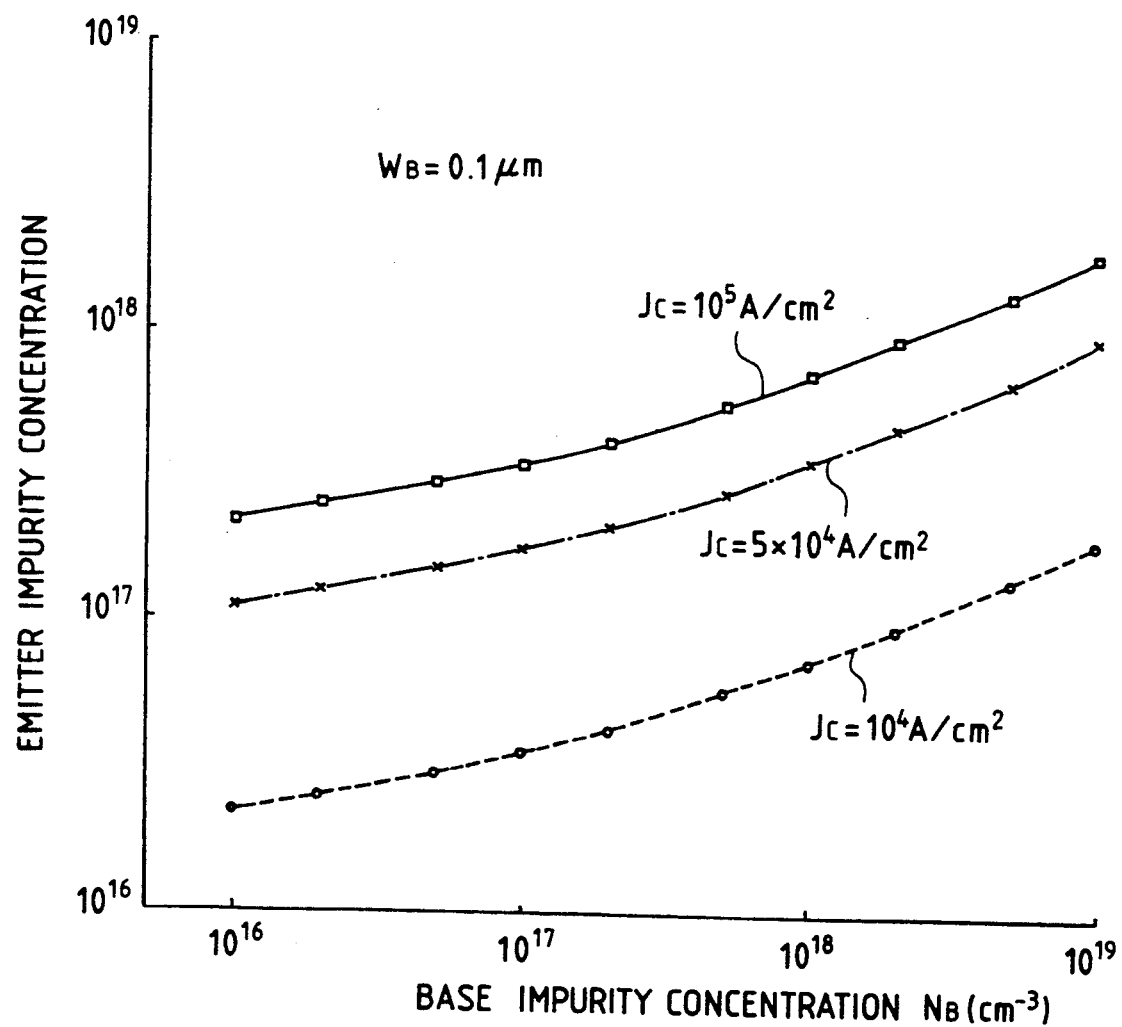

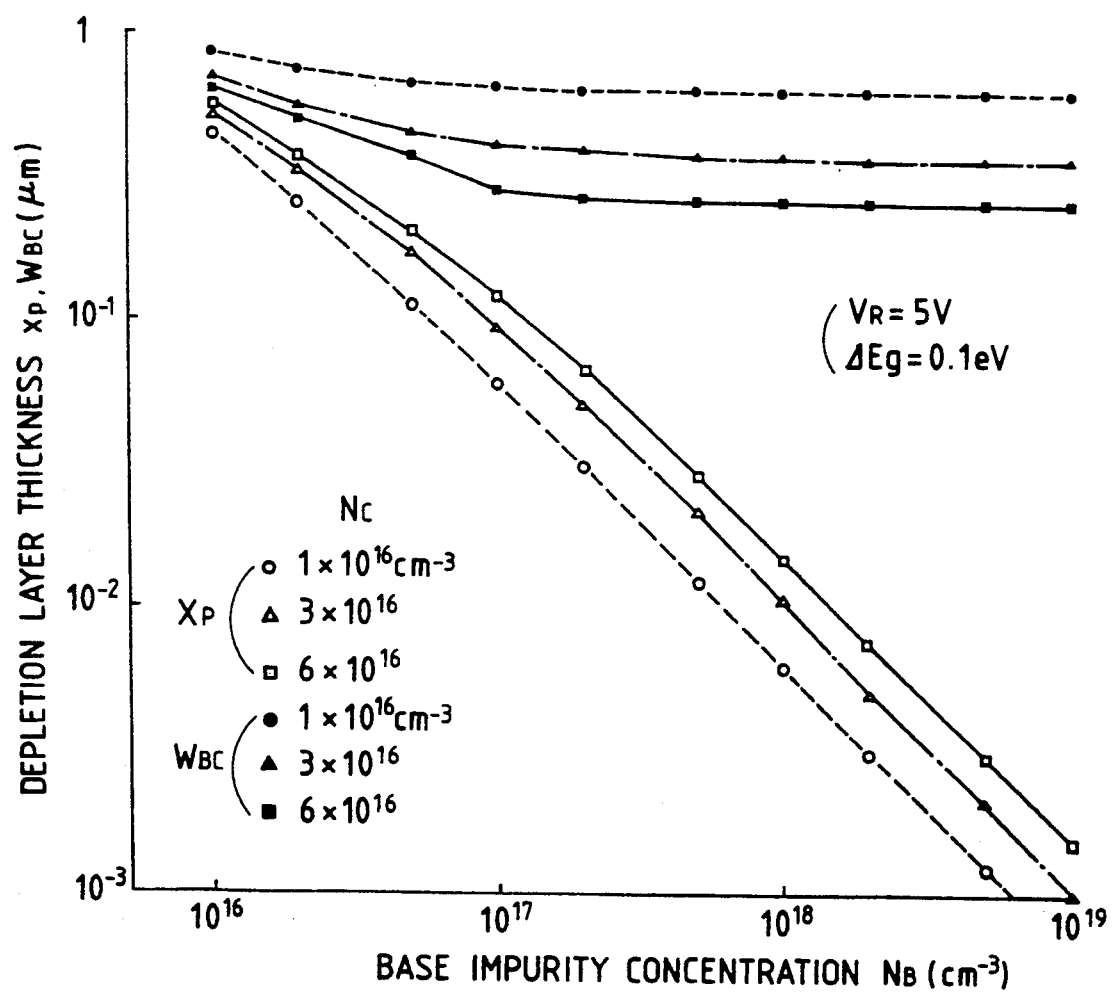

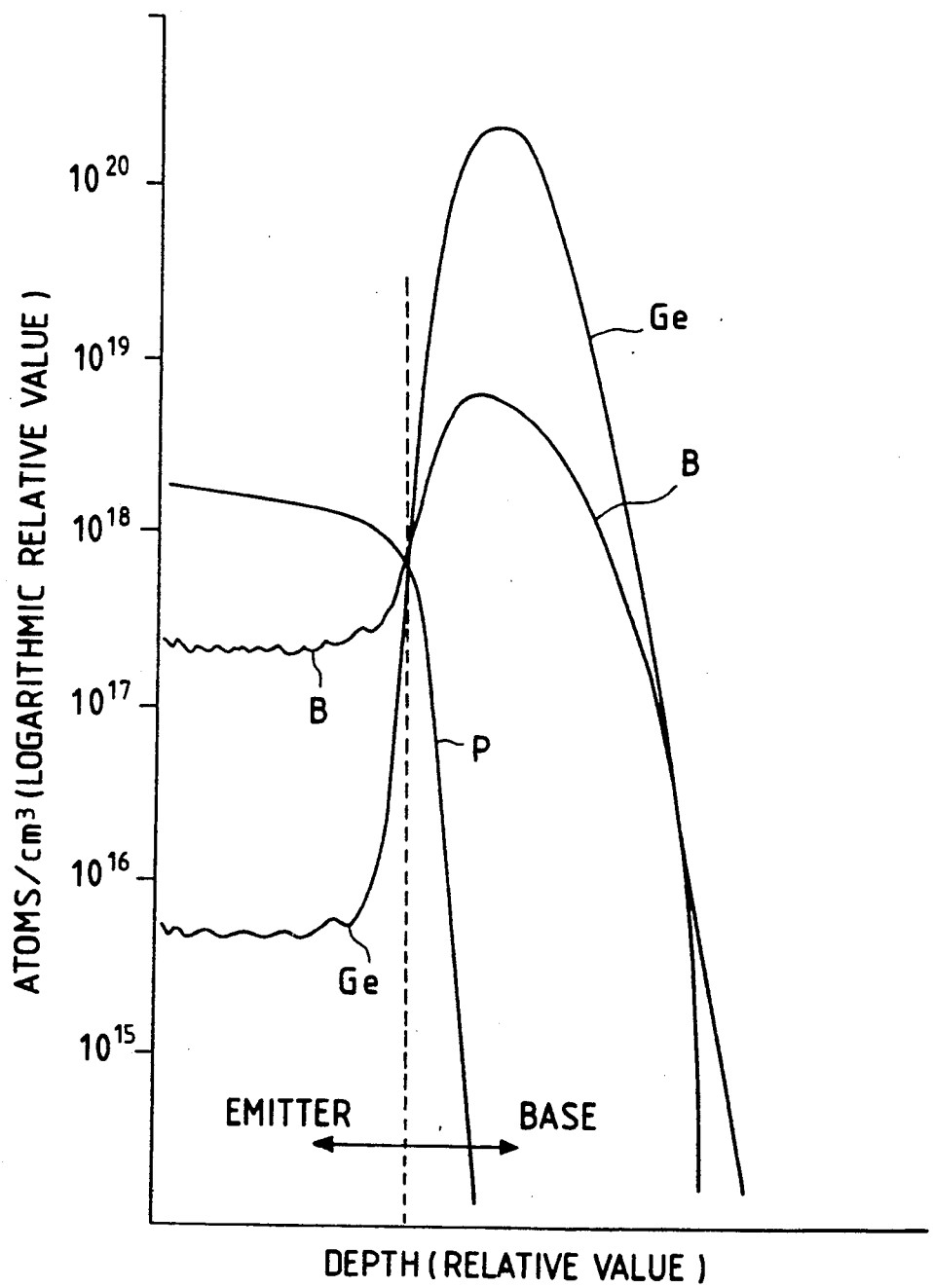

SEMICONDUCTOR DEVICE HAVING A HIGH CURRENT GAIN AND A HIGHER GE AMOUNT AT THE BASE REGION THAN AT THE EMITTER AND COLLECTOR REGION, AND PHOTOELECTRIC CONVERSION APPARATUS USING THE DEVICE

BACKGROUND OF THE INVENTION

1. Field of the Invention

The present invention relates to a semiconductor device and a photoelectric conversion apparatus using the device.

2. Related Background Art

Conventionally, wide variety of configurations and structures are used as the semiconductor device. Among them, a bipolar transistor (hereinafter, referred to as "BPT") has many advantages that high speed switching operation can be expected.

A DOPOSBPT (Doped Poly Silicon BPT), i.e., a BPT having a polysilicon emitter, is known as a BPT having a shallow junction and a high packing density.

FIG. 1 is a sectional view showing an example of a conventional BPT. Referring to FIG. 1, reference numeral 1 denotes a substrate made of silicon (Si); 2, an n+-type buried region including material impurity making conductivity into n-type within Si; 3, an n−-type region having a low impurity concentration; 4, a p-type region including material (impurity) making conductivity into p-type serving as a base region; 5, an n+-type region including n-type impurity serving as an emitter region; 6, an n-type region serving as a channel stopper; 7, an n+-type region of high impurity concentration for reducing a collector resistance of a bipolar transistor; 101, 102, 103, and 104, insulating films for insulating the element, electrodes, and wirings; 200, an electrode made of a metal, silicide, polycide, or the like.

The substrate 1 has an n conductivity type upon doping of an impurity such as phosphorus (Ph), antimony (Sb), or arsenic (As), or a p conductivity type upon doping of an impurity such as boron (B), aluminum (Al), or gallium (Ga). The buried region 2 need not be necessarily formed. Boron (B), gallium (Ga), or aluminum (Al), and germanium (Ge) are doped in the base region 4. The emitter region 5 consists of polysilicon formed by low-pressure chemical vapor deposition (LPCVD).

The base region 4 consists of a mixed crystal of silicon (Si) and germanium (Ge). Both of Si and Ge are diamond type crystals and perfect solid solutions. Therefore, $Si_{1-X}Ge_X$ is a perfect diamond type crystal for every X (0 to 1). A forbidden band width $E_g$ is about 1.1 eV for Si and about 0.7 eV for Ge.

FIG. 2 is a graph showing a relationship between a mixed crystal ratio X and the forbidden band width $E_g$ of $Si_{1-X}Ge_X$. Referring to FIG. 2, the abscissa represents the mixed crystal ratio X, the ordinate represents the forbidden band width $E_g$, a reduction width $\Delta E_C$ at a conduction band side, and a reduction width $\Delta E_V$ at a valence band side. As is apparent from FIG. 13, in $Si_{1-X}Ge_X$, most of a band gap reduction occurs in a valence band. This is very convenient for the hetero BPT because injection of electrons from an emitter to a base is not prevented.

In another configuration, the BPT of this type comprises a polysilicon emitter region. A silicon oxide having a thickness of 10 to 20 °Å is formed between the polysilicon emitter region and an emitter region formed by diffusing an impurity from polysilicon to single-crystal silicon.

FIG. 3 is a schematic sectional view showing a conventional BPT. Referring to FIG. 3, reference numeral 1 denotes a substrate; 2, an n+-type buried region; 3, an n−-type region having a low impurity concentration; 4, a p-type region serving as a base region; 5, an n+-type region serving as an emitter region; 6, an n-type region serving as a channel stopper; 7, an n+-type region for reducing a collector resistance of the bipolar transistor; 8, silicon oxide regions formed in the single-crystal emitter region 101, 102, 103, and 104, insulating films for isolating the element, electrodes, and wirings; and 200, electrodes made of a metal, a silicide, a polycide, or the like.

The substrate 1 has an n conductivity type upon doping of an impurity such as phosphorus (Ph), antimony (Sb), or arsenic (As), or a p conductivity type upon doping of an impurity such as boron (B), aluminum (Al), or gallium (Ga). The buried region 2 need not be necessarily formed. The n−-type region is formed by epitaxial techniques. Boron (B), gallium (Ga), or aluminum (Al), and germanium (Ge) are doped in the base region 4. The emitter region 5 consists of polysilicon formed by low-pressure chemical vapor deposition (LPCVD).

This BPT, i.e., the BPT having the single crystal emitter region and the silicon oxide formed between the single crystal emitter region and the base region, has an advantage in that the oxide film can increase a current gain of the BPT.

Analytically theoretical expressions will be described with reference to FIG. 4 to explain the reason why the oxide film can increase the current gain of the BPT.

FIG. 4 shows a diagram showing potentials in the direction of depth of the cross section along the line A—A' in FIG. 3 in a normal operation. Referring to FIG. 4, reference numeral $W_E$ denotes a thickness of an emitter neutral region; $W_B$, a thickness of a base neutral region. As shown in FIG. 4, since the oxide is formed between the emitter region and the base region, a potential barrier is present at a position of $W_E'$.

In the conventional semiconductor device having the above structure, the base current consists of the following two components.

A diffusion current of positive holes flowing from the base to the emitter can be approximated as follows due to the presence of the potential barrier:

$$J_{B1} = (q \cdot n_i^2 \cdot D_P/N_E L_P) \times tanh(W_E'/L_P)[exp(V_{BE}/kT) - 1] \quad (1)$$

A recombination current of electrons injected from the emitter is represented as follows:

$$J_{B2} = (q \cdot n_i^2 \cdot D_n/N_E \cdot L_n) \times \\ [\{cosh(W_B/L_N) - 1\}/\{sinh(W_B/L_N)\}] \times \\ [exp(V_{BE}/kT) - 1] \quad (2)$$

A collector current is represented as follows:

$$J_C = (q \cdot n_i^2 \cdot D_n/N_B L_n)[cosech(W_B/L_N)] \\ \times [exp(V_{BE}/kT) - 1] \quad (3)$$

where q is a charge, $n_i$ is an intrinsic semiconductor charge density (Si), $N_E$ is an emitter impurity density, $N_B$ is a base impurity density, $D_P$ is a positive hole diffusion coefficient, $D_N$ is an electron diffusion coefficient, $L_P$ is a positive hole diffusion length ($\simeq(D_P\tau_P)^{\frac{1}{2}}$), $L_N$ is an electron diffusion length ($\simeq(D_N\tau_N)^{\frac{1}{2}}$), k is a Boltzmann constant, T is an absolute temperature, $V_{BE}$ represents base-emitter forward biased electrons, $\tau_P$ and $\tau_N$ are minority carrier lifetimes of the positive holes and the electrons.

In equation (1), when $W_E'$ is decreased, $J_{Bl}$ is reduced. Therefore, a current gain can be increased:

$$h_{FE} = J_C/(J_{Bl} + J_{B2}) \quad (4)$$

FIG. 5 is a schematic sectional view showing a different type of BPT. Referring to FIG. 5, reference numeral 1 denotes a substrate; 2, an n+-type buried region; 3, an n−-type region having a low impurity concentration; 4, a p-type region serving as a base region; 5, an n+-type region serving as an emitter region; 6, an n-type region serving as a channel stopper; 7, an n+-type region for reducing a collector resistance of the bipolar transistor; 101, 102, 103, and 104, insulating films for insulating the element, electrodes, and wirings; and 200, electrodes made of a metal, a silicide, a polycide, or the like.

The substrate 1 has an n conductivity type upon doping of an impurity such as phosphorus (Ph), antimony (Sb), or arsenic (As), or a p conductivity type upon doping of an impurity such as boron (B), aluminum (Al), or gallium (Ga). The buried region 2 need not be necessarily formed. The n−-type region 3 is formed by epitaxial techniques. Boron (B), gallium (Ga), or aluminum (Al), and germanium (Ge) are doped in the base region 4. The emitter region consists of polysilicon.

In the conventional semiconductor device having the above structure, the base current consists of the following two components.

A diffusion current of positive holes flowing from the base to the emitter can be approximated as follows due to the presence of the potential barrier:

$$J_{Bl} = \{(q \cdot n_i^2 \cdot D_p)/(N_E \cdot L_p)\} \times cosh(W_E/L_p) \{exp(V_{BE}/kT) - 1\} \quad (1)$$

A recombination current of electrons injected from the emitter is represented as follows:

$$J_{B2} = (q \cdot n_i^2 \cdot D_n/N_B \cdot L_n) \times [\{cosh(W_B/L_N) - 1\}/\{sinh(W_B/L_N)\}] \times [exp(V_{BE}/kT) - 1] \quad (2)$$

A collector current is represented as follows:

$$J_C = \{(q \cdot n_i^2 \cdot D_n)/(N_B \cdot L_n)\} \times cosech(W_B/L_n) \{exp(V_{BE}/kT) - 1\} \quad (3)$$

where q is a charge, $n_i$ is an intrinsic semiconductor charge density (Si), $N_E$ is an emitter impurity density, $N_B$ is a base impurity density, $D_P$ is a positive hole diffusion coefficient, $D_N$ is an electron diffusion coefficient, $L_P$ is a positive hole diffusion length ($\simeq(D_P\tau_P)^{\frac{1}{2}}$), $L_N$ is an electron diffusion length $(D_N\tau_N)^{\frac{1}{2}}$, k is a Boltzmann constant, T is an absolute temperature, $V_{BE}$ represents base-emitter forward biased electrons, $W_B$ is a thickness of the base, and $W_E$ is a thickness of the emitter. Note that $\tau_P$ and $\tau_N$ are minority carrier lifetimes of the positive holes and the electrons.

In the above conventional BPT, however, a point defect as an electrical recombination center or dislocation caused by a lattice defect occurs in an interface between the Si crystal forming the emitter region and the $Si_{1-X}Ge_X$ eutectic forming the base region. Therefore, a defect occurs near an emitter-base junction or between the base and the collector to increase a base current of the BPT, thereby reducing a current gain $h_{FE}$.

An influence of the point defect or dislocation on $h_{FE}$ is significantly increased at a low current side of a collector current, and $h_{FE}$ is reduced close to one or below one in some cases.

This will be described in detail below.

The point defect or dislocation at the interface between the Si crystal or $Si_{1-X}Ge_X$ mixed crystal is caused by a difference in lattice coefficients between Si and $Si_{1-X}Ge_X$.

The lattice coefficient of Si is $d_{Si} = 5.43086$Å, while that of Ge is $d_{Ge} = 5.65748$Å, i.e., a lattice coefficient difference is about 4%. Therefore, lattice coefficient values of the Si crystal and the $Si_{1-X}Ge_X$ mixed crystal are different. For this reason, a stress occurs in the interface between the two crystals to partially cut a chemical combination between elements at the interface. This is a so-called point defect. When the point defect significantly occurs, dislocation is caused.

A constant relationship is present between the mixed crystal ratio X of Ge and the thickness of a layer in which no dislocation occurs. FIG. 6 is a graph showing this relationship. Note that this data is obtained when $Si_{1-X}Ge_X$ is deposited on an Si substrate by the MBE method. Since growth is performed at 510° C., a transition region from $Si_{1-X}Ge_X$ to Si is very thin.

In a layer having a homogeneous mixed crystal composition X, dislocation occurs in the interface if the thickness is not less than that of a hatched region shown in FIG. 6.

Next, an impurity concentration of the emitter region 5 in the conventional BPT and the conventional DO-POSBPT falls within the range of $10^{19}$ to $10^{21}$ cm$^{-3}$; an impurity concentration of the base region, $10^{16}$ to $10^{18}$ cm$^{-3}$; an impurity concentration of the collector region; about $10^{14}$ to $10^{16}$ cm$^{-3}$.

In such a BPT, since the impurity concentration of the emitter region is higher ($10^{19}$ cm$^{-3}$ or more), narrowing of the band gap occurs, and injection efficiency of carriers from the emitter to the base is degraded (i.e., a current gain $h_{FE}$ is decreased).

When an impurity concentration of a semiconductor is increased, a free carrier density is increased (i.e., minority carrier mobility is gradually decreased, and the band gap (forbidden gap width) is decreased). When the impurity density is $10^{17}$ to $10^{18}$ or more, band tailing occurs from the ends of the conduction and valence bands in an n- or p-type semiconductor.

FIGS. 7 and 8 are views showing band structures in semiconductors. Energy is plotted along the ordinate and a state density n(E) (i.e., the number of carriers per unit volume) is plotted along the abscissa in each of FIGS. 7 and 8. FIG. 7 is a view showing a band structure of an n-type semiconductor having a low impurity density. In this case, an n-type donor level is separated from a conduction band. However, FIG. 8 shows a semiconductor containing a high impurity density, and the width of a donor level is increased. The donor level becomes a donor band whose energy is coupled to that of the conduction band unique to the semiconductor. That is, as shown in FIG. 8, a degenerate conduction band is formed. As a result, band-end tailing occurs, and the band gap is changed from $E_g$ to $E_g'$, thus causing band narrowing of $\Delta E_g = E_g - E_g'$.

Band narrowing of the n-type semiconductor has been described in FIG. 8. Similar band tailing occurs on the side of the valence band in a p-type semiconductor having a high impurity concentration, and narrowing of a band width (prohibition band) $E_g$ occurs.

A band-narrowing value is approximated as follows:

$$\Delta E_g = \{3q^2/(16\pi\epsilon_s)\}\{(q^2 \cdot N)/(\epsilon_s kT)\}^{\frac{1}{2}} \quad (4)$$

where q is a charge, e is a semiconductor dielectric s constant, k is a Boltzmann constant, T is an absolute temperature, and N is an impurity density.

A band-narrowing value of Si at room temperature is given as follows:

$$\Delta E_g = 22.5(N/10^{18})^{1/8} \, meV \quad (5)$$

For example, if $N = 10^{18}$ cm$^{-3}$, then $\Delta E_q = 22.5$ meV.

FIG. 9 is a graph showing results of band-gap narrowing width calculations by using equation (5) when boron (B) is doped in Si in a high concentration. The impurity density (cm$^{-3}$) of the impurity is plotted along the abscissa in FIG. 9, and the narrowed width $\Delta E_g$(-meV) of the band gap is plotted along the ordinate in FIG. 9.

An essential carrier density $n_i'^2$ upon occurrence of band-gap narrowing is given as follows as compared with the carrier density without narrowing:

$$n_i'^2 = n_i^2 esp(\Delta E_g/kT) \quad (6)$$

Since $W_B < L_n$ and $J_{B1} > J_{B2}$ are established, $h_{FE}$ is approximated as $$\begin{aligned} h_{FE} &\approx J_C/J_{B1} \quad (7) \\ &= (L_P \cdot D_n \cdot N_E n_{iB}^2)/(W_B \cdot D_P \cdot N_B n_{ic}^2) \times \\ &\quad \tanh(W_E/L_P) \\ &= (L_P D_n N_E/W_B D_P N_B)\tanh(W_E/L_P) \times \\ &\quad \exp\{(\Delta E_{gb} - \Delta E_{ge})/kT\} \end{aligned}$$

The current gain can be expressed when only band-gap narrowing is taken into consideration:

$$h_{FE} = h_{FE0} \cdot esp\{(\Delta E_{gb} - \Delta E_{ge})/kT\} \quad (8)$$

where $h_{FE0}$ is a current gain without band-gap narrowing.

The conventional BPT had an emitter impurity concentration of about to $10^{21}$ cm$^{-3}$, and a base impurity concentration of about $10^{16}$ to $10^{18}$ cm$^{-3}$. For this reason, $\Delta E_{ge}$ is large, and $\Delta E_{gb}$ is almost zero. Therefore, the current gain $h_{FE}$ is smaller than the designed value.

When the current gain $h_{FE}$ is to be increased in a shallowed BPT, the impurity concentration of the base must be increased. When the impurity concentration of the base is, however, increased, the base-emitter breakdown voltage is decreased. In addition, the base-emitter capacitance is undesirably increased.

In a photoelectric transducer apparatus using a conventional BPT, a frequency $f_T$ is only about 1 GHz. The photoelectric transducer apparatus of this type is incompatible with HD (high Division; an area sensor coping with high vision).

To the contrary, as a conventional method of increasing the current gain $h_{FE}$, a silicon oxide film having a thickness of 10–20 Å has been formed between emitter region and base region. Such BPT can prevent hall from introducing from base region into emitter region due to a potential barrier formed within a valence band by an oxide film at an interface between the base and emitter. Therefore, the advantage that the current gain can be increased is obtained.

FIG. 10 shows a potential during a normal operation at A—A' sectional area wherein a silicon oxide is formed between the emitter and base regions of semiconductor device in FIG. 6. In the drawing, $W_E$ denotes a thickness of the emitter neutral area, $W_B$ denotes a thickness of the base neutral area. Further, as shown in the drawing, since a silicon oxide is formed between the emitter and base regions, a potential barrier is formed at a position of $W_E$.

However, since the potential barrier due to the oxide film is formed not only at the conduction band but also at the valence band, it would be an obstacle against an electron stream as a carrier in the emitter, thereby emitter resistance is formed. Therefore, also it would be an obstacle against a collector current $I_c$ stream. It would be a cause of inclining the current property of current gain $h_{FE}$, i.e. $h_{FE}$ depends upon base-emitter voltage $V_{BE}$.

It is also difficult to obtain equal contents of oxygen in oxide films. The oxygen contents vary depending on individual BPTs, and therefore variations in BPT characteristics occur, resulting in inconvenience.

In particular, the characteristic variations of the individual BPTs are very important when they occur in a linear IC, a line sensor, and the like.

SUMMARY OF THE INVENTION

The present invention resides in providing a solution to the above described problems. That is, the present invention provides a semiconductor device not producing a point defect or dislocation in the hetero interface.

The present invention provides a semiconductor device which has a high current gain $h_{FE}$, can prevent a decrease in base-emitter breakdown voltage, and has a small capacitance, and a photoelectric transducer apparatus using this semiconductor device.

It is an object of the present invention to provide a semiconductor device having a high current gain and less characteristic variations, and a photoelectric transducer apparatus using the same.

Further, the present invention provides a semiconductor device which can minimize characteristic variations and has a high current gain $h_{FE}$ and a high frequency, and a photoelectric transducer apparatus using the same.

The object of the present invention is to provide a semiconductor device characterized by comprising at least an emitter region of a first conductivity type, a base region of a second conductivity type, and a collector region of a first conductivity type, the base region essentially consisting of $Si_{1-X}Ge_X$ ($0 < X < 1$), further comprising regions formed in a depletion layer close to an interface between the base region and the collector region or in the collector region and in a depletion layer close to an interface between the base region and the emitter region or in the emitter region, and having a larger Ge amount at the base region side and a smaller Ge amount at the emitter and collector sides.

Another object of the present invention is to achieve in above semiconductor device, that $Si_{1-X}Ge_X$ is $0.0625 \leq X \leq 0.375$.

The further object of the present invention is to provide a semiconductor device, characterized in that addition of Ge is performed by ion implantation.

The still further object of the present invention is to provide a photoelectric transducer apparatus characterized by using a semiconductor device.

The next object of the present invention is to provide a semiconductor device at least having an emitter region of a first conductivity type, a base region of a second conductivity type, and a collector region of a first conductivity type, characterized in that (a) at least B and Ge are doped in the base region; and
(b) $N_D \leq 10^{19}$ cm$^{-3}$ and $N_{Ge} > N_B$ where $N_D$ is an impurity concentration near a junction surface of the emitter region contacting the base region, $N_B$ is a B concentration of the base region, and $N_{Ge}$ is a Ge concentration in the base region.

The further object of the present invention is to provide a semiconductor device, characterized in that B and Ge are doped in the base region by ion implantation.

The still further object of the present invention is to provide a semiconductor device, characterized in that $N_D$ falls within a range of $10^{17}$ to $10^{19}$ cm$^{-3}$.

The still further object of the present invention is to provide a semiconductor device, characterized in that an Si layer having an impurity concentration of $10^{19}$ to $10^{21}$ cm$^{-3}$ is formed between the emitter region and an electrode.

The still further object of the present invention is to provide a semiconductor device, characterized in that condition $N_D < N_B$ is established.

The still further object of the present invention is to provide a photoelectric transducer apparatus using the semiconductor device of the first to fifth gists.

An object of the present invention is to provide a semiconductor device characterized by a bipolar transistor structure in which an emitter region is deposited on a base region,
wherein the emitter region is formed after an oxide on the base region is removed, and the emitter region essentially consists of a single crystal.

An object of the present invention is to provide a semiconductor device of the present invention, which has at least an emitter of a first conductivity type, a base of a second conductivity type, and a collector of the first conductivity type,
is characterized in that at least said base essentially consists of an $Si_{1-X}Ge_X$ crystal ($0 < X < 1$),
an interface between the $Si_{1-X}Ge_X$ crystal and an Si crystal is an inclined hetero interface, and
a depth of $Si_{1-xGe}X$ is the same as or larger than a depth of said base.

In the above characteristic, in at least said base region, a Ge composition X is smaller in a shallow portion and larger in a deeper portion.

In the above characteristic, doping of Ge is performed by ion implantation.

A photoelectric transducer apparatus of the present invention is characterized by using the above semiconductor device.

Further object of the present invention is to provide a semiconductor device characterized by comprising at least an emitter region of a first conductivity type, a base region of a second conductivity type, a collector region of the first conductivity type, and an emitter electrode,
wherein the emitter region essentially consists of a single crystal,
a carrier concentration at least near an interface between emitter region and the base region in the emitter region is not more than $1 \times 10^{19}$ cm$^{-3}$,
an emitter region having a high impurity concentration of $1 \times 10^{19}$ to $1 \times 10^{21}$ cm$^{-3}$ is formed between the emitter electrode and the emitter region, and
B and Ge are doped as impurities in the base region, and a Ge concentration is higher than a B concentration.

In the above characteristic part, the impurity concentration of the base region is not less than $1 \times 10^{18}$ cm$^{-3}$.

In the above characteristic part, the impurity concentration of the base region is not less than $1 \times 10^{20}$ cm$^{-3}$.

In the above characteristic part, the Ge concentration is 8.25 times the B concentration.

In the above characteristic part, when an impurity concentration near an interface with the emitter region having the high impurity concentration in the emitter region is defined as $N_{E1}$ and an impurity concentration of the emitter region having the high impurity concentration is defined as $N_{E2}$, condition $N_{E2} > en_{E1}$ is satisfied.

A photoelectric transducer apparatus is characterized by using the semiconductor device having the above characteristic part.

BRIEF DESCRIPTION OF THE DRAWINGS

FIG. 18 shows a graph of band gap narrowering in case of highly doping of B into Si;

FIG. 33 shows a graph of relation lower limit of emitter concentration and base concentration at $W_B=1$;

FIG. 34 shows a relation between depletion layer thickness and the width thereof;

FIG. 43 shows B, Ge and P distributions in FIG. 42;

DESCRIPTION OF THE PREFERRED EMBODIMENTS

The present invention will be described by the description of the preferred embodiments made with reference to drawings as follows.

According to the present invention, a conventional problem of a point defect or dislocation in a hetero interface between Si forming an emitter region and $Si_{1-x}Ge_x$ forming a base region can be solved, thereby increasing a current gain $h_{FE}$ and a frequency $f_T$.

In the present invention, an emitter is made of Si, and a base is made of $Si_{1-x}Ge_x$. Therefore, $Si_{1-x}Ge_x$ is $E_g' = E_g - \Delta E_g$ on the basis of a band gap $E_g$ of Si, i.e., the band gap is reduced by $\Delta E_g$. Analytically theoretical expressions of a base current and a collector current in a BPT of the present invention are as follows (note that the end of the emitter is brought into contact with a metal).

The base current mainly consists of two components, i.e., a diffusion current of positive holes from the base to the emitter:

$$J_{Binj} = (qn_i^2 D_P/N_E L_P) \times coth(W_E/L_P)[exp(V_{BE}/kT) - 1] \quad (2)$$

and a recombination current of electrons injected from the emitter:

$$J_{Brec} = [qn_i^2 D_n exp(\Delta E_g/kT)] \times \quad (3)$$
$$[-1 + cosh(W_B/L_N)]/[sinh(W_B/L_N)] \times$$
$$[exp(V_{BE}/kT) - 1]$$

The collector current is given as follows:

$$J_C = [qn_i^2 D_n exp(\Delta E_g/kT)] \times \quad (4)$$
$$[cosech(W_B/L_N)] \times$$
$$[exp(V_{BE}/kT) - 1]$$

where q is a charge, ni is an intrinsic semiconductor charge density (Si), $N_E$ is an emitter impurity density, $N_B$ is a base impurity density, $D_P$ is a positive hole diffusion coefficient, $D_N$ is an electron diffusion coefficient, $L_P$ is a positive hole diffusion length ($\simeq(D_P\tau_P)^{\frac{1}{2}}$), $L_N$ is an electron diffusion length ($\simeq(D_N\tau_N)^{\frac{1}{2}}$), k is a Boltzmann constant, T is an absolute temperature, $V_{BE}$ is a base-emitter forward biased electron, and $\tau_P$ and $\tau_N$ are minority carrier lifetimes of the positive holes and the electrons.

When $\Delta E_g/kT \gg 1$, $J_{Binj} \gg J_{Brec}$ is obtained. When $W_B \ll L_N$, $h_{FE}$ is determined by the following relation:

$$h_{FE} \neq 2(L_N/W_B)^2 \quad (5)$$

That is, $\Delta E_g$ no longer has a large influence on $h_{FE}$. Therefore, $h_{FE}$ is uniquely determined by the value of $(L_N/W_B)$.

Figure 11:
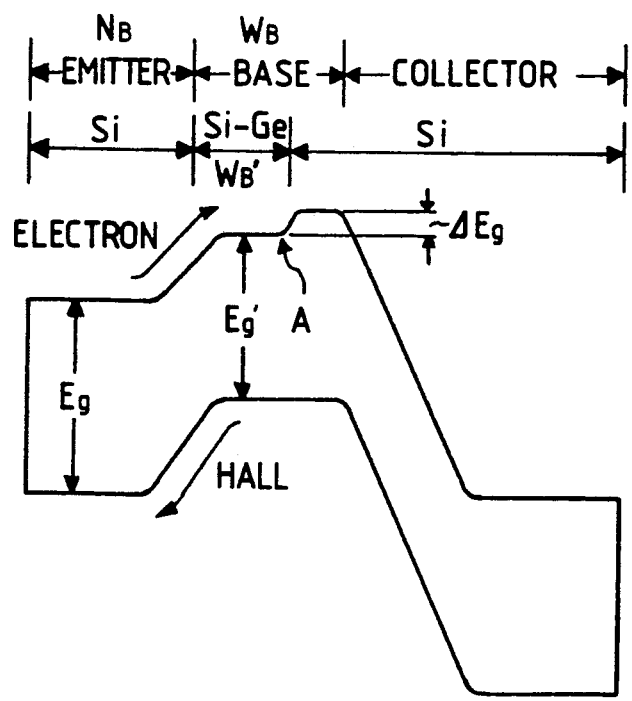
FIG. 11 shows a potential barrier with a problem of prior art hetero BPT.

When the $Si_{1-x}Ge_x$ layer is shallower than the p-type layer, a potential of the BPT is obtained as shown in FIG. 11. Referring to FIG. 11, a forward bias is applied between the emitter and the base, and a reverse bias is applied between the base and the collector. Since the $Si_{1-x}Ge_x$ layer is formed halfway in the p-type region, a potential barrier of $\Delta E_g$ is formed in the base. When the potential barrier as shown in FIG. 11 is formed, an increase of $exp(\Delta E_g/kT)$ in the collector current represented by equation (4) disappears. Minority carriers propagating in the base are interrupted by the potential barrier at a point A in FIG. 11. Carriers passing through the barrier become $exp(-\Delta E_g/kT)$. Therefore, the collector current is the same as that of a BPT of a normal homojunction.

Since an amount of minority carriers injected in the base is $exp(\Delta E_g/kT)$ times that of Si, the recombination current becomes larger than that of a homojunction. For this reason, $h_{FE}$ of the BPT becomes smaller than that of the homojunction BPT. Therefore, the interface between $Si_{1-X}Ge_X$ and Si must be formed in the depletion layer of the base and collector junction or in the collector. Alternatively, the interface must be formed in the depletion layer of the emitter and the base or at the emitter side. In this manner, diffusion of the minority carriers injected from the base to the emitter can be interrupted by the barrier at the hetero interface. That is, the hetero interface between Si and $Si_{1-X}Ge_X$ must not be formed at a neutral region of a region serving as a base.

Next, according to the present invention, in $Si_{1-X}Ge_X$. a Ge concentration X is preferably represented by:

$$0.0625 \leq X \leq 0.375$$

An amount of electrons injected in the base is represented by:

$$\exp(\Delta E_g/kT)$$

If $\Delta E_g/kT = 1$, an amount of the electrons injected in the base is about 2.7 times that of a conventional device, and $h_{FE}$ is about twice that of the conventional device.

Therefore, in order to obtain a sufficient nondestructive degree, $\Delta E_g \geq kT$ is preferred. Since $\Delta E_g > 0.025$ eV at room temperature, the Ge concentration $X = 0.025/0.4 = 0.0625$. Therefore, X is preferably 0.0625 or more. Note that if the device is used at a low temperature, sufficient characteristics can be obtained even by a smaller X.

X is preferably 0.375 or less.

Figure 9:
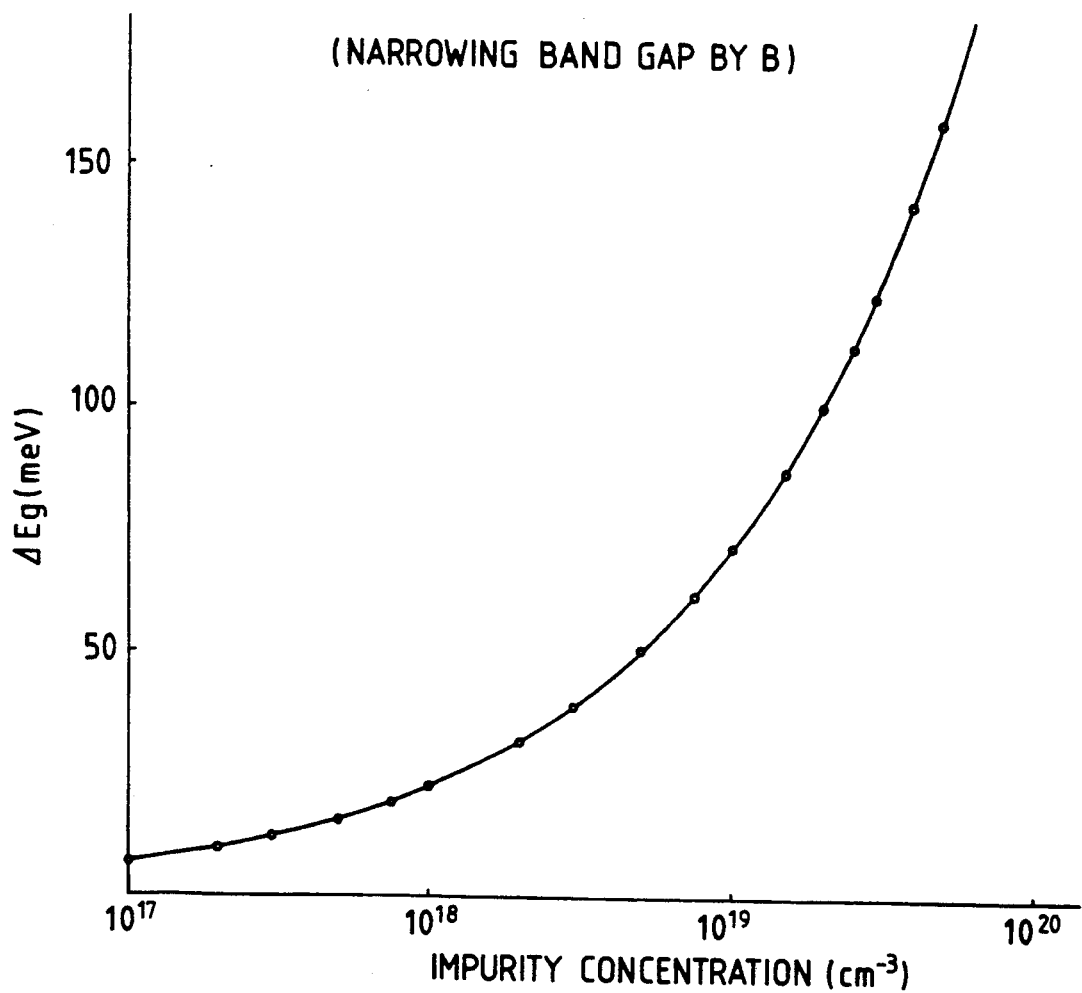
FIG. 9 shows a graph of a measured value of band gap narrowing width in case of highly doping of B into Si.
Figure 12:
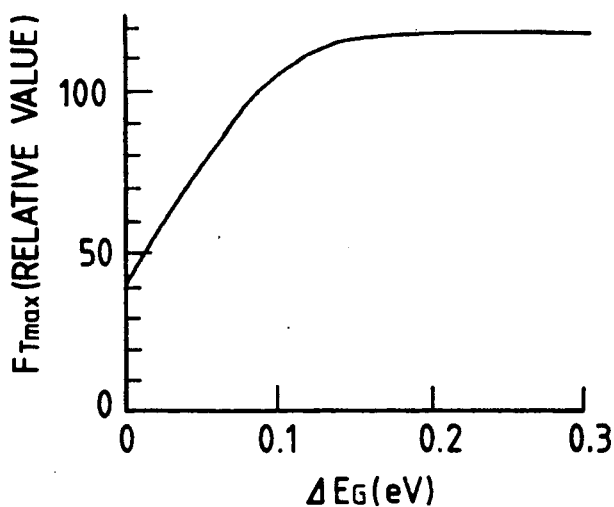
FIG. 12 shows a relation between $\Delta Eg$ and maximum value ($f_T$ max) of $f_T$.

FIG. 12 is a graph showing a relationship between $\Delta E_g$ and a maximum value ($f_{Tmax}$) As is apparent from FIG. 9, since $f_T$ is not improved when $\Delta E_g > 0.15$ eV, $\Delta E_g$ need only be 0.15 eV or less.

The value of X for obtaining $\Delta E_g \leq 0.15$ eV is $X \leq 0.375$.

As described above, when the device is used at room temperature, the Ge concentration X is preferably:

$$0.0625 \leq X \leq 0.375.$$

Doping of Ge in the semiconductor device of the present invention is preferably performed by ion implantation.

Conventionally, since a device is formed by an MBE method or the like, a stepwise hetero is formed.

That is, conventionally, a boron region for defining a base and an Si-Ge region are simultaneously formed by the MBE method or the like. Thereafter, however, when annealing is performed in a formation process, the region of boron as an impurity and the Si-Ge region do not coincide with each other.

Figure 13:
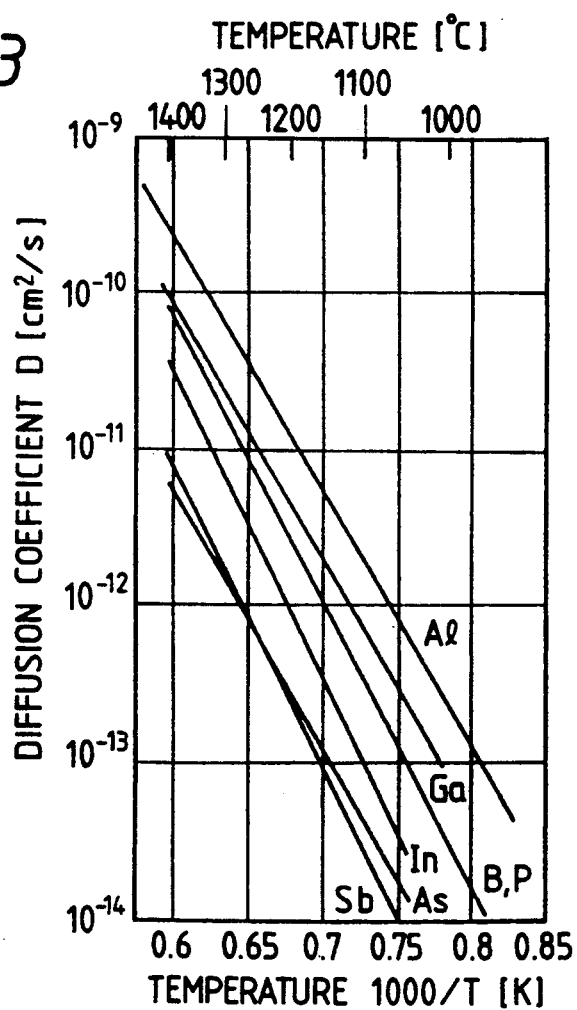
FIG. 13 shows a diffusion coefficient of B, Ga, Al, or the like to be a p type impurity.
Figure 14:
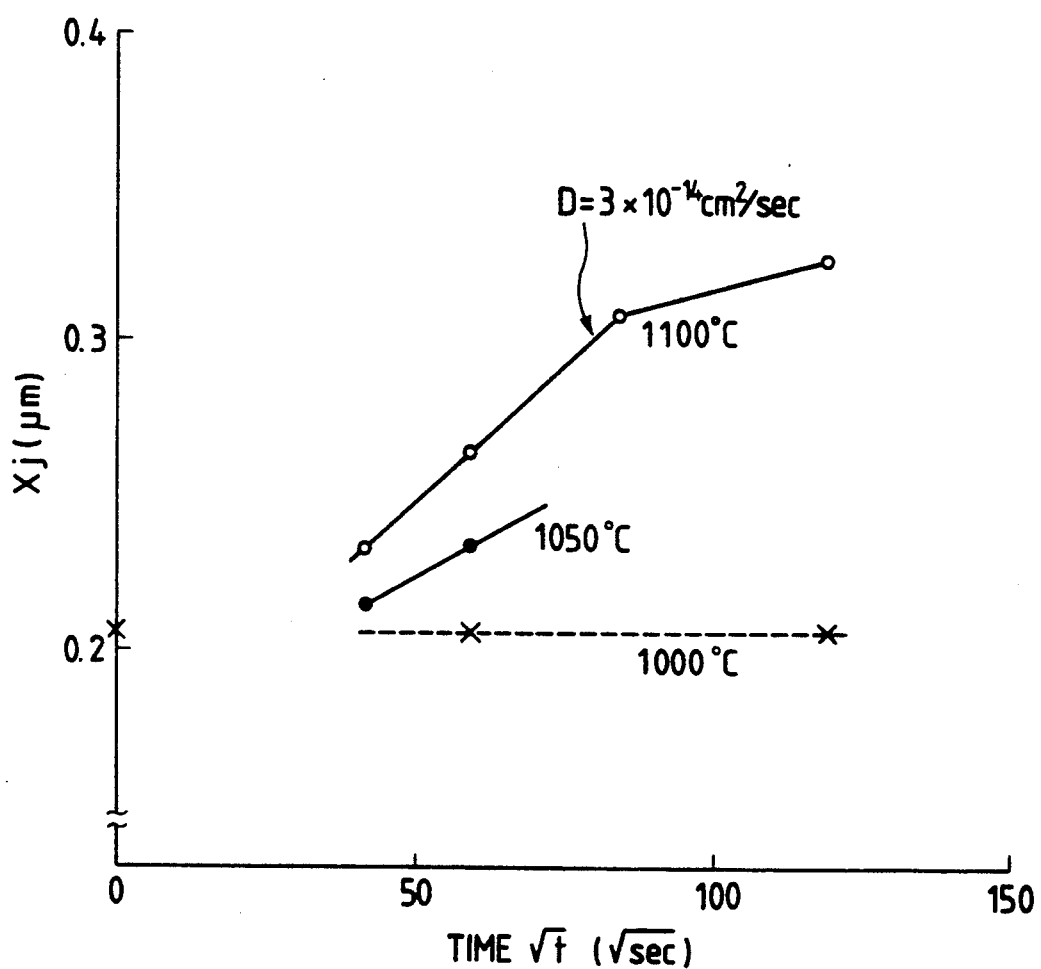
FIG. 14 shows a graph of diffusion coefficient of Ge.

According to measurement performed by the present inventor, Ge diffusion in Si is very slow. Especially at 1,000° C. or less, Ge was not almost diffused and therefore could not be measured. At 1,000° C., $D = 3 \times 10^{-14}$ cm$^3$/sec was obtained. As shown in FIG. 13, a diffusion coefficient of B, Ga, Al, or the like serving as a p-type impurity is much larger than that of Ge. FIG. 14 shows data obtained by the present inventor to examine the diffusion coefficient of Ge. When diffusion data is examined on the basis of the gradient of the graph, the Ge diffusion coefficient is assumed to be substantially the same as that of As indicated by A.

In the BPT, an emitter concentration is as very high as $10^{17}$ to $10^{21}$ cm$^{-3}$. Therefore, when annealing is performed, a junction moves from the emitter to the base. Since, however, the p-type side of the base-collector junction becomes deeper than the case of Si-Ge, this base-collector junction becomes inconvenient for a BPT.

Therefore, Ge doping in the semiconductor device of the present invention is preferably formed by ion implantation.

According to the present invention, $F_T$ of a photoelectric transducer apparatus can be improved. In addition, a nondestructive degree can be improved by increasing a current gain.

Therefore, there is provided a solid-state image pickup apparatus capable of reading out data from a single element a plurality of times without performing correction and capable of performing high-speed reading.

According to the present invention, there is provided a semiconductor device having a high base-emitter breakdown voltage, a small base-emitter capacitance, and a high $h_{FE}$, and a photoelectric transducer apparatus using the same.

The function of the present invention will be described in detail with reference to constituting elements.

According to the present invention (1) The impurity concentration near the junction surface between the emitter region and the base region is decreased to $10^{19}$ cm$^{-3}$ or less to prevent band-gap narrowing and hence prevent a decrease in current gain.

The impurity concentration of $10^{19}$ cm$^{-3}$ is kept at at least a portion near the junction surface between the emitter and base regions.

The impurity concentration of the emitter region is kept at $10^{19}$ cm$^{-3}$ due to the following reason.

When the impurity concentration of the base region is set high; the breakdown voltage of the junction between the base and the emitter region is decreased.

When a semiconductor device is used in a normal IC, a minimum breakdown voltage is 2 V or more. However, when a sufficient margin is to be taken into consideration, a minimum breakdown voltage is preferably 3 V. Therefore, a case wherein the minimum breakdown voltage is 3 V will be exemplified below.

A p-n junction breakdown voltage is determined by avalanche amplification when the impurity concentration of an emitter region is $10^{17}$ cm$^{-3}$ or less. However, when impurity concentration of the emitter region is $10^{17}$ cm$^{-3}$ or more, an influence of a tunnel current is enhanced. When the impurity concentration of the emitter region is $10^{18}$ cm$^{-3}$ or more, the breakdown voltage is determined by only a tunnel current. In a region where a breakdown voltage of about 3 V is required, the breakdown voltage is determined by mainly a tunnel current and can be approximated as follows:

$$J_t = (((2m^*)^{\frac{1}{2}} q^3 \epsilon V)/(4\pi^2 \hbar^2 E_g^{\frac{1}{2}})) \times \exp[(-4(m8)^{\frac{1}{2}} E_g^{3/2})/(3q\epsilon \hbar)] \quad (1)$$

where $\epsilon$: electric field (V/m),
    Eg: band gap
    V: applied voltage
    m*: effective mass
    q: charge
    h: (Planck constant)/$2\pi$ When equation (1) is applied to silicon, it yields the following equation.

$$J_t = (1.649 \times 10^4 \, \epsilon V) \exp[-3.052 \times 10^9/\epsilon] \quad (2)$$

In equation (2), if V=3 V and $\epsilon=1$ MV/cm, then $J_t=2.75\times10^{-5}$ A/cm$^2$. If $\epsilon=1.5$ MV/cm, then $J_C=1.02$ A/cm; and if $\epsilon=2$ MV/cm, then $J_C=2.33\times10^2$ A/cm$^2$. It is safe to determine an emitter impurity concentration with respect to that of the base region in an electric field $\epsilon=1$ MV/cm when an emitter-base voltage is 3 V. That is, when the emitter size in an actual semiconductor device or the like can be reduced (e.g., 3×3 μm$^2$), and an emitter junction depth is decreased (e.g., about 0.5 μm), a current near the emitter has an influence, and the current becomes larger than those given in equations (1) and (2).

Figure 15:
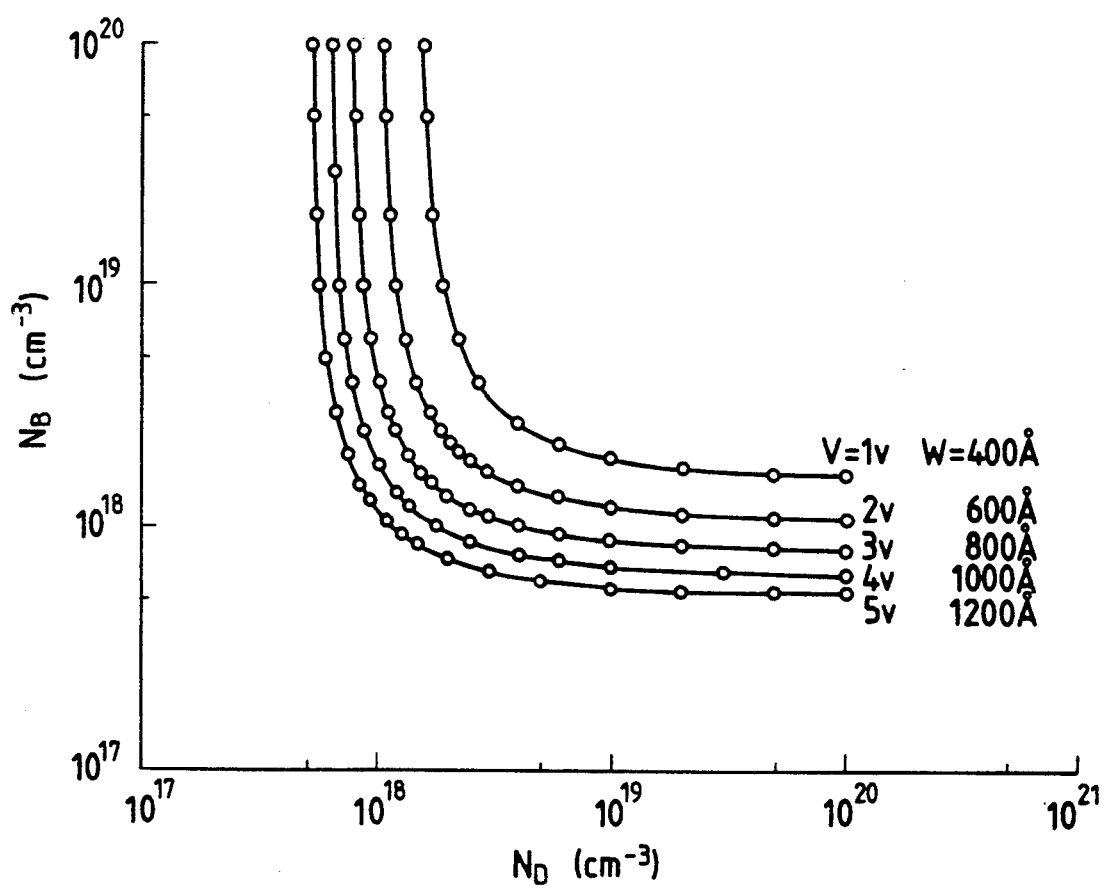
FIGS. 15 and 16 show an upper limit and desirable lower limit of $N_D$.

A maximum electric field (stepwise junction approximation) $\epsilon_m$ of the p-n junction and a depletion layer width W can be represented by the following equations:

$$\epsilon_m=((((2q(V_{bi}+V))/\epsilon_s)\cdot(N_B\cdot N_D/(N_B+N_D)))^{\frac{1}{2}} \tag{3}$$

$$W=((2\epsilon_s/q)\cdot((N_B+N_D)/(N_B\cdot N_D))\cdot(V_{bi}+V)))^{\frac{1}{2}} \tag{4}$$

where
$V_{bi}$: diffusion voltage
$\epsilon_s$: dielectric constant
$N_B$: impurity concentration of the base region
$N_D$: impurity concentration of the emitter region
V: applied voltage The impurity concentration of the base region is plotted along the ordinate, and the impurity concentration of the emitter region is plotted along the abscissa in FIG. 15. In this case, results are obtained when $\epsilon_m=1$ MV/cm and applied voltages V=1, 2, 3, 4, and 5 V.

When breakdown is to be determined by V=3 V and $\epsilon_m=1$ MV/cm, a line of 3 V in FIG. 15 is referred to. For example, when the impurity concentration ($N_B$) of the base region is $10^{18}$ cm$^{-3}$, the impurity concentration ($N_D$) of the emitter region is preferably $4.5\times10^{18}$ cm$^{-3}$ or less.

If $N_B=5\times10^{18}$ cm$^{-3}$, then $N_D<1\times10^{18}$ cm$^{-3}$. Therefore, when $N_B=1\times10^{19}$ cm$^{-3}$, then $N_D<9\times10^{17}$ cm$^{-3}$.

When $N_B$ is $1\times10^{18}$ cm$^{-3}$ or more, then $N_D$ is set to be $4.5\times$cm$^{-3}$ or less. The concentration of $4.5\times10^{18}$ cm$^{-3}$ is a maximum limit.

When the applied voltage is set to be 2.5 V and the electric field $\epsilon=1$ MV/cm is given, condition $N_D<1\times10^{19}$ cm$^{-3}$ or less must be given to satisfy the above condition, as can be apparent from FIG. 11.

Judging from the above consideration, the concentration $N_D$ was set to be $10^{19}$ or less.

The impurity concentration of the emitter region preferably has a lower limit of $10^{17}$ cm$^{-3}$.

The preferable lower limit of the impurity concentration of the emitter region will be described below.

The collector current $J_C$ is represented by equation (6) below:

$$J_{B2}=(qn_i^2D_n/N_BL_n)cosech(W_B/L_n)$$
$$\times[exp(V_{BE}/kT)-1] \tag{6}$$

If $W_B<<L_n$, and $V_{BE}>>kT$, then equation (6) can be rewritten as follows:

$$J_C=(qn_i^2D_n)/(N_BW_B)\cdot exp(V_{BE}/kT) \tag{7}$$

This equation is generally established within the following approximated range of a minority carrier:

$$N_D>>(n_i^2/N_B)\cdot exp(V_{BE}/kT) \tag{8}$$

A boundary which does not satisfy the above condition is a current drive limit of this transistor.

The following equation in which $(n_i^2/N_B)\cdot exp(-V_{BE}/kT)$ is substituted by the impurity concentration $N_D$ of the emitter region can be the current drive limit of the prescribed impurity concentration of the emitter region of the transistor:

$$J_C=q\cdot(D_n/W_B)\cdot N_D \tag{9}$$

Figure 16:
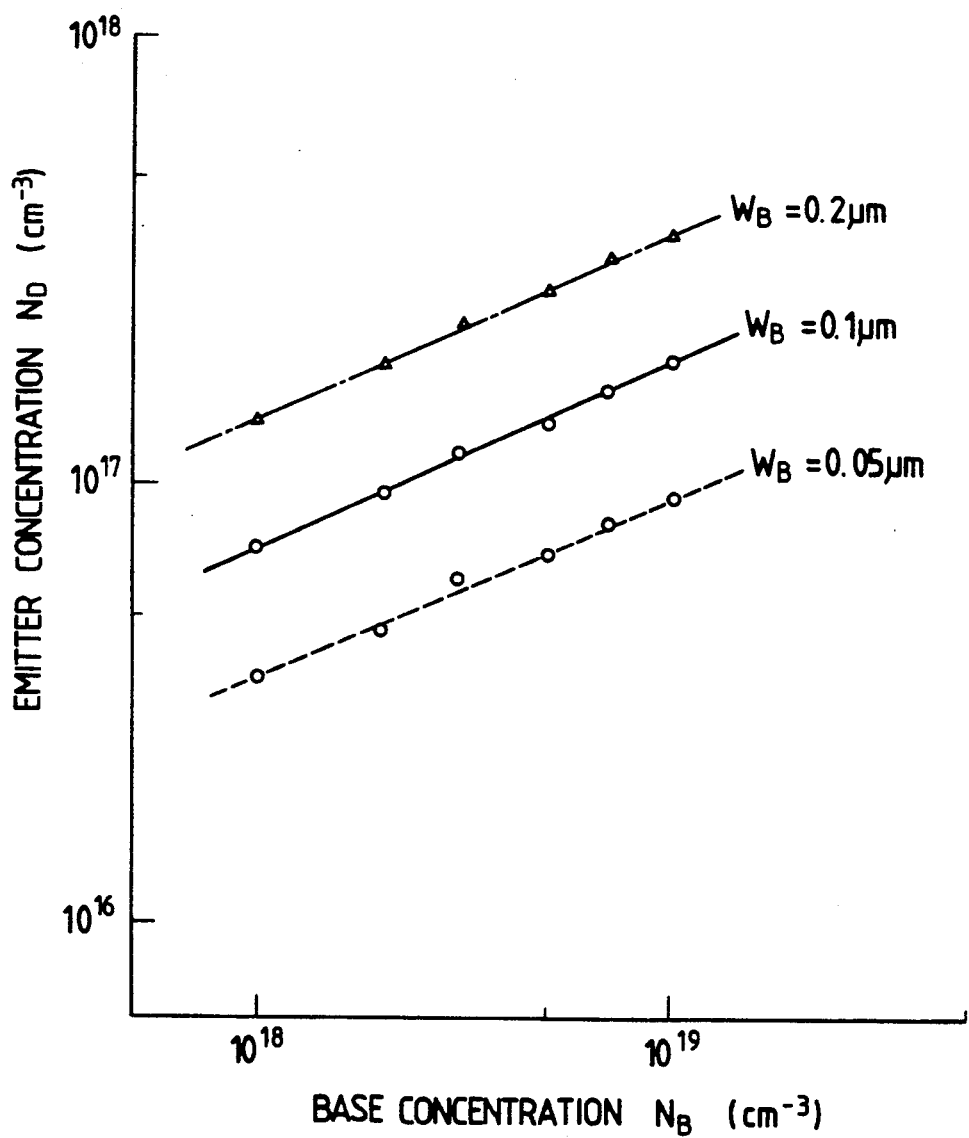

The collector current $J_C$ of $10^4$ to $10^5$ A/cm$^2$ is generally required for any transistor. $D_n=(kT/q)\mu_n$ is used and conventional $\mu_n$ data is used to obtain $W_B=0.05$, 0.1, and 0.2 μm, thereby calculating the lower N limit, as shown in FIG. 16.

When $J_C$ therefore falls within the range of $10^4$ to $10^5$ A/cm$^2$, N is preferably $10^{17}$ or more.

An ohmic contact layer having an impurity concentration of $10^{19}$ to $10^{21}$ cm$^{-3}$ may be formed on the surface to preferably reduce an ohmic resistance during formation of the emitter region.

② B and Ge are simultaneously mixed to obtain an Si-Ge-B base, and a mixed crystal effect and a band-gap narrowing effect are simultaneously provided. The band gap of the base is reduced, and emitter injection efficiency can be improved. Therefore, the current gain $h_{FE}$ can be increased. However, since the emitter impurity concentration is determined as described above, a decrease in base-emitter breakdown voltage and an increase in base-emitter path can be prevented.

The present invention will be described in more detail.

Figure 17A:
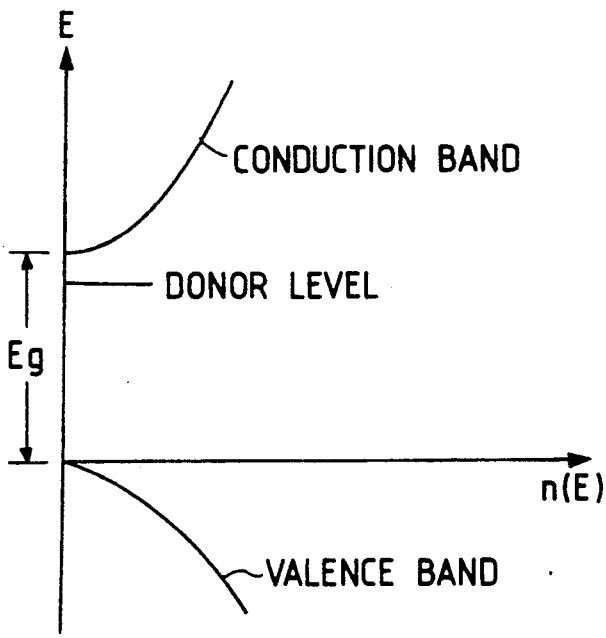
FIGS. 17A and 17B show a band structure of the semiconductor.
Figure 17B:
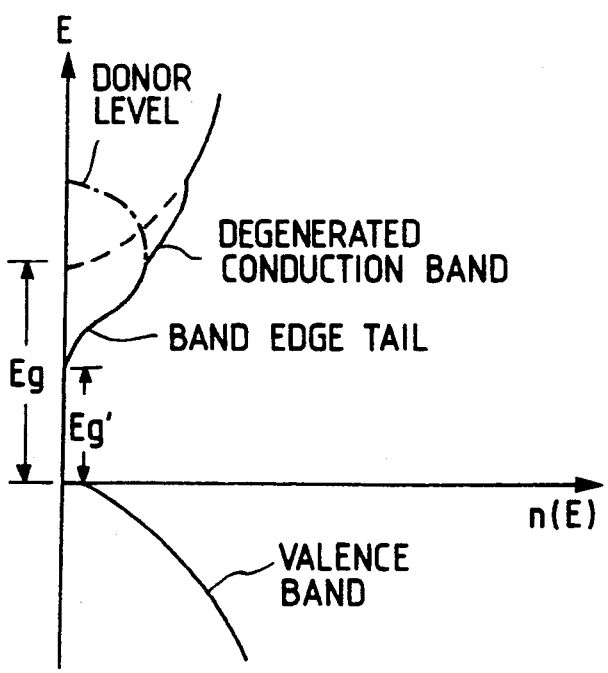

FIGS. 17A and 17B are views showing band structures in semiconductors. Energy is plotted along the ordinate and a state density n(E) (i.e., the number of carriers per unit volume) is plotted along the abscissa in each of FIGS. 17A and 17B.

FIG. 17A is a view showing a band structure of an n-type semiconductor having a low impurity density. In this case, an n-type donor level is separated from a conduction band. However, in a semiconductor containing a high impurity density, the width of a donor level is increased. The donor level becomes a donor band whose energy is coupled to that of the conduction band unique to the semiconductor. That is, as shown in FIG. 17B, a degenerate conduction band is formed. As a result, band-end tailing occurs, and the band gap is changed from $E_g$ to $E_g'$, thus causing band narrowing of $\Delta E_g=E_g=E_g'$.

Band narrowing of the n-type semiconductor has been described in FIG. 17. Similar band tailing occurs on the side of the valence band in a p-type semiconductor having a high impurity concentration, and narrowing of a band width (prohibition band) $E_g$ occurs. A band-narrowing value is approximated as follows:

$$\Delta E_g=(3q^2/16\pi\epsilon_s)\times(q^2N/\epsilon_skT)^{\frac{1}{2}} \tag{10}$$

where q is a charge, $\epsilon_s$ is a semiconductor dielectric constant, k is a Boltzmann constant, T is an absolute temperature, and N is an impurity density.

A band-narrowing value of Si at room temperature is given as follows:

$$\Delta E_g=22.5(N/10^{18})^{\frac{1}{2}}meV \tag{11}$$

If $N = cm^{-3}$, then $\Delta E_g = 22.5$ meV. An essential carrier density $n_i'^2$ upon occurrence of band-gap narrowing is given as follows:

$$n_i'^2 = n_i^2 esp(\Delta E_g/kT) \quad (12)$$

wherein $n_i^2$ is a carrier density without narrowing.

The analytically theoretical expressions of the base and collector currents are as follows (note that a portion in front of $W_E$ of the emitter is assumed to contact a metal).

The base current consists of two components, i.e., a diffusion current of positive holes from the base to the emitter:

$$J_{B1} = (qn_i^2 D_p N_E L_p) coth(W_E/L_p) \times [exp(V_{BE}/kT) - 1] \quad (13)$$

and a recombination current of electrons injected from the emitter:

$$J_{B2} = (qn_i^2 D_n/N_B L_n)((cosh(W_B L_n) - 1) /(Sinh(W_B/L_n)))[esp(V_{BE}/kT) - 1] \quad (14)$$

A collector current is defined as follows:

$$J_C = (qn_i^2 D_n/N_B L_n) cosech(W_B/L_n) \times [exp(V_{BE}/kT) - 1] \quad (6)$$

where q is a charge, ni is an intrinsic semiconductor density, $N_E$ is an emitter impurity density, $N_B$ is a base impurity density, $D_p$ is a positive hole diffusion coefficient, $D_n$ is an electron diffusion coefficient, $L_p$ is a positive hole diffusion length (approximated by $(D_p \tau_p)^{\frac{1}{2}}$), $L_n$ is an electron diffusion length (approximated by $(D_p \tau_p)^{\frac{1}{2}}$), k is the Boltzmann constant, T is an absolute temperature, $V_{BE}$ is a base-emitter forward-biasing voltage, $\tau_p$ is a positive hole minority carrier lifetime, $\tau_n$ an electron minority carrier lifetime, $W_E$ is the thickness of the emitter, and $W_B$ is the thickness of the base.

The emitter carrier density is presented by $$n_{iE}^2 = n_i^2 [exp\Delta E_{ge}/kT)9$$

and the base carrier density is represented by $$n_{iB}^2 = n_i^2 [exp\Delta E_{gb}/kT]$$

When the above points are taken into consideration, terms $n_1^2$ in equations (13), (14), and (6) are replaced with $n_{iE}^2$, $n_{iB}^2$, and $n_{iB}^2$, respectively.

Since $W_B << L_n$ and $J_{B1} >> J_{B2}$ are established, $h_{FE}$ is approximated as $$h_{FE} \approx J_C/J_{B1} \quad (15)$$

$$\approx (L_p D_n n_{iB}^2 / W_B D_p N_B n_{iE}^2) tanh(W_E/W_B)$$

$$= (L_p D_n N_E / W_B D_p N_B) tanh(W_E/L_p) \times exp[(\Delta E_{gb} - \Delta E_{ge})/kT]$$

The current gain can be expressed when only band-gap narrowing is taken into consideration:

$$h_{FE} \approx h_{FE0} exp[(\Delta E_{gb} - \Delta E_{ge})/kT] \quad (16)$$

where $h_{FE0}$ is a current gain without band-gap narrowing. The conventional BPT had an emitter impurity concentration $N_E$ of about $10^{20}$ to $10^{21}$ cm$^{-3}$, and a base impurity concentration $N_B$ of about $10^{16}$ to $10^{18}$ cm$^{-3}$. For this reason, $\Delta E_{ge}$ is large, and $\Delta E_{gb}$ is almost zero.

Therefore, the current gain $h_{FE}$ is smaller than the designed value.

FIG. 18 is a graph showing results of band-gap narrowing width calculations by using equation (2) when boron is doped in Si in a high concentration. The impurity density (cm$^{-3}$) is plotted along the abscissa in FIG. 8, and the narrowed width $\Delta E_g$ (meV) of the band gap is plotted along the ordinate in FIG. 8. For example, when an emitter impurity concentration is $10^{18}$ cm$^{-3}$ and a base impurity concentration is $10^{19}$ cm$^{-3}$, then $\Delta E_g = \Delta E_{gb} - \Delta E_{ge} \approx 50$ meV. Therefore, $h_{FE} \approx 7.4\ h_{FE0}$.

The present invention has a great advantage in a base having a high impurity concentration. A p-type impurity has low solubility as compared with phosphorus (P) and arsenic (As) as n-type impurities.

Figure 19:
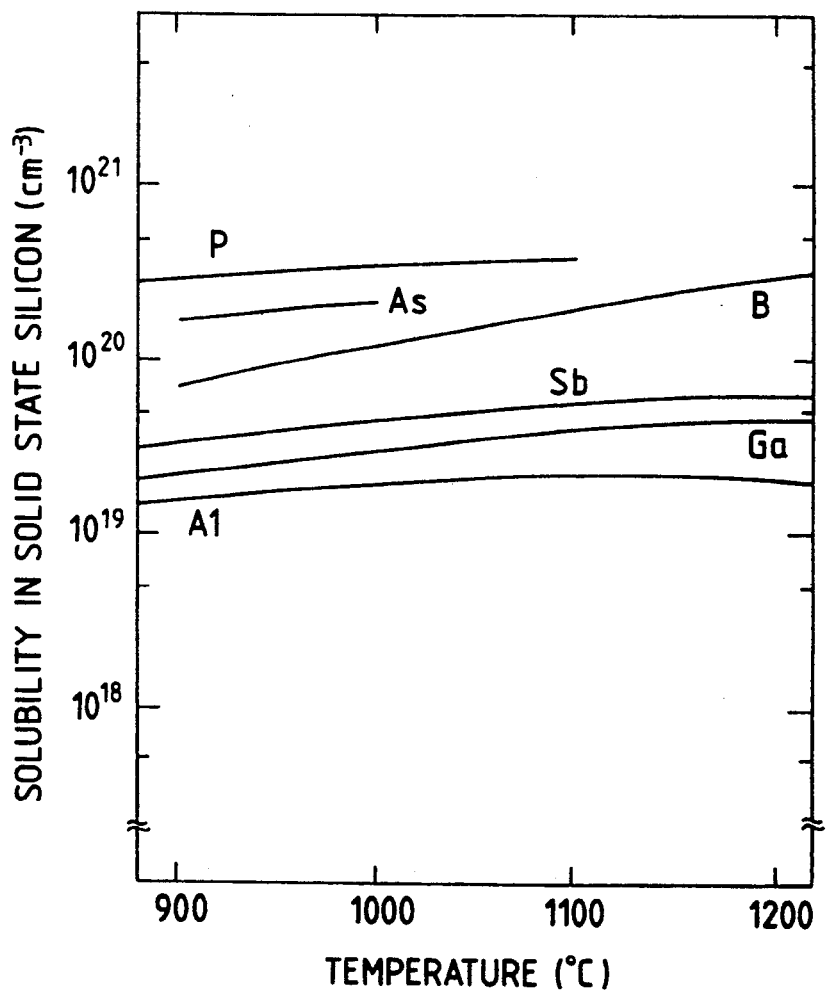
FIG. 19 shows a graph of solubility of impurity into solid state Si.

FIG. 19 shows data of solubility of a solid-phase impurity in silicon. Temperatures (T ° C.) are plotted along the abscissa, and the solubility in the solid phase is plotted along the ordinate. P-type impurities are exemplified by B, Ga, and Al. Of these impurities, B can be dissolved the highest concentration. When the impurity is doped to exceed the degree of solid solution, the impurity is precipitated in Si during the manufacturing process of the semiconductor device to form crystal defects, thereby adversely affecting the BPT characteristics. However, this depends on process temperatures.

Of the impurities, B can be most stably doped to a high concentration and is most suitable as a p-type impurity.

When an impurity is doped in a high concentration, a tetrahedral atomic radius of the impurity in Si poses a problem. More specifically, since Si has a diamond type crystal structure, it has tetrahedral bonds. In this case, an atomic radius r presents a problem. If a difference between atomic radii is given as $100 \times (r - r_{Si})/r_{Si}$, the difference for B can be given as about $-25$. Since the atomic radius of B is smaller than that of Si, a stress occurs between a boundary between the B-nondoped emitter and collector having an impurity concentration of $10^{18}$ cm$^{-3}$. When this stress is conspicuously increased, dislocation occurs. For this reason, electrical leakage occurs between the base-emitter path or the base-collector path, thereby decreasing a breakdown voltage. The current gain is also decreased.

According to the present invention, B and Ge are simultaneously doped in the base region.

A value of $100 \times (r_{GE} - r_{Si})/r_{Si}$ of Ge is almost +4. That is, the Ge value is larger than Si by 4%. Ideally, a ratio of the dose of Ge to that of Ge is set to be 8. $25 = 25/4$, crystal lattice distortion can be perfectly corrected.

According to the present invention, however, since the p-type base region is formed to have an impurity concentration distribution by, e.g., ion implantation, the semiconductor device has a structure in which lattice distortion tends not to occur. The Ge concentration is not limited to the one described above. The dose of B with respect to the base is continuously changed, and occurrence of defects and dislocation becomes difficult. Therefore, the defect occurrence limit of B has a peak concentration higher than the B concentration of $10^{18}$ cm$^{-3}$.

The main purpose of doping Ge is to reduce a band gap smaller than that of Si upon doping of Ge into Si. The concentration which influences the band gap is not satisfied by 8.25 times that of B, but must be $10^{20}$ cm$^{-3}$ or more to obtain a satisfactory effect.

Ge has a band gap smaller than that of Si. The band gap of Si is $E_{gSi} \approx 1.1$ eV, and the band gap of Ge is $E_{gGe} = 0.7$ eV. When a crystal composition of $Si_{1-x}Ge_x$ is obtained, its band gap can be approximated as follows:

$$E_g' = E_{gSi} - X(E_{gSi} - E_{gGe}) \tag{17}$$

If $X = 0.1$, then $\Delta E_g (= E_g' - E_{gSi})$ is about 40 meV.

At this time, the Ge concentration is about $5 \times 10^{21}$ $cm^{-3}$ and is 10 times or more the B concentration.

Figure 20:
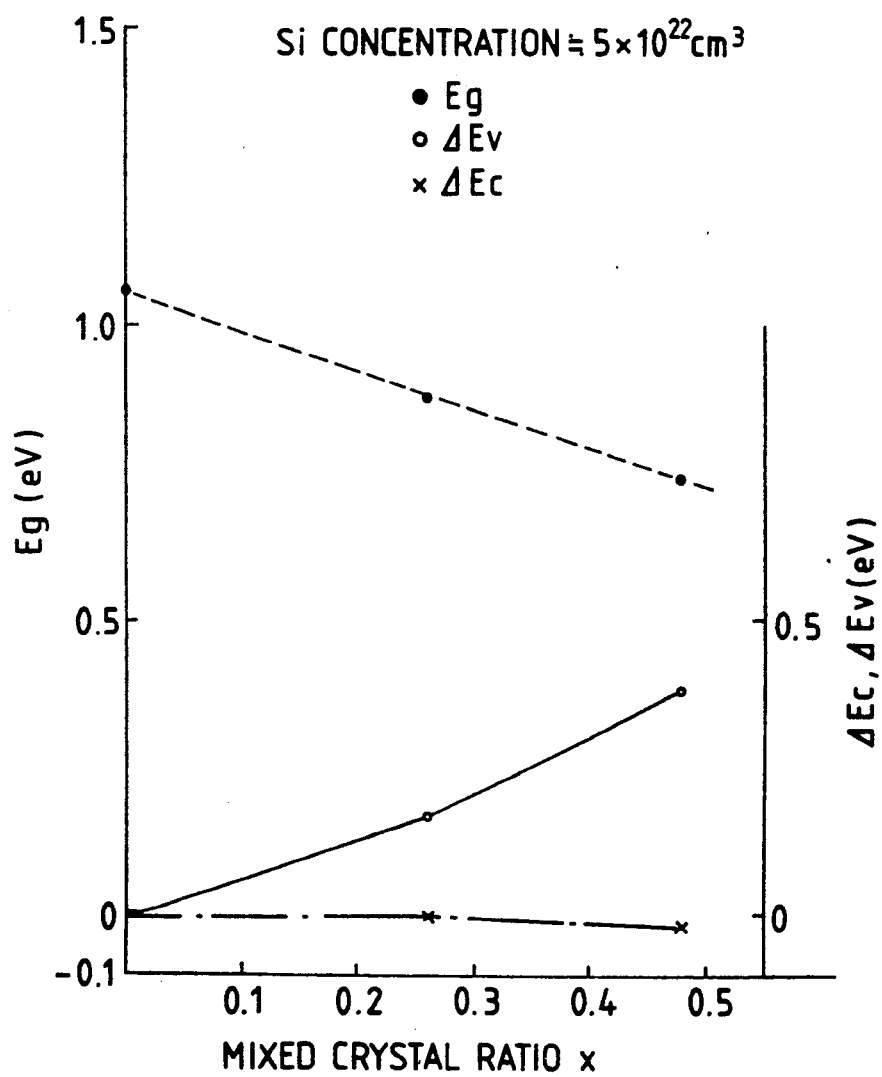
FIG. 20 shows a graph of effect of Ge to the band gap.
Figure 21:
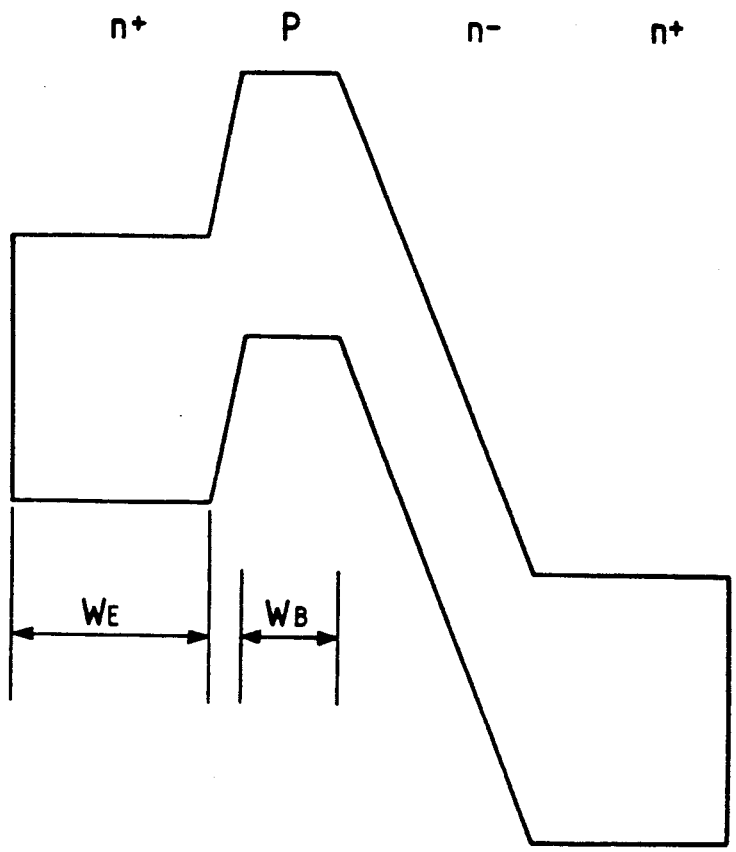
FIG. 21 shows a potential during a normal operation at A—A' section of BPT in FIG. 48.

FIG. 20 is a graph showing an effect to a Ge band gap. A composition ratio X is plotted along the abscissa, and changes in band gap $E_g$, changes on the conduction band side $\Delta E_c$ and the valence band side $\Delta E_v$ in FIG. 20. As is apparent from FIG. 10, when B and Ge are simultaneously doped in the base, the base band gap can be reduced. Therefore, the current gain of the BPT can be increased.

Al, Ga, or the like may be used as a p-type impurity to be doped in the base. However, these p-type impurities have a value of $100 \times (r - r_{Si})/r_{Si}$ to be almost +8 and cannot correct lattice distortion of a substance having a small atomic radius. For example, although carbon (C) has a small atomic radius, $Si_{1-x}C_x$ has a direction to increase a band gap. That is, $Si_{1-x}C_x$ has a property opposite to band-gap narrowing. Therefore, the combination of Si and C is not preferable. B and Ge is a best combination for a p-type base.

In addition, when the base consists of an Si-Ge-B mixed crystal, injection of positive holes in the emitter can be suppressed, which does not a barrier for injection of electrons from the emitter to the base.

According to the present invention, since the oxide film formed between the emitter region and the base region is removed, characteristic variations between the BPTs can be eliminated.

According to the present invention, since the emitter region consists of single-crystal silicon, the current gain $h_{FE}$ can be increased although any oxide film is not formed between the emitter region and the base region. The current gain $h_{FE}$ can be increased due to the following reason.

Figure 1:
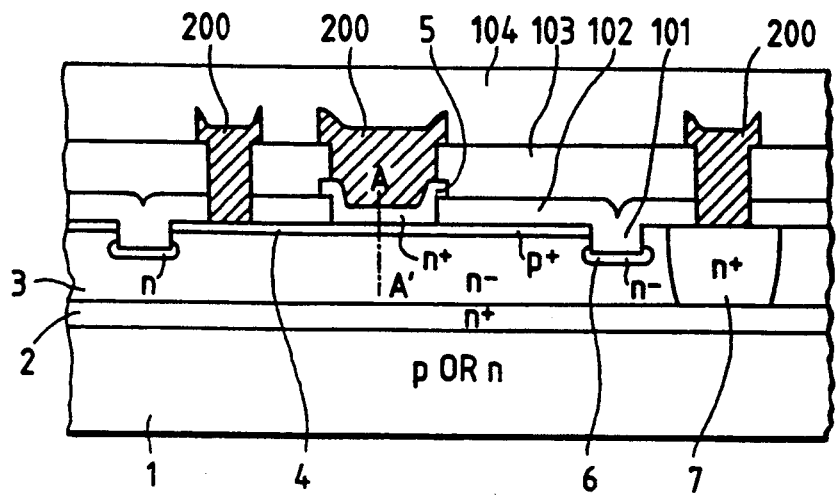
FIGS. 1, 3 and 5 show schematic sectional views of examples of conventional bipolar transistors (BPT)
Figure 2:
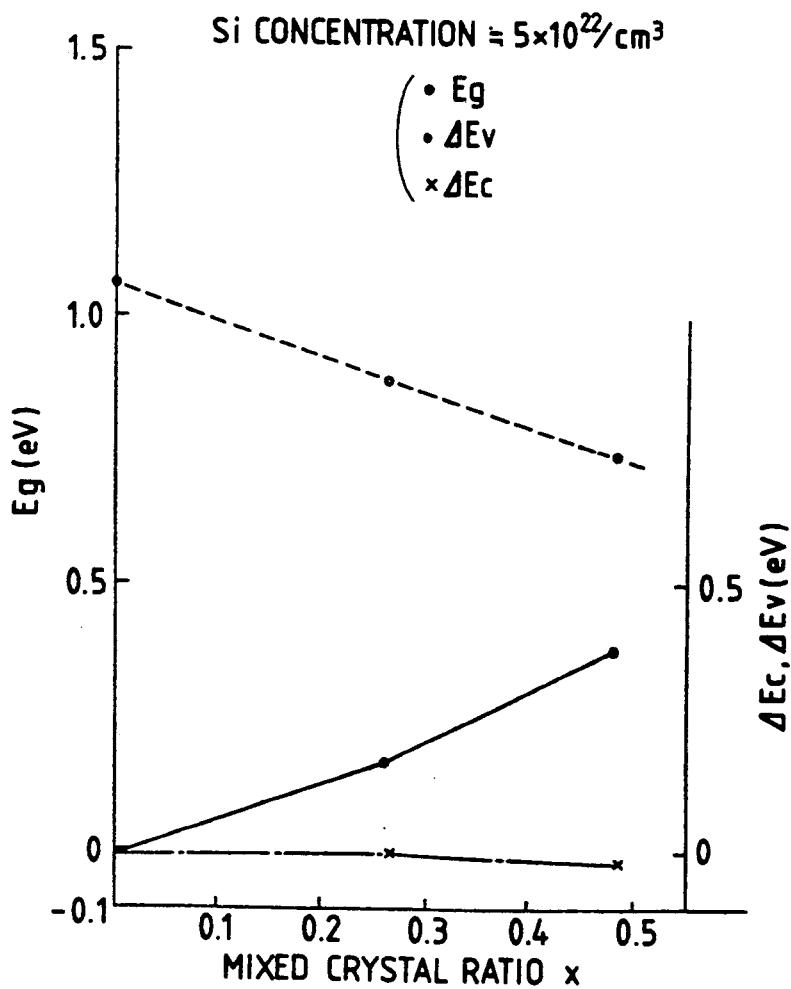
FIG. 2 shows a graph explaining relation between mixed crystal ratio X and band gap width Eg of $Si_{1-X}Ge_X$.

When an oxide film is not formed, i.e., when a potential barrier is not present, as shown in FIG. 2, a diffusion current of positive holes from the base to the emitter can be given as follows:

$$J_B' = (q \cdot n_i^2 \cdot D_P/N_E \cdot L_P) \times coth(W_E/L_P)[exp(V_{BE}/kT) - 1] \tag{1'}$$

When the emitter region consists of single-crystal silicon, the diffusion length $L_P$ of the minority carriers in the emitter region can be increased, and then $J_B'$ can be reduced. Therefore, the current gain can be further increased as follows:

$$h_{FE} = J_C/(J_{B1}' + J_{B2}) \tag{4'}$$

According to the present invention, VBE dependency of the current gain $h_{FE}$ can also be eliminated.

The current gain $h_{FE}$ must not depend on VBE under the condition $exp(V_{BE}/kT) > 1$.

Figure 22:
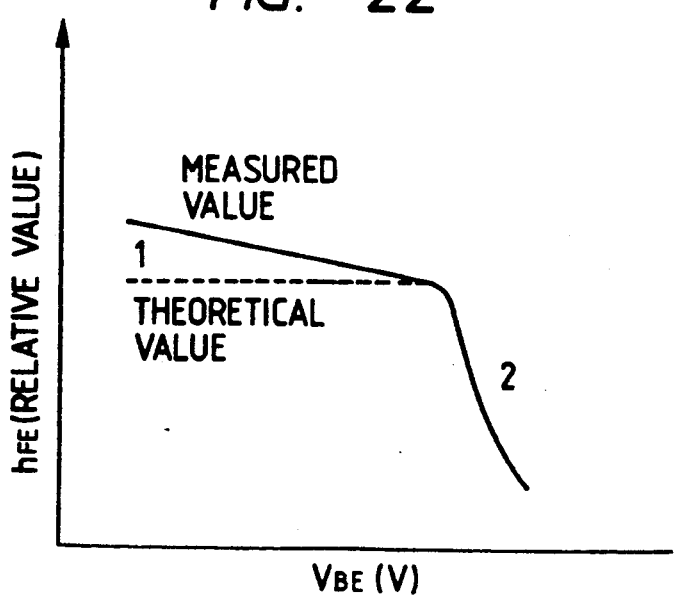
FIG. 22 shows a graph of a relation between $h_{FE}$ and $V_{BE}$.

When the relationship between $h_{FE}$ and $V_{BE}$ of the conventional DOPOS BPT (oxide film: 10 Å) is examined, the relationship shown in FIG. 22 is exhibited. When the thickness of the oxide film is further increased, a gradient (a portion in ① in FIG. 22 of the graph is further increased.

The present inventors measured $V_{BE}$ dependency of the base current $J_B$ and the collector current $J_C$ of the conventional BPT described above. $J_B$ was almost proportional to $exp(V_{BE}/kT)$, but $J_C$ had a relation represented by $J_C \propto exp(V_{BE}/nkT)$. The n value fell within the range of 1.01 to 1.05. That is, the n value was larger than the normal value by 1 to 5%. It seems that $V_{BE}$ dependency of $h_{FE}$ is caused by $J_C$. This $J_C$ characteristic is expected such that the potential barrier on the conduction band side by an Si oxide film in the emitter region influences electron injection from the emitter to the base.

When a BPT is used as a sensor, $V_{BE}$ dependency of $h_{FE}$ greatly influences a ratio ($\gamma$ value) of an optical input to an electrical output. This dependency becomes a decisive problem when semiconductor devices are to be manufactured uniformly.

If the n value is given as $n = 1 + \delta$ ($\delta << 1$), and $$J_B \approx J_{B0} exp[V_{BE}/kT] \tag{5}$$

$$J_C \approx J_{Cpotential0} exp[V_{BE}/(1+\delta)kT] \tag{6}$$

then the current gain $h_{FE} (= J_C/J_B)$ is obtained as follows:

$$\begin{aligned} h_{FE} &= (J_{E0}/J_{B0})\{1 - (\delta/kT)V_E\} \\ &= h_{FE0}\{1 - (\delta/kT)V_E\} \end{aligned} \tag{7}$$

That is, $V_{BE}$ dependency of $h_{FE}$ is thus found.

Since kT = 0.025 at room temperature, assuming that $\delta = 0.01$ (i.e., n = 0.01), $\delta/kT$ is 0.4 for $V_{BE} = 1$ V, thus changing dependency by 40%. Since $V_{BE}$ dependency of $h_{FE}$ preferably falls within the range of 5%, condition $\delta \leq 1.25 \times 10^{-3}$ must be satisfied.

To the contrary, according to the present invention, since the oxide film is removed to eliminate the potential barrier and minimize it as small as negligible. Therefore, $V_{BE}$ dependency of $h_{FE}$ can be eliminated or can be minimized as small as negligible.

The height of the potential barrier can be allowed to be about kT when, e.g, an $n^+$-type emitter is formed. However, when the height of the potential barrier exceeds kT, an influence on the electrical characteristics cannot be neglected. A potential barrier of a valence band naturally poses a problem in an $p^+$-type emitter.

When the width of the potential barrier is narrow, the carriers are conducted by a tunnel effect. In this case, the height of the potential barrier need not be kT or less.

A tunnel probability can be approximately (theoretically) represented as follows:

$$P(E) \propto exp\{-A(\phi_B^{3/2}/E)\} \tag{8}$$

where E is an electric field (V/cm), $\phi_B$ is a potential barrier height, and A is a constant defined as follows:

$$A = 4(\sqrt{2m^*} \cdot e^{1/2}/3h) \tag{9}$$

where $m^*$ is an effective mass, e is a charge, h is $h/2\pi$ (h is the Planck constant. In case of silicon, since $m^8 \approx 0.3$ $m_0$, $e = 1.602 \times 10^{-19}$ C, and $h = 6.626 \times 10^{-34}$ J·sec, then $A \approx 1.48 \times 10^7$.

For example, if $\phi_B = 0.1$ V and the potential barrier width is given as 10 Å, then $P(E) \simeq 0.31$. Since the tunnel current is given as $J(E) \propto E^2 P(E)$, a sufficiently large current can be obtained in a strong electric field E.

Since the oxide film in the emitter of the BPT is not uniformly formed, the potential barriers are not uniform in all regions. However, if the highest potential barrier is kT or less, no problem is posed.

According to the present invention, a conventional problem of a point defect or dislocation in a hetero interface between Si forming an emitter region and $Si_{1-x}Ge_x$ forming a base region can be solved, thereby reducing a base current and increasing a current gain $h_{FE}$.

Since the semiconductor device of the present invention has a high current gain as described above, it can increase a frequency $f_T$. Therefore, when the semiconductor device of the present invention is adopted as a photoelectric transducer apparatus for use in a solid-state image pickup apparatus or the like, a read rate of the solid-state image pickup apparatus can be improved.

The present invention will be described in detail below.

Current Gain

In the present invention, an emitter is made of Si, and a base is made of $Si_{1-x}Ge_x$. Therefore, $Si_{1-x}Ge_x$ is $E_g' = E_g - \Delta E_g$ on the basis of a band gap $E_g$ of Si, i.e., the band gap is reduced by $\Delta E_g$. Analytically theoretical expressions of a base current and a collector current in a BPT of the present invention are as follows (note that the end of the emitter is brought into contact with a metal).

The base current mainly consists of two components, i.e., a diffusion current of positive holes from the base to the emitter:

$$J_{Binj} = (qn_i^2 D_P / N_E L_P) \times \coth(W_E/L_P)[\exp(V_{BE}/kT) - 1] \quad (1)$$

and a recombination current of electrons injected from the emitter:

$$J_{Brec} = [qn_i^2 D_n \exp(\Delta E_g/kT)] \times [-1 + \cosh(W_B/L_N)]/[\sinh(W_B/L_N)] \times [\exp(V_{BE}/kT) - 1] \quad (2)$$

The collector current is given as follows:

$$J_C = [qn_i^2 D_n \exp(\Delta E_g/kT)] \times [\operatorname{cosech}(W_B/L_N) \times [\exp(V_{BE}/kT) - 1] \quad (3)$$

where q ; a charge
$n_i$; an intrinsic semiconductor charge density (Si)
$N_E$; an emitter impurity density
$N_B$; a base impurity density
$D_P$; a positive hole diffusion coefficient
$D_N$; an electron diffusion coefficient
$L_P$; a positive hole diffusion length ($\simeq (D_P \tau_P)^{\frac{1}{2}}$)
$L_N$ ; an electron diffusion length ($\simeq (D_N \tau_N)^{\frac{1}{2}}$)
k ; a Boltzmann constant
T ; an absolute temperature
$V_{BE}$; a base-emitter forward biased electron
$\tau_P$; a minority carrier lifetime of the positive holes
$\tau_N$; a minority carrier lifetime of the electrons.

When $\Delta E_g/kT \gg 1$, $$J_{Binj} \ll J_{GBrec}$$

is obtained. When $W_B \ll L_N$, a current gain $h_{FE}$ is represented by the following relation:

$$h_{FE} \simeq 2(L_N/W_B)^2 \quad (4)$$

That is, in this case, $\Delta E_g$ no longer has a large influence on the current gain.

Therefore, $h_{FE}$ is uniquely determined by the value of $(L_N/W_B)$.

Depth of $Si_{1-x}Ge_x$

The present invention is partly characterized in that the depth of $Si_{1-x}Ge_x$ is the same as or larger than that of the base. This feature of the present invention will be described in detail below.

A case in which the $Si_{1-x}Ge_x$ layer is shallower than the p-type layer will be described first.

In the present invention, since a layer consisting of Ge and a p-type impurity is formed by ion implantation, the $Si_{1-x}Ge_x$ layer and the p-type layer do not always coincide with each other. When the $Si_{1-x}Ge_x$ layer can be formed in only a region shallower than the p-type layer from the surface, a problem is posed.

When the $Si_{1-x}Ge_x$ layer is shallower than the p-type layer, a potential of the BPT is obtained as shown in FIG. 11. Referring to FIG. 11, a forward bias is applied between the emitter and the base, and a reverse bias is applied between the base and the collector.

As shown in FIG. 11, when the $Si_{1-x}Ge_x$ layer is formed halfway in the p-type region, a potential barrier of $\Delta E_g$ is formed in the base.

When the potential barrier is formed, an increase of:

$$\exp(\Delta E_g/kT)$$

in the collector current represented by equation (3) disappears. This is because minority carriers propagating in the base are interrupted by the potential barrier at a point A in FIG. 11. That is, carriers passing through the barrier become:

$$\exp(-\Delta E_g/kT)$$

Therefore, when the $Si_{1-x}Ge_x$ layer is shallower than the p-type layer (base layer), the collector current is the same as that of a BPT of a normal homojunction.

Since an amount of minority carriers injected in the base is $\exp(\Delta E_g/kT)$ times that obtained when the base is made of Si, the recombination current becomes larger than that of a homojunction. For this reason, the current gain $h_{FE}$ of the BPT becomes smaller than that of the homojunction BPT.

For the reasons described above, the interface between $Si_{1-x}Ge_x$ and Si must be formed in the depletion layer of the base and collector junction or in the collector. Alternatively, the interface must be formed in the depletion layer of the emitter and the base or at the emitter side. In this manner, diffusion of the minority carriers injected from the base to the emitter can be interrupted by the barrier at the hetero interface. That is, the hetero interface between Si and $Si_{1-x}Ge_x$ must not be formed at a neutral region of a region serving as a base.

Figure 11A:
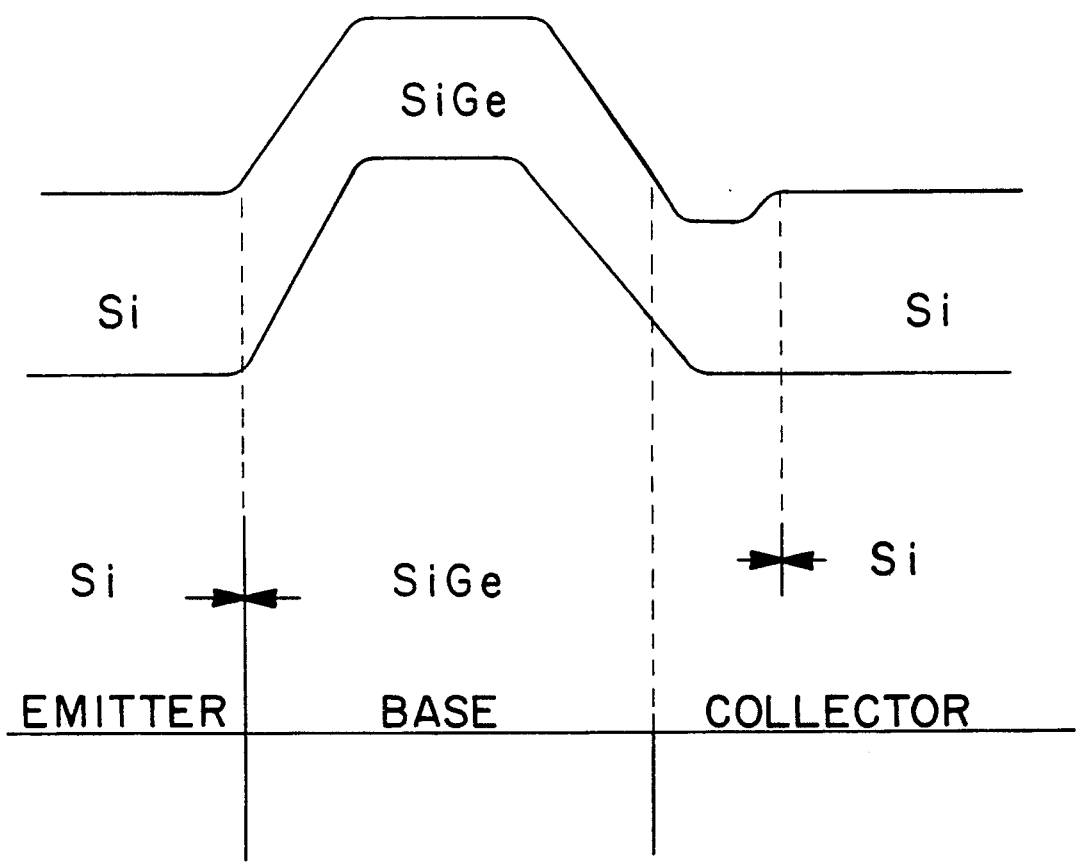
FIG. 11A is a schematic drawing showing an energy band diagram as an example of an SiGe region extending over a base region.

FIG. 11A is an energy band diagram of an example of a SiGe region extending over the base region.

Inclined Heterojunction

Figure 23:
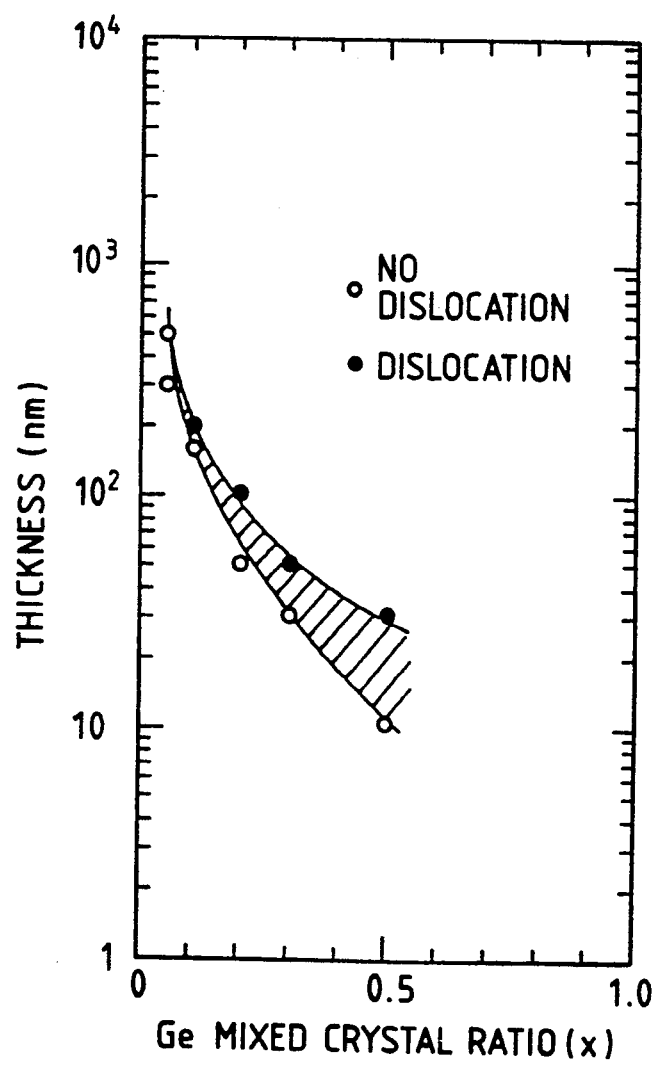
FIG. 23 shows a graph of relation between the mixed crystal ratio X of Ge and a thickness of layer without phase transition.

The reference of the thickness of a transition region may be determined by a value obtained from FIG. 23. For example, if a mixed crystal ratio $X=0.3$, a peak concentration width may be 300 Å or less; if $X=0.2$, it may be 500 Å or less; and if $X=0.1$, it may be 1,500 Å or less. By analyzing an impurity distribution upon ion implantation by, e.g., an SIMS (secondary ion mass analyzer), ion implantation conditions can be easily determined.

Figure 24:
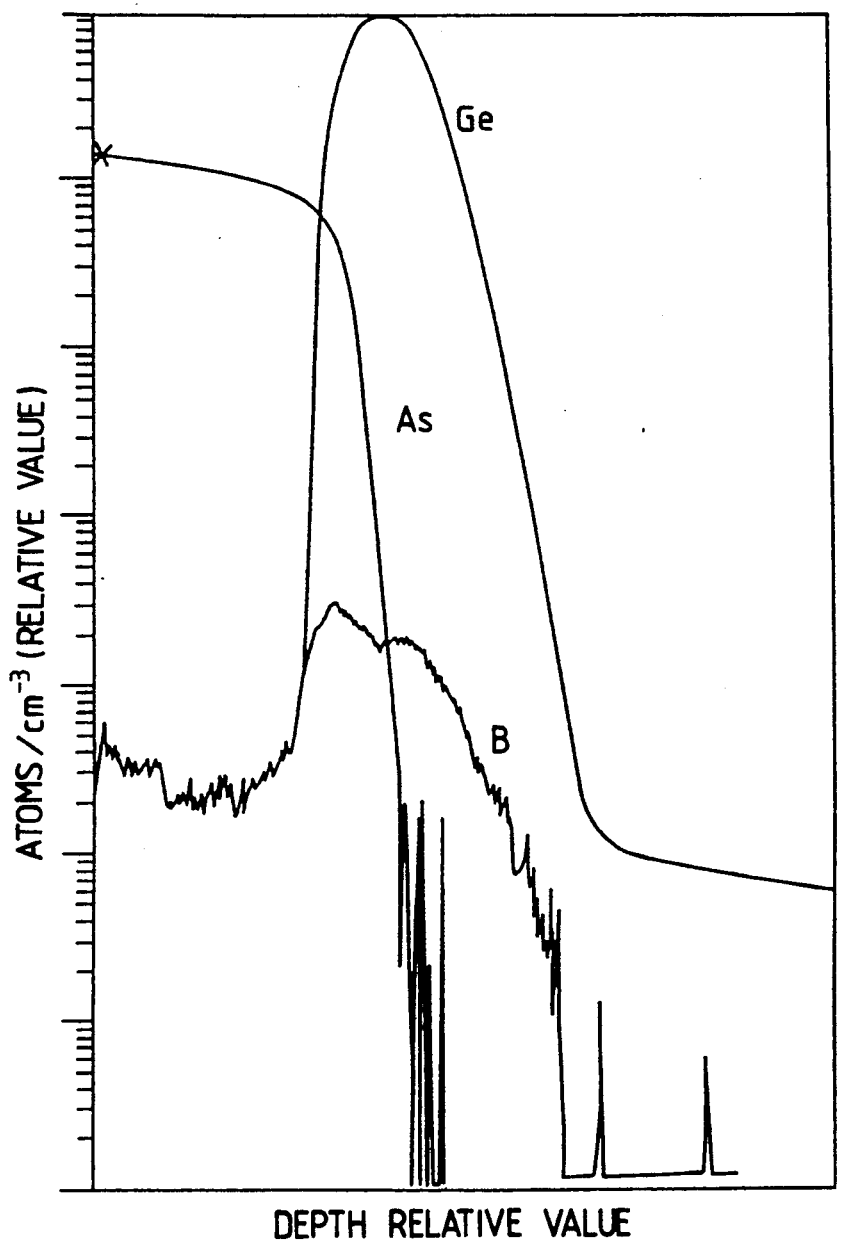
FIG. 24 shows a graph of an example of impurity $G_P$ distribution at A—A' section in FIG. 25.

FIG. 24 shows an analysis example obtained by the SIMS. Comparison is performed with respect to the SIMS analysis result in accordance with a designed mixed crystal ratio X, and the thickness of the heterojunction, i.e., the ion implantation conditions are determined in accordance with data shown in FIG. 23.

The mixed crystal ratio X is a ratio between numbers of Si and Ge atoms. Since Si is substantially $5\times10^{22}$ cm$^{-3}$, The ratio X can be easily calculated by a dose of Ge. That is, X is preferably 0.5 or less.

In the present invention, since the emitter is made of silicon and the base is made of $Si_{1-X}Ge_X$, $Si_{1-X}Ge_X$ is $E_g' = E_g - \Delta E_g$ on the basis of a band gap $E_g$ of Si. That is, the band gap is narrowed by $\Delta E_g$.

Cutoff Frequency $f_T$ of BPT

Generally, $f_T$ is analytically represented by the following equation:

$$\tfrac{1}{2}\pi f_T = (kT/qI_C + r_{EE})(C_{be} + C_{bc}) + \tau_B + \tau_C + r_{CC}C_{bc} \quad (5)$$

where $I_C$ is a collector current, $C_{be}$ is a base-emitter capacitance, $C_{bc}$ is a base-collector capacitance, r is an emitter series resistance, $r_{CC}$ is a collector series resistance, $\tau_B$ is a base travel time, $\tau_C$ is a travel time in a collector depletion layer.

In order to increase $f_T$, the right-hand side of equation (5) must be reduced.

The resistance $r_{EE}$ is mostly caused by an ohmic contact and depends of a surface concentration and an electrode. That is, the surface need only be N$^{++}$.

Figure 25:
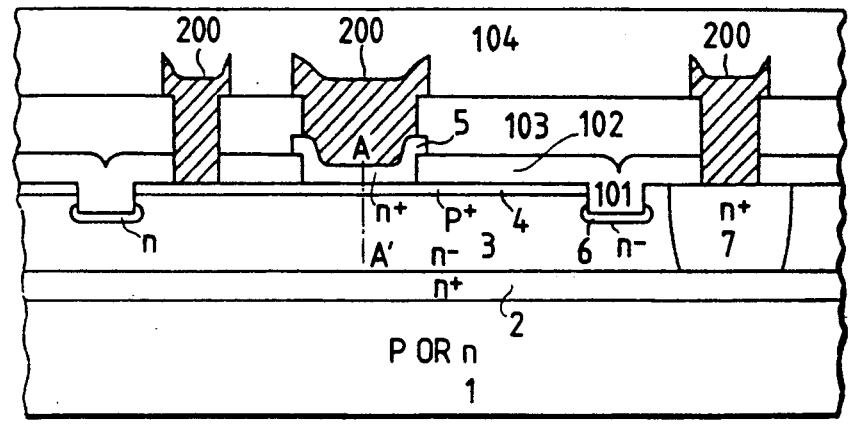
FIG. 25 shows a schematic sectional view of BPT structure.

$r_{CC}$ is influenced more by the thickness of an n$^-$-type region 3 than those of n$^+$-type regions denoted by reference numerals 2 and 7 shown in FIG. 25.

The physical meaning of $f_T$ is a time delay of carriers from the emitter to the collector. $f_T$ is represented by using $\tau_{ec}$ as follows:

$$f_T = 1/(2\pi\tau_{ec}) \quad (6)$$

Figure 26:
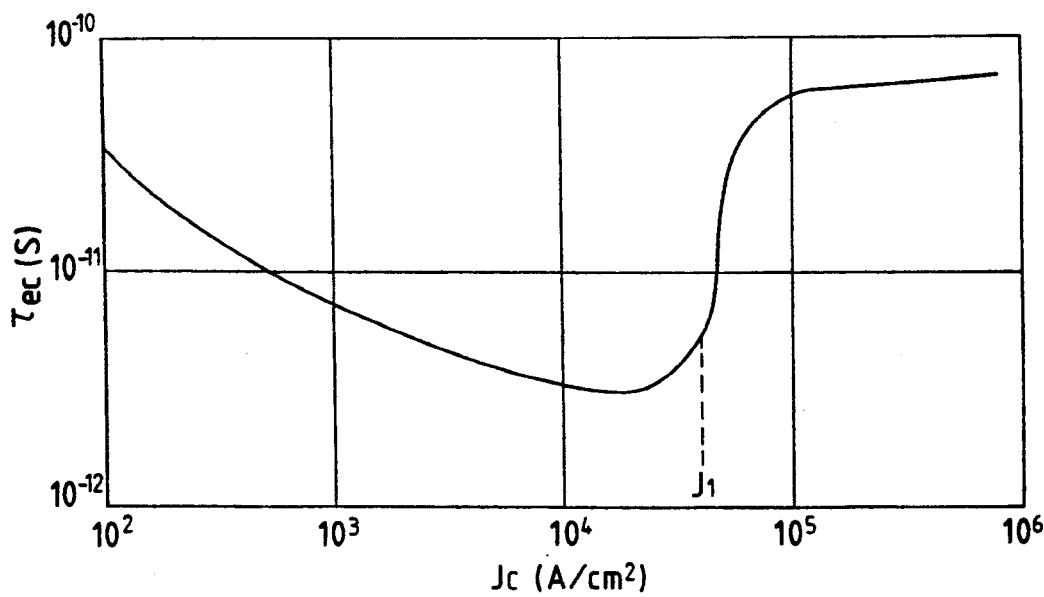
FIG. 26 shows a relation collector current limit $J_c$ and delay time $I_{ec}$ of carrier from emitter into collector.

$\tau_{ec}$ is relatively shown in FIG. 26. $\tau_{ec}$ is reduced together with $I_C$ and increased at a high rate from a minimum point. A inflection point determined by $J_1$ is a point on which a high-current effect has an influence.

For example, if $f_T = 10$ GHz, $\tau_{ec} = 16$ psec.

The following description will be based on these values.

① $\tau_B$ is a base travel time and represented by the following equation:

$$\tau_B = W_B^2/\eta D_B \quad (7)$$

If the base is uniformly doped, $\eta = 2$. If a potential gradient $\epsilon_{bi}$ is present, $\eta$ is represented by the following equation:

$$\eta \simeq 2[1 + (\epsilon_{bi}/\epsilon_0)^{3/2}] \quad (8)$$

where $$\epsilon_0 = 2D_B/\mu_B W_B$$

By using an Einstein relation, $$\epsilon_0 = kT/qW_B$$

is obtained, and the potential gradient is obtained as follows:

$$\epsilon_{bi} = \Delta V/W_B$$

By substituting these equations into equation (7), the following relation is obtained:

$$\eta = 2[1 + (q\Delta V/2kT)^{3/2}] \quad (9)$$

Therefore, if $\Delta V = 2kT/q$, $\eta = 4$, and $\tau_B$ is $\tfrac{1}{2}$. Assuming that $$N_B = 10^{18} \text{ cm}^{-3},$$

$$\mu_n = 300 \text{ cm}^{-2}/\text{sec-V},$$

and $$W_B = 0.1 \ \mu\text{m},$$

$$W_B/2D_B = 13 \text{ psec}$$

is obtained. In this case, if $$\Delta V = 2kT/q,$$

$$W_B/2D_B = 6.5 \text{ psec}$$

is obtained. If $$\Delta V = 4kT/q,$$

$$W_B/2D_B = 3.4 \text{ psec}$$

is obtained. That is, if $\Delta V = 2kT/q$ or more, a drift effect is obtained.

This effect is enhanced at a low temperature. For example, since a liquid nitrogen temperature of 77° K. is about $\tfrac{1}{4}$ of a room temperature (300° K.), $$\Delta V = 4kT/q = 0.026e$$

is obtained, and a small potential gradient has a very large effect.

② $\tau_{VC}$ is a transit velocity in a collector depletion layer and represented by the following equation:

$$\tau_{VC} = W_{BC}/2V_s \quad (10)$$

where $W_{BC}$ is a base-collector depletion layer width and $V_s$ is a transit velocity.

$V_E$ is normally a saturation velocity of $10^7$ cm/sec ($\geqq 10^5$ V/m). Therefore, if $W_{BC} = 0.1$ μm, 0.5 μm, and 1.0 μm, $\tau_{VC}$ is 0.5 psec, 2.5 psec, and 5.0 psec, respectively. Base and collector concentrations may be determined such that $W_{BC}$ becomes 1 μm or less.

③ $\tau_e$ (emitter charge time) will be described below. Normally, if $C_{be} >> C_{bc}$ and an emitter area $A_E = 1.5 \times 1.5$ μm$^2$, a high current up to $J_C = 1 \times 10^4$ to $10^5$ A/cm$^2$ is used. Therefore, $$I_C = J_C A_E = 0.225 \text{ to } 2.25 \text{ mA}$$

is obtained, and $kT/qI_C$ at room temperature is obtained as follows:

$$kT/qI_C = 111 \text{ to } 11.1 \Omega$$

In this case, $$\tau_e = (kT/qI_C + r_{EE})(C_{be} + C_{bc}) \quad (11)$$
$$\approx (kT/qI_C + r_{EE}) \cdot C_{be}$$

Therefore, $$kT/qI_C \gg r_{EE}$$

is obtained since $J_C = 10^4$ A/cm$^2$. Therefore, assuming that $\tau_E < 5$ psec, $$(kT/qI_C)C_{be} < 5 \text{ psec}$$

is obtained, and $$C_{be} < 5 \times 10^{-12} \times (qI_C/kT)$$
$$= 4.5 \times 10^{-14} F$$

is obtained. That is, if $C_{be}$ is 45 fF or less, $\tau_e$ is 5 psec or less. For example, if $C_{be}$ is 10 fF, $\tau_e$ is 1 psec.

If $C_{be}$ is 10 fF or less, the speed of $\tau_e$ is not problematic at all.

④ A collector charge time $\tau_c$ is represented by the following equation:

$$\tau_c = r_{CC} \cdot \epsilon S/W_{BC} \quad (12)$$

Assuming that $S = 4 \times 4$ μm$^2$, since $$\tau_c = r_{CC} \, 1.66 \times 10^{-19}/W_{BC}$$

is obtained, $$r_{CC} < 6 \times 10^6 \, W_{BC}$$

is obtained. Therefore, even if $W_{BC} = 0.1$ μm, no problem is posed when $r_{CC} < 60\Omega$ or less.

Impurity Concentration (1) Emitter Impurity Concentration

The lower limit of an emitter impurity concentration will be described below.

As described above, the collector current is represented by equation (3). If $W_B \gg L_n$ and $V_{BE} \ll kT$, the following equation is obtained:

$$J_C = (qn_i^2 D_n/N_B W_E)\exp\{(V_{BE}+\Delta E_g)/kT\} \quad (13)$$

Normally, this equation is satisfied when the following equation of minority carrier approximation is satisfied:

$$N_D \gg (n_i^2/N_B)\{(V_{BE}+\Delta E_g)/kT\} \quad (14)$$

A region in which the above equation is not satisfied corresponds to a transistor current drive limit.

Therefore, $$J_C \approx q(D_n/W_B)N_D \quad (15)$$

obtained by substituting $$(n_i^2/N_B)\{(V_{BE}+\Delta E_g)/kt\}$$

of equation (13) by an emitter concentration $N_D$ is a current drive limit for emitter concentration definition of this transistor.

Figure 27A:
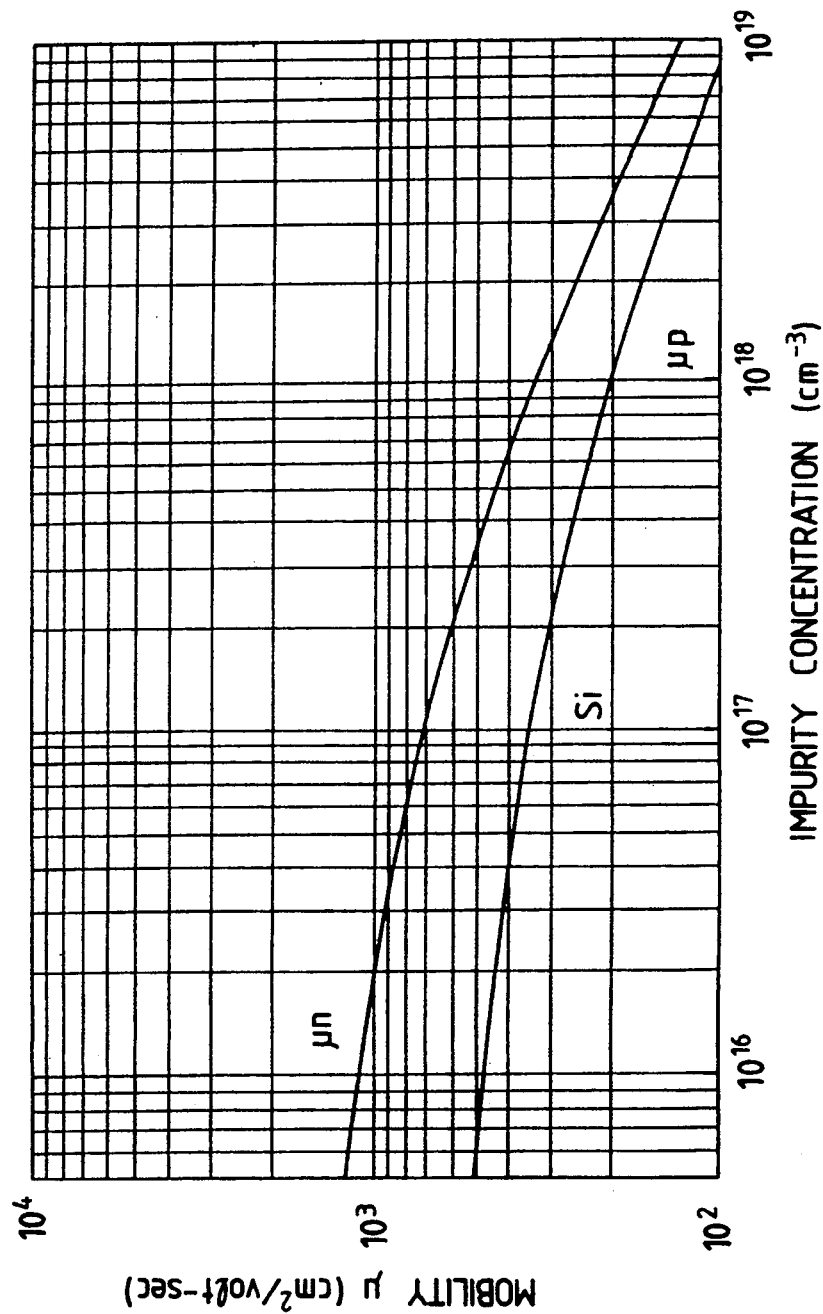
FIGS. 27A and 27B show, in this order, a graph of relation between the impurity concentration and mobility ($\mu n$, $\mu p$), and a graph of relations between base impurity concentration and lower limit of emitter impurity concentration.
Figure 27B:
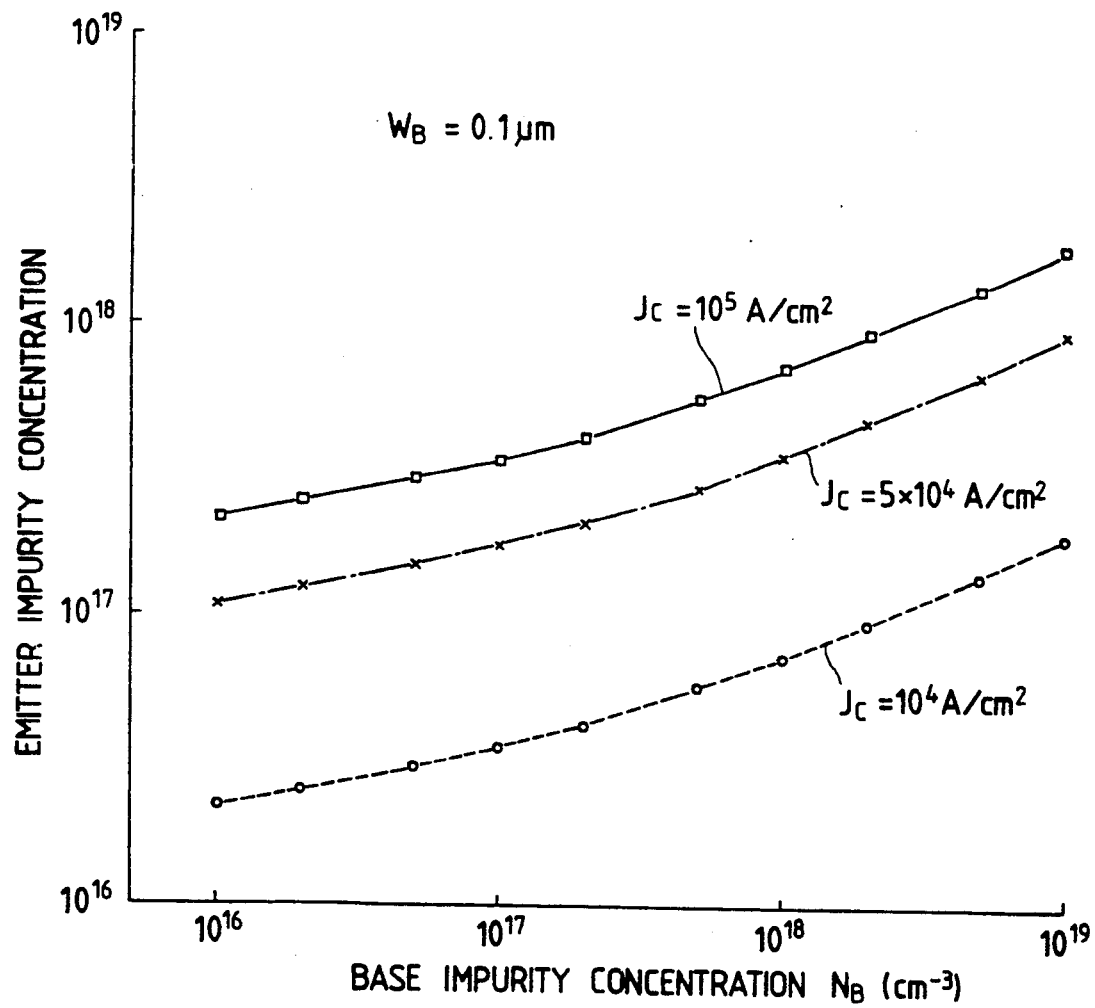

A transistor normally requires $J_C$ of $10^4$ to $10^5$ A/cm$^2$. Since $$D_n = (kT/q)\mu_n,$$

the lower limit of $N_D$ is calculated as shown in FIG. 27B by using data of $\mu_n$ shown in FIG. 27A and assuming that $W_B = 0.1$. In this case, $J_C = 1 \times 10^4$, $5 \times 10^4$, and $1 \times 10^5$ A.

(2) Collector Impurity Concentration

A current limit determined by a collector impurity density is represented by the following equation:

$$J_C = q \cdot n \cdot V_s \quad (16)$$

In this case, a base-collector depletion layer transits a saturated velocity of $$V_s = 10^7 \text{ cm/sec},$$

and n has a limit of $N_C$. For example, if $J_C$ is $1 \times 10^4$ A/cm$^2$, $N_C$ is $6.2 \times 10^{15}$ cm$^{-3}$. If $J_C$ is $1 \times 10^5$ A/cm$^2$, $N_C$ is $6.2 \times 10^{16}$ cm$^{-3}$. A current represented by $J_1$ in FIG. 26 normally has this value. When a current having a value determined by $J_1 = J_{cmax}$ or more flows, carriers are injected from the base to cause a base spreading effect, and $\tau_B$ represented by equation (7) increases at a high rate. Therefore, as shown in FIG. 26, a phenomenon in which $\tau_{ec}$ increases at a high rate appears. If $N_C$ is $3 \times 10^{16}$ cm$^{-3}$, $\tau_{ec}$ does not increase at a high rate untill $5 \times 10^4$ A/cm$^2$.

(3) Base Impurity Concentration

A base impurity concentration will be described below.

A base carrier concentration is good as long as the number of injected minority carriers is $$(n_i^2/N_B)\exp\{(V_{BE}+\Delta E_g)/kT\}$$

or more. If the number is larger than this value, neutrality of a charge can be maintained. That is, assuming that a base impurity concentration is $N_B$, the following relation need only be satisfied:

$$N_B \gg (n_i^2/N_B)\exp\{(V_{BE}+\Delta E_g)/kT\} \quad (17)$$

When $N_B$ becomes close to $n_i\exp\{(V_{BE}+\Delta E_g)/2kT\}$, a space-charge effect appears, and a resistance in the base rises at a high rate.

Therefore, if $N_B \geq N_D$, a current drive capability determined by the emitter impurity density can be assured.

Base and collector impurity densities will be examined on the basis of the width $W_{BC}$ of the base-collector depletion layer. $W_{BC}$ and a width $X_P$ of a depletion layer spreading in the base are represented by:

$$W_{BC} = \sqrt{(2\epsilon_s/q)\{(1/N_B) + (1/N_C)\}} \quad (18)$$
$$\sqrt{(kT/q)\ln[\{N_B N_C\}/\{n_i \cdot \exp(\Delta E_g/kT) + V_R\}]}$$

and, $$X_P = N_C/(N_B + N_C) \quad (19)$$

Figure 28:
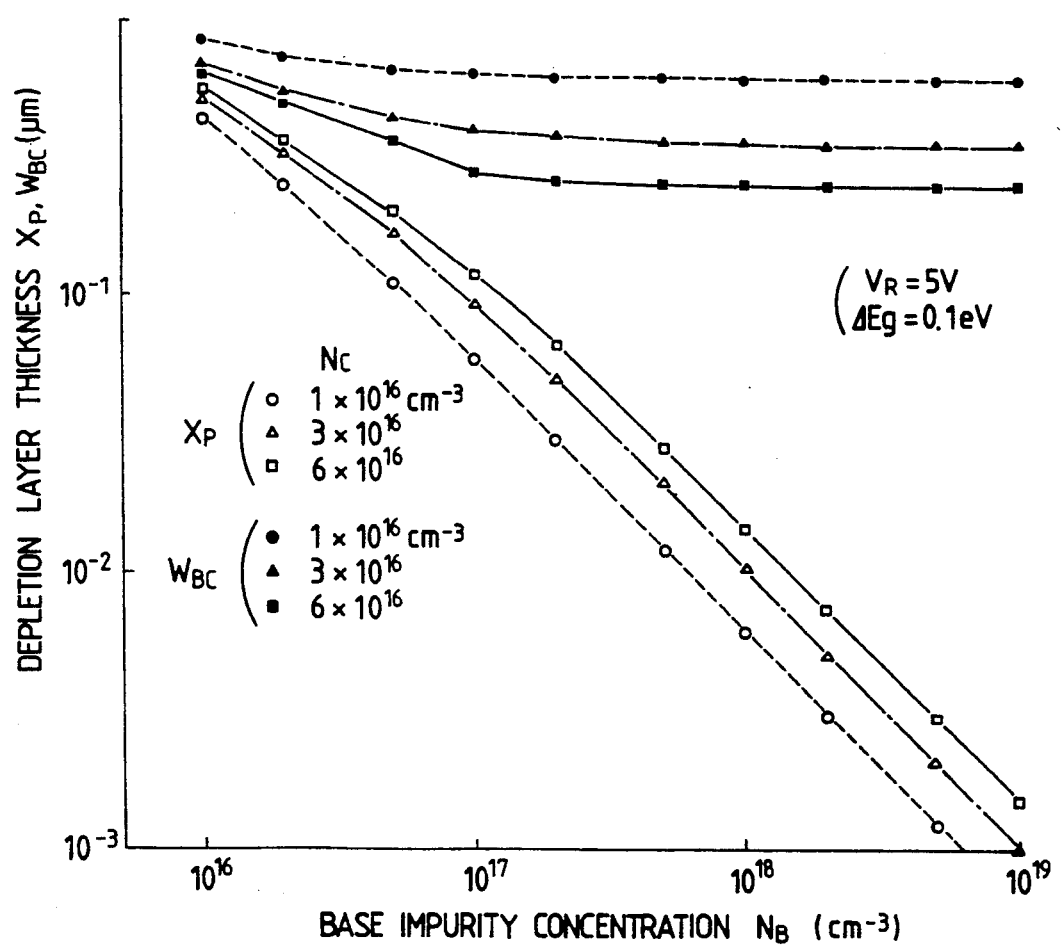
FIG. 28 shows a relation between base impurity concentration $N_D$ and depletion layer width $W_{BC}$ between base and collector and base depletion layer width $X_F$.

FIG. 28 shows a relationship of depletion layer thicknesses $W_{BC}$ and $X_P$ (μm) with respect to the base impurity density $N_B$ obtained under predetermined conditions of $\Delta E_g = 0.1$ eV, room temperature, and $V_R = 5$ V, and by using connector impurities densities $N_C = 1 \times 10^{16}$, $3 \times 10^{16}$, and $6 \times 10^{16}$ cm$^{-3}$ as a parameter.

When $N_C = 3 \times 10^{16}$ cm$^{-3}$, $W_{BC} = 0.35$ μm, and $\tau_{VC}$ of equation (10) is 1.75 psec, thereby posing no problem. $\tau_B$ obtained from equation (7) indicates that at least $W_B$ must be 0.1 μm or less. When 5 V is applied across the base and the collector, $X_P$ is at least $X_P < W_B$. In addition, as is apparent from FIG. 28, $N_B$ must be about $2 \times 10^{17}$ cm$^{-3}$ or more.

As described above, in the hetero BPT of the present invention, if the current driving condition of $J_C = 5 \times 10^4$ A/cm, ① the collector impurity density must satisfy:

$$N_C \geq 3 \times 10^{16} \text{ cm}^{-3}$$

② the base impurity density must satisfy:

$$N_B \geq 2 \times 10^{17} \text{ cm}^{-3}$$

note that the base width $W_B \leq 0.1$ μm, and

③ the emitter impurity density must satisfy:

$$N_D \geq 2 \times 10^{17} \text{ cm}^{-3}$$

Assuming that the emitter size is $A_E = 1.5 \times 1.5$ μm$^2$, the base area is $A_B = 4 \times 4$ μm$^2$, the emitter-base voltage is a bias value, and the base-collector voltage $= +5$ V, $C_{be} = 3.6$ fF, $C_{bc} = 4.4$ fF, and $W_{BC} = 0.39$ μm. Therefore, $\tau_{vc}$ and $\tau_c$ are sufficiently small. $\tau_e$ is basically in inverse proportion to $I_C$ and is vary small in a high-current region. Therefore, the lower limit of $\tau_{ec}$ is determined by the base travel time $\tau_B$.

In a conventional BPT, $\tau_B$ determines the upper limit of $f_T$. At a low temperature, $D_B$ is further reduced on the basis of a relationship of $D_B = (kT/qK)\mu n$.

To the contrary, the hetero BPT of the present invention having a potential gradient can keep its high performance.

Charge Storage

Charge storage in the hetero BPT of the present invention will be described below.

In a charge storage device such as a BPT, a propagation delay time T can be approximated by the following equation:

$$T = Q_{BPT}/I_C \quad (20)$$

where $Q_{BPT}$ is a charge stored in a BPT and $I_C$ is a collector current. In order to reduce T, $Q_{BPT}$ is reduced and $I_C$ is increased.

In the hetero BPT according to the present invention, $I_C$ is increased by $\exp(\Delta E_g/kT)$ as compared with that of a conventional Si BPT. Therefore, T can be reduced by only this increase. A better effect, however, can be obtained by reducing $Q_{BPT}$.

A stored charge $Q_{BPT}$ of the BPT can be approximated by a charge stored in the base as follows:

$$Q_{BPT} = q\int(n - n_p)dx \quad (21)$$

When the base impurity density is constant and no band gap gradient is present, the following relation is obtained:

$$\begin{aligned} Q_{BPT} &= q \cdot n_p \cdot L_n\{\exp(V_{BE}/kT) - 1\} \times \\ &\quad [\{\cosh(W_B/L_n) - 1\}/\{\sin(W_B/L_n)\}] \\ &= (1/2) \cdot q \cdot W_B[\{n_i^2 \cdot \exp(\Delta E_g/kT)\}/N_B] \times \\ &\quad \{\exp(V_{BE}/kT) - 1\} \end{aligned} \quad (22)$$

(where $L_n >> W_B$)
Therefore, $$T = (\tfrac{1}{2})(W_B^2/D_n) \quad (23)$$

is obtained. This is the same as $\tau_B$ in equation (7).

An effect of increasing a current by $\exp(\Delta E_g/kT)$ becomes the same as that of a conventional homo BPT if a stored charge increases.

In order to reduce the stored charge $Q_{BPT}$, a potential gradient must be formed in the base to obtain a drift.

Figure 29:
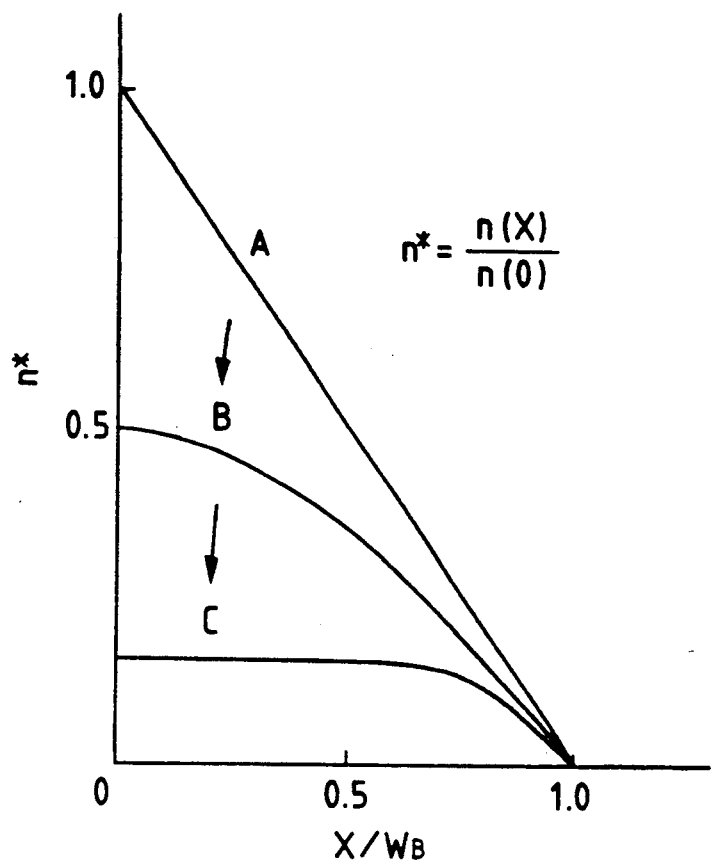
FIG. 29 shows a graph of relation between a normalized position $X/W_B$ within base and relative carrier number $n^x$.

Referring to FIG. 29, the abscissa represents a distance standardized by a base width $W_B$, and the ordinate represents a relative carrier number $n^*$ obtained by normalizing injected carriers by a carrier number $n(0)$ at an emitter-base junction ($x = 0$) in a BPT in which an impurity density is constant in the base.

Figure 10:
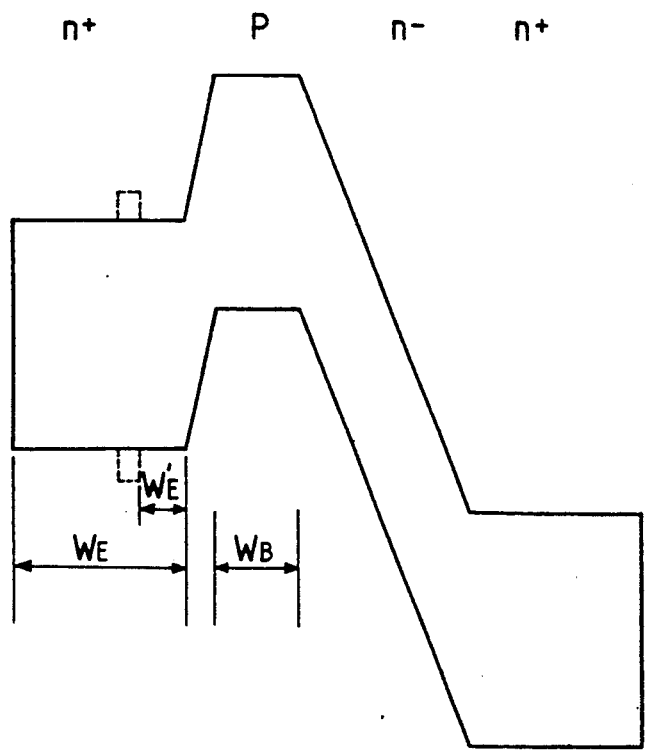
FIG. 10 shows a potential during a normal operation at a sectional area A—A' in FIG. 5 in case of forming the silicon oxide between the emitter and base regions of BPT in FIG. 5.

When a potential distribution is provided in the base and made steep as indicated by A→B→C in FIG. 10, the carrier number is reduced. If $\Delta V = 2kT/q$ is set in order to halve $\tau_B$, the stored charge is halved.

A diffusion capacitance $C_{DE}$ equivalently representing storage of minority carriers is given by the following equation:

$$C_{DE} = dQ_{BPT}/dV_{BE} = q \cdot [\int(n - n_p)dx] \quad (24)$$

If a base impurity is constant and no potential gradient is present $C_{DE}$ is given as follows:

$$\begin{aligned} C_{DE} &= (q\tau_n/kT) \cdot I_C \cdot [1 - \text{sech}(W_B/L_N)] \\ &= (1/2)(qI_C/kT)(W_B^2/D_n) \end{aligned} \quad (25)$$

$C_{DE}$ is reduced from this value by a potential gradient. Since $C_{DE}$ is substantially proportional to a stored charge amount, $C_{DE}$ is halved if $\Delta V = 2$ kT/q.

That is, performance of the HBT can be improved by a potential gradient ($\epsilon_{bi} = \Delta V/W_B$).

Photoelectric Transducer Apparatus

According to the present invention, $f_T$ of a photoelectric transducer apparatus can be improved, and a nondestructive degree can be improved by increasing a current gain.

Therefore, there is provided a solid-state image pickup apparatus capable of reading data from the same element a plurality of times without performing correction and capable of performing high-speed reading.

According to the present invention, there is provided a semiconductor device having small characteristic variations, a high current gain $h_{FE}$, and a high frequency, and a photoelectric transducer apparatus using the same.

① Since the oxide film formed at the interface between the base and the emitter of the conventional semiconductor device is removed, characteristic variations can be minimized. In addition, the current gain $h_{FE}$ is caused not to depend on $V_{BE}$.

②  Since the emitter region consists of a single crystal, the diffusion length of the minority carriers (positive holes) can be increased as compared with the device in which an emitter region consists of polysilicon. Therefore, the diffusion current of the positive holes from the base to the emitter can be increased, and the current gain $h_{FE}$ can be increased.

③  Since the carrier concentration is set to be $1 \times 10^{19}$ cm$^{-3}$ or less near the interface between the emitter region and the base region in the emitter region, band-gap narrowing can be prevented.

④  Since an emitter region having a high impurity concentration of $1 \times 10^{19}$ to $1 \times 10^{21}$ cm$^{-3}$ is formed between the emitter electrode and the emitter region, the positive holes are blocked, and the ohmic resistance can be reduced.

⑤  Since B and Ge as impurities are doped in the base region, both the mixed crystal effect and the band-gap narrowing effect can be obtained. Therefore, the base band gap can be reduced, and at the same time emitter injection efficiency can be improved.

⑥  Since the photoelectric transducer apparatus using the above BPT, a photoelectric transducer apparatus having a high frequency can be provided.

The present invention will be described in detail below.

Emitter Region

In the BPT of the present invention, as indicated by items ① and ②, and the oxide film formed at the interface between the base and the emitter can be eliminated, and the emitter region consists of single-crystal silicon.

As described above, since the oxide film is formed at the interface between the base and the emitter in the conventional BPT, the current gain $h_{FE}$ can be increased. In equation (1), when the thickness $W_E'$ of the emitter is decreased, $J_{B1}'$ is reduced. Therefore, $h_{FE}$ is represented as follows:

$$h_{FE} = J_C/(J_{B1} + J_{B2}) \quad (9)$$

When the oxide film is formed at the interface between the base and the emitter, a diffusion current of positive holes from the base to the emitter is defined as follows:

$$J_{B1} = \{(q \cdot n_i^2 \cdot D_p)/(N_E \cdot L_p)\} \times \tanh(W_E/L_p) \{\exp(V_{BF}/kT) - 1\} \quad (10)$$

When the oxide film is eliminated, the diffusion current of positive holes from the base to the emitter is represented by equation (1). The diffusion length $L_p$ of the positive holes as minority carriers can be reduced, and $J_{B1}$ is increased accordingly. Therefore, the current gain $h_{FE}$ is lowered.

In order to solve the above problem, the emitter consists of single-crystal silicon according to the present invention. When the emitter consists of single-crystal silicon, the diffusion length $L_p$ of positive holes serving as minority carriers in the emitter is increased. Therefore, the current gain $h_{FE}$ is increased as compared with the case wherein the emitter consists of polysilicon without an oxide film.

Since the oxide film is eliminated, the current gain $h_{FE}$ does not depend on $V_{BE}$ (only under the condition $\exp(V_{BE}/kT) \geq \geq 1$).

Figure 30:
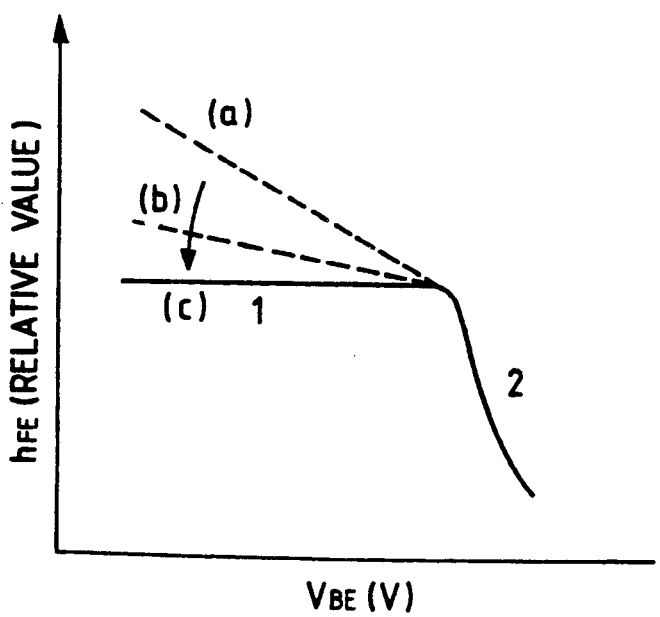
FIG. 30 is a graph which shows schematically $V_{BF}$ dependency of $h_{FE}$.

FIG. 30 is a graph illustrating $V_{BE}$ dependency of $h_{FE}$. The current gain $h_{FE}$ is plotted along the ordinate, and the voltage $V_{BE}$ is plotted along the abscissa in FIG. 30. A region ① is a current region generally represented by equations (1) to (3) and (9). A region ② is a large-current region which cannot be represented by equations (1) to (3) and (9).

When a silicon oxide film in a conventional DOPOS BPT is about 10 Å, the current gain $h_{FE}$ depends on $V_{BE}$ in the region ①, as indicated by a line (b) in FIG. 30. When the thickness of SiO$_2$ is increased, this dependency is increased, as indicated by a line (a) in FIG. 30. To the contrary, when the oxide film is eliminated, $V_{BE}$ dependency of $h_{FE}$ is decreased as small as negligible, as indicated by a line (c) in FIG. 30. A cause of $V_{BE}$ dependency of $h_{FE}$ is taken into consideration by independently examining $J_B$ and $J_C$ components. A base current $J_B$ is almost proportional to $\exp(V_{BE}/kT)$, but a collector current $J_C$ is represented by $J_C \propto \exp(V_{BE}/nkT)$. The n value was about 1.01 to 1.05 for a thin silicon oxide film (10 to 30 Å) and was larger than a normal value by about 1 to 5%. For this reason, the current gain $h_{FE}$ depends on $V_{BE}$. That is, this is the reason why $V_{BE}$ dependency of the current gain $h_{FE}$ can be eliminated by removing the thin silicon oxide film. The n value is large in the presence of the thin silicon oxide film because the potential barrier on the conduction band by the silicon oxide film seems to influence injection of electrons from the emitter to the base.

If the n value is defined as $n = 1 + \delta$ ($\delta < < 1$), and $$J_B \approx J_{B0} \cdot \exp(V_{BE}/kT( \quad (11)$$

$$J_C \approx J_{C0} \cdot \exp\{V_{BE}/(1+\delta)kT\} \quad (12)$$

the current gain $h_{FE} = J_C/J_B$ can be obtained as follows:

$$h_{FE} = (I_{E0}/I_{B0})(1 - \delta/kT \cdot V_{BE}) \quad (13)$$
$$\approx h_{FE0}(1 - \delta/kT \cdot V_{BE})$$

Therefore, $V_{BE}$ dependency of $h_{FE}$ can be obtained. Since kT = 0.025 V in room temperature, and if $\delta = 0.01$ (n = 0.01) and $V_{BE} = 1$ V are given, $h_{FE} = 0.6 h_{FE0}$. The current gain can be increased by 40% as compared with $V_{BE} = 0$ V. In order to cause the change in $h_{FE}$ at $V_{BE} = 1$ V to fall within 5%, condition $\delta \leq 1.25 \times 10^{-3}$ must be established. In this manner, the emitter potential barrier greatly influences the $h_{FE}$ characteristics of the BPT.

When a BPT is used as a sensor, $V_{BE}$ dependency of $h_{FE}$ greatly influences an optical input vs. electrical output ration ($\gamma$ value). This dependency also presents a significant problem when elements are to be uniformly manufactured.

A maximum height of this potential barrier can be allowed to about kT in a conduction band of an n$^+$-type emitter. When the maximum height exceeds kT, electrical characteristics are adversely affected. The potential barrier of the valence band presents a significant problem in a p$^+$-type emitter.

Fermi levels of semiconductors can be approximated as follows:

n-type semiconductor  $E_F - E_i = kT \cdot l_n(N_D/n_i)$   (14)

p-type semiconductor  $E_i - E_F = kT \cdot l_n(N_A/n_i)$   (15)

where $E_F$ is a Fermi level, $N_D$ is an n-type impurity density, and $N_A$ is a p-type impurity density.

Equations (14) and (15) can be established within the range of Boltzmann statistics. When an impurity density is high enough to be measured by Fermi-Dirac statistics, equations (14) and (15) cannot be used.

Figure 31:
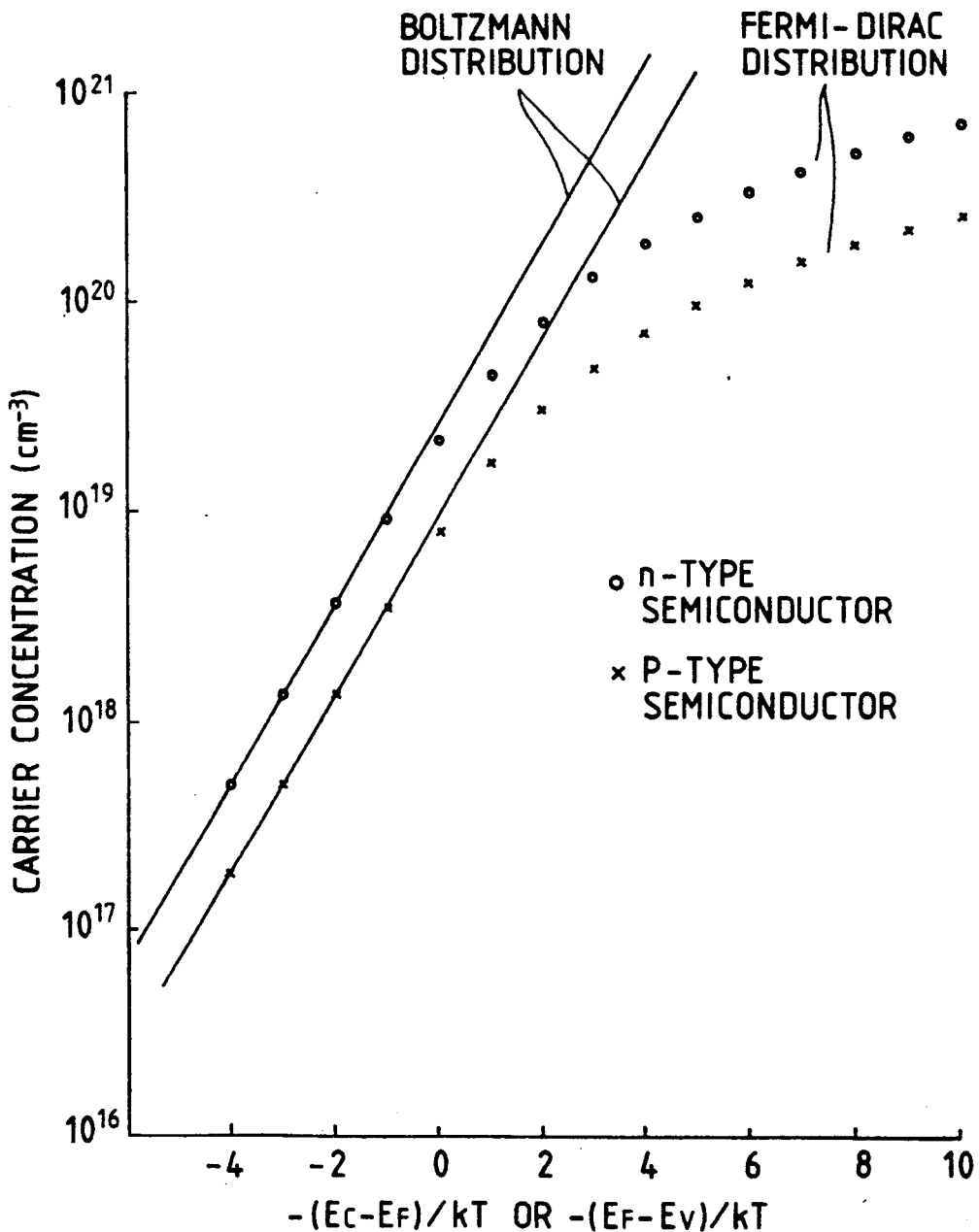
FIG. 31 shows a relation between fermi level $E_f$ and carrier concentration within Si.

FIG. 31 shows a relationship between the Fermi level $E_F$ and the carrier density in Si. Energy normalized with kT is plotted along the abscissa in FIG. 31. The normalized energy is $(E_F-E_C)/kT$ for an n-type semiconductor and $(E_V-E_F)/kT$ for a p-type semiconductor. $E_C$ and $E_V$ are energies of the conduction and valence bands. The carrier density ($cm^{-3}$) is plotted along the ordinate in FIG. 31 and is almost equal to the impurity density at room temperature. As is apparent from FIG. 31, when the normalized energy is zero, the Fermi level coincides with $E_C$ and $E_V$. However, when the concentration is higher, $E_F$ is not present in the prohibition band but is present in band band. In this case, the impurity concentration is $2.1 \times 10^{-3}$ for n-type, or $8 \times 10^{18}$ $cm^{-3}$ for p-type.

Figure 3:
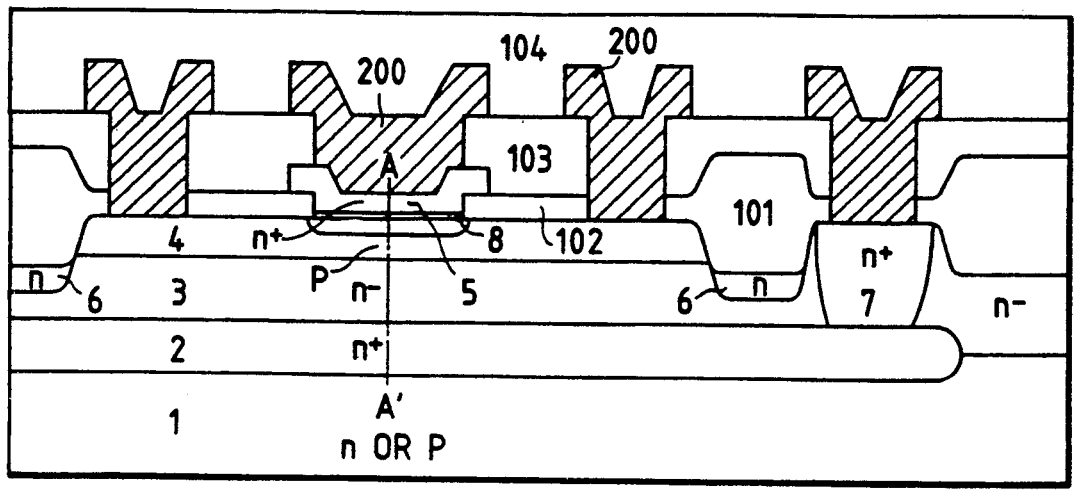

The alternate long and short dashed line in FIG. 3 exhibits a case obtained by using the Boltzmann statistics. When the normalized energy is higher than $-1$, a difference between the Boltzmann statistics and the Fermi-Dirac statistics occurs. In this case, unless the Fermi-Dirac statistics is used, Fermi energy cannot be accurately evaluated.

The difference between the n- and p-type semiconductors is caused by different band structures and different effective masses. This value varies depending on the types of material.

Region Having High Impurity Concentration

Figure 32:
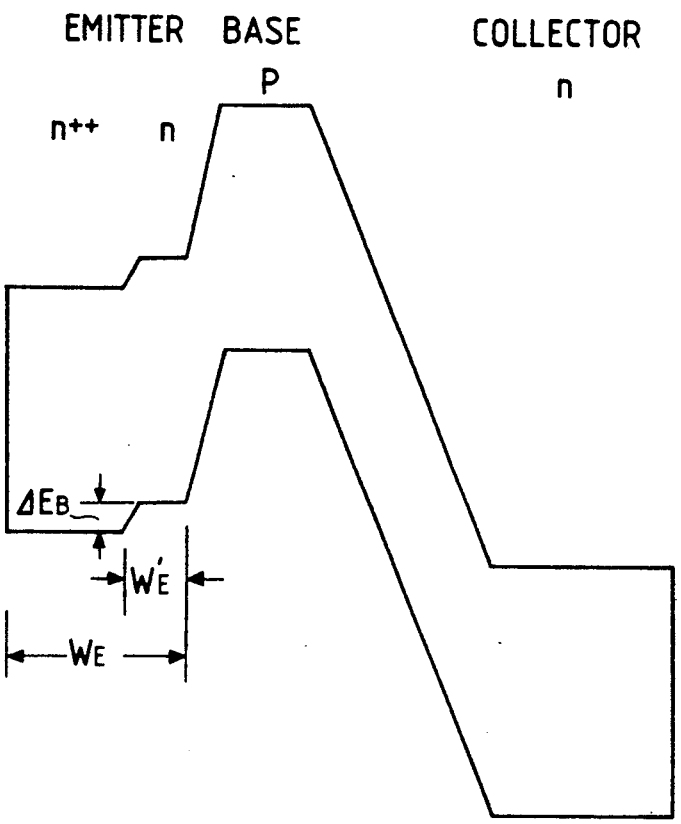
FIG. 32 shows potential distribution of high concentration region.

According to the present invention, a region having a high impurity concentration of $10^{19}$ $cm^{-3}$ or more is formed on the emitter surface. In this case, the potential distribution is shown in FIG. 32, and a potential barrier $\Delta E_B$ is formed in the emitter, as is apparent from FIG. 32. This potential barrier is formed by a Fermi level difference with respect to the carrier concentration, as shown in FIG. 32. The positive holes injected from the base are blocked by this potential barrier. Therefore, the base current is reduced, and the current gain $h_{FE}$ can be increased.

In order to obtain a sufficient positive hole blocking effect, the impurity concentration is set to satisfy condition $\Delta E_B > kT$. If condition $\Delta E_B > 2kT$ is satisfied, this effect is further enhanced. A current by recombination of positive holes injected from the base can be represented by equation (1), i.e., the same equation as obtained when the thin silicon oxide film is formed between the base and the emitter. In this case, if $W_{E'} << L_p$, then $J_{B1}$ is decreased, and the $h_{FE}$ of the BPT can be increased.

If an impurity concentration within the emitter near the base is given as $N_{E1}$, and an impurity concentration of the region having a high impurity concentration is given as $N_{E2}$, inequality $\Delta E_B < kT$ is derived from equation (14) under the following condition:

$$N_{E2} > eN_{E1} \qquad (16)$$

More accurately, $N_{E1}$ and $N_{E2}$ can be obtained by using the data shown in FIG. 3. Condition $\Delta E_B \geq kT$ is equal to condition $N_{E2} \leq eN_{E1}$. $W_{E'}$ must satisfy condition $2W_{E'} \leq L_p$ so as to obtain a satisfactory effect.

Base Region

According to the present invention, since the impurity concentration of the base is increased, the current gain $h_{FE}$ can be increased.

For example, in equation (8), if the emitter impurity density is given as $10^{18}$ $cm^{-3}$ and the base impurity density is given as $10^{19}$ $cm^{-3}$, then $\Delta E_{gb}-\Delta E_{ge} \simeq 50$ meV. Therefore, $h_{FE} \simeq 74 h_{FE0}$ can be obtained.

B is preferably used as a base impurity.

A p-type impurity has low solubility as compared with phosphorus (P) and arsenic (As) as n-type impurities. FIG. 19 shows data of solubility of a solid-phase impurity in silicon. Temperatures (T° C.) are plotted along the abscissa, and the solubility in the solid phase is plotted along the ordinate. P-type impurities are exemplified by B, Ga, and Al. Of these impurities, B can be dissolved in the highest concentration. When the impurity is doped to exceed the degree of solid solution, the impurity is precipitated in Si during the manufacturing process of the semiconductor device to form crystal defects, thereby adversely affecting the BPT characteristics (note that this depends on process temperatures).

By the above reason, B can be most stably doped up to a high concentration and is most suitable as a p-type impurity.

According to the present invention, Ge together with B is doped in the base. The purpose of Ge doping is to narrow the band gap.

Ge has a band gap smaller than that of Si. The Si band gap is $E_{gSi} \simeq 1.1$ eV, whereas the Ge band gap is $E_{gGe} \simeq 0.7$ eV. When a crystal composition is given as $Si_{l-x}Ge_x$, its band gap can be approximated as follows:

$$E_g' = E_{gSi} - X(E_{gSi} - E_{gGe}) \qquad (17)$$

If $X=0.1$, therefore, $\Delta E_g (=E_g'-E_{gSi})$ is about 20 meV.

The limitation of the Ge concentration will be described below.

According to the present invention, the Ge concentration is preferably 8.25 times or more the B concentration due to the following reason.

When an impurity is doped in a high concentration, a tetrahedral atomic radius of the impurity in Si poses a problem. More specifically, since Si has a diamond type crystal structure, it has tetrahedral bonds. In this case, an atomic radius r presents a problem. If a difference between atomic radii is given as $100 \times (r_{Ge}-r_{Si})/r_{Si}$, the difference for B can be given as about $-25$.

The atomic radius of Ge, i.e., $100 \times (r_{Ge}-r_{Si})/r_{Si}$, is about $+4$. That is, the Ge value is larger than Si by 4%. Ideally, a ratio of the dose of Ge to that of Ge is set to be $8.25=25/4$, crystal lattice distortion can be perfectly corrected.

According to the present invention, however, since the p-type base region is formed to have an impurity concentration distribution by, e.g., ion implantation, the semiconductor device has a structure in which lattice distortion tends not to occur. However, the Ge concentration is not limited to the one described above. The Ge dose is preferably 8.25 times or more the B dose.

Al, Ga, or the like may be used as a p-type impurity to be doped in the base (however, these p-type impurities have $100 \times (r-r_{Si})/r_{Si} \simeq +8$) and cannot correct lattice distortion of a substance having a small atomic radius. For example, although carbon (C) has a small atomic radius, $Si_{l-x}C_x$ has a direction to increase a band gap. That is, $Si_{l-x}C_x$ has a property opposite to bandgap narrowing. Therefore, the combination of Si and C is not preferable. B and Ge is a best combination for a p-type base.

The lower limit value of the base concentration is determined by band tailing and is therefore given as $1\times 10^{18}$ cm$^{-3}$. On the other hand, the upper limit of the base concentration is about $1\times 10^{20}$ since the solid solution limit shown in FIG. 19 is given.

Emitter Concentration

When a base concentration is increased, a base-emitter junction breakdown voltage is decreased. When a semiconductor device is used in a normal IC, a minimum breakdown voltage is 2 V or more. However, when a sufficient margin is to be taken into consideration, a minimum breakdown voltage is preferably 3 V.

A p-n junction breakdown voltage is determined by avalanche amplification when the impurity concentration of an emitter region is $10^{17}$ cm$^{-3}$ or less. However, when the impurity concentration of the emitter region is $10^{17}$ cm$^{-3}$ or more, an influence of a tunnel current is enhanced. When the impurity concentration of the emitter region is $10^{18}$ cm$^{-3}$ or more, the breakdown voltage is determined by only a tunnel current. In a region where a breakdown voltage of about 3 V is required, the breakdown voltage is determined by mainly a tunnel current and can be approximated as follows:

$$J_t = \{(2m^*)^{\frac{1}{2}} q^3 \cdot \epsilon \cdot V\}/\{4\cdot\pi^2\cdot h\cdot E_g^{\frac{1}{2}}\} \times \exp\{(-4\cdot m^{*\frac{1}{2}}\cdot E_g^{3/2})/(3\cdot q\cdot\epsilon\cdot h)\} \quad (18)$$

where is an electric field (V/m), Eg is a band gap, V is an applied voltage, m* is an effective mass, q is a charge, h is (Planck constant)/$2\pi$. When equation (18) is applied to silicon, it yields the following equation.

$$J_t = 1.649 \times 10^4 \cdot \epsilon \cdot V \exp[-3.052\times 10^9/\epsilon] \quad (19)$$

In equation (19), if V=3 V and $\epsilon=1$ MV/cm, then $J_t=2.75\times 10^{-5}$ A/cm$^2$. If $\epsilon=1.5$ MV/cm, then $J_t=1.02$ A/cm; and if $\epsilon=2$ MV/cm, then $J_t=2.33\times 10^2$ A/cm$^2$.

In an integrated circuit, a base-emitter breakdown voltage is required to be at least 2 V. For a safe margin, an impurity concentration is preferably higher than a lower limit of the emitter impurity concentration obtained when a voltage applied to the emitter-base path is set to be 3 V and an electric field is given as $\epsilon=1$ MV/cm due to the following reason. In a practical semiconductor device or the like, when an emitter size is reduced (e.g., $3\times 3$ $\mu$m$^2$) and the emitter junction becomes shallow (0.5 $\mu$m or less), a current becomes larger than those given by equations (18) and (11) by an influence of currents near the emitter.

The lower limit of the emitter impurity concentration will be described below.

As described above, the collector current is represented by equation (3) but is given under the condition $W_B << L_n$ and $V_{BE} >> kT$ as follows:

$$J_C = \{(q\cdot n_i^2\cdot D_n)/(N_B\cdot W_B)\}\exp(V_{BE}/kT) \quad (20)$$

This equation is established within the range approximated by the minority carriers as follows:

$$N_D >> (n_i^2/N_B)\exp(V_{BE}/kT) \quad (21)$$

($N_D$ is the emitter impurity concentration)
The limit at which the above condition becomes unsatisfied is a current drive limit of the transistor.

The current drive limit of the prescribed emitter impurity concentration of this transistor is given by substituting $(n_i^2/N_B)\exp(V_{BE}/kT)$ with the emitter concentration $N_D$ as follows:

$$J_C = q\cdot(D_n/W_B)\cdot N_D \quad (22)$$

The normal transistor requires $J_C$ of $1\times 10^4$ to $10^5$ A/cm$^2$.

Since $D_n=(kT/q)\mu_n$, then $\mu_n$ is used as conventional data to obtain $D_n$. The lower limit of $N_D$ is calculated using $W_B=0.05$, 0.1, and 0.2 $\mu$m, and the calculation results are obtained, as shown in FIG. 16A.

That is, the upper limit $N_D$ concentration for V=6 V and $\epsilon_m=1$ MV/m of FIG. 15 and the lower limit $N_D$ concentration of FIG. 16 are solely determined by the $W_B$ values. FIG. 33 shows data obtained by using $J_C$ as a parameter at $W_B=0.1$ $\mu$m.

In an integrated circuit, a base-emitter breakdown voltage is required to be at least 2 V. For a safe margin, an impurity concentration is preferably higher than a lower limit of the emitter impurity concentration obtained when a voltage applied to the emitter-base path is set to be 3 V and an electric field is given as $\epsilon=1$ MV/cm due to the following reason. In a practical semiconductor device or the like, when an emitter size is reduced (e.g., $3\times 3$ $\mu$m$^2$) and the emitter junction becomes shallow (0.5 $\mu$m or less), a current becomes larger due to an influence of currents near the emitter.

The upper limit of the emitter impurity concentration will be described below.

A maximum electric field (stepwise junction approximation) $\epsilon_m$ of a p-n junction and a depletion layer width W can be represented as follows:

$$\epsilon_m = [\{2q(V_{Bi}+V)/\epsilon_s\}\{(N_B\cdot N_D)/(N_B+N_D)\}]^{\frac{1}{2}} \quad (23)$$

$$W = [\{2\epsilon_s/q\}\{(i\ N_B\cdot N_D)/(N_B+N_D)\}\{V_{bi}+V\}]^{\frac{1}{2}} \quad (24)$$

where $V_{bi}$ is a diffusion potential, $\epsilon_s$ is a dielectric constant, $N_B$ is a base concentration, $N_D$ is an emitter concentration, and V is an applied voltage.

FIG. 15 is a graph showing a relationship between the base concentration $N_B$ and the emitter concentration $N_D$ at $\epsilon_m=1$ MV/cm when applied voltages V are 1, 2, 3, 4, and 5 V. For example, when an applied voltage is 3 V or more, the emitter concentration is set to be $4.5\times 10^{18}$ cm$^{-3}$ or less for the base concentration of $1\times 10^{18}$ cm$^{-3}$. When the base concentration is given as $5\times 10^{18}$ cm$^{-3}$, the emitter concentration is set to be $1\times 10^{18}$ cm$^{-3}$ or less. When the base concentration is given as $1\times 10^{19}$ cm$^{-3}$, then the emitter concentration is set to be $9\times 10^{17}$ cm$^{-3}$ or less. When the base concentration is given as $1\times 10^{18}$ cm$^{-3}$ or more, the emitter concentration is set to be $4.5\times 10^{18}$ cm$^{-3}$ or less. This emitter concentration is the upper limit.

When the applied voltage is 2.5 V and $\epsilon_m=1$ MV/cm is given, the emitter concentration is set to be $1\times 10^{19}$ cm$^{-3}$. This emitter concentration is the upper limit.

Collector Impurity Concentration

When the base concentration is increased, as described above, a base-collector breakdown voltage for the collector poses a problem.

The upper limit of the collector concentration is determined by the above breakdown voltage. A breakdown voltage in the emitter-collector (E-C) path of the BPT is determined by a base-collector (B-C) breakdown voltage when the base concentration is increased. In a BPT operated at 5 V, the E-C breakdown voltage is required to be 10 V for a safe margin. In order to assure the breakdown voltage of 10 V or more, the collector concentration is set to be $N_C < 1.5 \times 10^{17}$ cm$^{-3}$. In 3-V driving, the breakdown voltage is required to be 6 V or more. Therefore, the collector impurity concentration $N_C$ is about $3 \times 10^{17}$ cm$^{-3}$.

The lower limit of the collector concentration is determined by the current limit. On the collector side, an acceleration electric field is applied to the base-collector junction. In a high electric field ($10^5$ V/cm or more), the carrier travels at a saturation speed $V_s \simeq 10^7$ cm/sec according to equation (25):

$$J_C = q \cdot n \cdot V_s \tag{25}$$

where n is the number of carriers. The lower limit of the number n is also defined as a collector carrier density. (That is, $n = N_D$ is the limit.) Because when the carrier density is less than the lower limit of n, neutrality of the charges in the semiconductor cannot be maintained by the carriers and a collector resistance is excessively increased (called a spatial charge effect). However, even if the spatial charge effect occurs, the positive holes are injected from the base (i.e., a base spread effect), and the spatial charge effect can be moderated. When the $J_C$ limit is given as 10,000 A/cm$^2$, the collector impurity concentration can be about $6 \times 10^{15}$ cm$^{-3}$ or more according to equation (25). However, when the $J_C$ current limit is sacrificed by optical sensitivity of a photoelectric transducer element or the like, the lower limit is not restricted to the above-mentioned lower limit.

Base Width

Since a base width is determined by an $h_{FE}$ requirement, the base width is not limited to a specific value.

High-Speed BPT Operation

Limits for high-speed BPT operations will be described below.

A cutoff frequency $f_T$ of the BPT will be described below.

The cutoff frequency $f_T$ is analytically represented by the following general equation:

$$1/(2\pi f_T) = \{(k \cdot T)/(q \cdot I_C) + r_{EE}\}(C_{be} + C_{bc}) + \tau_B + \tau_C + r_{CC} \cdot C_{bc} \tag{26}$$

where $I_C$ is a collector current, $C_{be}$ is an emitter-base capacitance, $C_{bc}$ is a base-collector capacitance, $r_{EE}$ is an emitter series resistance, $r_{CC}$ is a collector series resistance, $L_B$ is a travel time in the base, and $L_C$ is a travel time in a collector depletion layer.

In order to increase the cutoff frequency $f_T$, the terms on the right-hand side of equation (1) must be reduced.

The resistance $r_{EE}$ is a resistance given by almost ohmic contact and depends on a surface concentration and an electrode. The impurity concentration of the surface is preferably n++.

The resistance $r_{CC}$ is more influenced by the thickness of the n$^-$-type region than the thicknesses of the n$^+$-type regions 2 and 7 in FIG. 29.

The physical meaning of the cutoff frequency $f_T$ is a time delay of the carrier injection from the emitter to the collector, and the time delay is represented by $\tau_{ec}$, so that $$f_T = 1/(2\pi \tau_{ec}) \tag{27}$$

If $f_T = 10$ GHz, then $\tau_{ec} = 16$ psec. A further detailed description will be made with reference to this time delay $\tau_{ec}$.

A travel time $\tau_B$ in the base is represented by the following equation:

$$\tau_B = W_B^2/(\eta D_B) \tag{28}$$

When the base has a uniform doping distribution, $\eta = 2$. However, when a potential gradient $\epsilon_{b1}$ is present, $\eta$ is given by the following equation:

$$\eta \simeq 2\{1 + (\epsilon_{b1}/\epsilon_0)^{3/2}\} \tag{29}$$

for $\epsilon_0 = 2D_B/\mu_B W_B$. Under the conditions that $\epsilon_{bi} = 0$, $N_B = 10^{18}$ cm$^{-3}$, $\mu_n = 300$ cm$^2$/sec V, and $W_{E0} = 0.1$ μm, $\tau_B = 13$ psec. The travel time in the base is long because the carriers travel in the base by diffusion.

$\tau_{VC}$ is a travel speed in a collector depletion layer and can be represented as follows:

$$\tau_{VC} = W_{BC}/2V_s \tag{30}$$

where $W_{BC}$ is a width of a base-collector depletion layer, and $V_s$ is a travel speed. Since the saturation speed of $V_s$ is 107 cm/sec (if $> 10^5$ V/m), under the conditions of $W_{BC} = 0.1$ μm, 0.5 μm, and 1 μm, the travel speeds $\tau_{VC}$ are respectively given as 0.5 psec, 2.5 psec, and 5 psec. The base and collector concentrations are determined so that $W_{BC}$ is set to be 1 μm or less.

$\tau_e$ (emitter charge time) will be described below.

If $C_{be} >> C_{bc}$ and an emitter area $A_E = 1.5 \times 1.5$ μm$^2$ are given, a high current up to $J_C = 10^4$ to $10^5$ A/cm$^2$ is used, so that $I_C = J_C \cdot A_E = 0.225$ to 2.25 mA and $kT/qI_C = 111$ to 11.1 Ω are obtained.

The emitter charge time can be obtained as:

$$\tau_e = \{kT/(q \cdot I_C) + \gamma_{EE}\}\{C_{be} + C_{bc}\} \simeq (kT/qI_C + \gamma_{EE})C_{be} \tag{31}$$

Assuming that $J_C = 10^4$ A/cm$^2$ and $kT/q \cdot I_C \cdot \gamma >> \gamma_{EE}$, when $\tau_e < 5$ psec is given, then $kT/qI_C \cdot C_{be} < 5$ psec, and $C_{be} < 5 \times 10^{12} \cdot qI_C/kT = 4.5 \times 10^{-14}$ F or less is derived. Therefore, for example, if $C_{be}$ is 45 fF or less, $\tau_e$ is 5 psec or less. When $C_{be}$ is 10 fF, $\tau_e$ is 1 psec. When $C_{be}$ is 10 fF or less, the speed of $\tau_e$ does not pose any problem. $\tau_e$ does not pose any problem either in a high current.

The collector charge time $\tau_c$ is the last term of the right-hand side of equation (1) and is defined as:

$$\tau_e = r_{CC}(\epsilon \cdot S)/W_{BC} \tag{32}$$

If $S = 4 \times 4$ μm$^2$, then $L_C = r_{CC}(1.66 \times 10^{19})/W_{BC} < 1$ psec, and then $r_{CC} < 6 \times 10^6 W_{BC}$. Even if $W_{BC} = 0.1$ μm, no problem occurs when $r_{CC} < 60$ Ω or less is given.

The base carrier concentration value need be larger than the number $n_1^2/N_B \exp(V_{BE} + \Delta E_g/kT)$ of injected minority carriers. In this case, neutrality of the charges can be assured, that is, $$N_B > n_1^2/N_B \exp(V_{BE} + \Delta E_g/kT) \tag{33}$$

When the value $N_B$ is about $n_i \exp(V + \Delta E_g/2kT)$, the spatial charge effect appears, and the resistance in the base is abruptly increased.

A base-collector impurity density will be examined with reference to the width $W_{BC}$ of the base-collector deletion layer.

$W_{BC}$ and a width $x_p$ of the depletion layer spreading in the base can be represented as follows:

$$W_{BC} = [\{(2\epsilon_s)/q\}\{(1/N_B)+(1/N_C)\} \times \{(kT/q) \cdot l_n(N_B \cdot N_C/n_i^2) + V_R\}]^{\frac{1}{2}} \quad (34)$$

$$x_p = \{N_C/(N_B+N_C)\} \cdot W_{BC} \quad (35)$$

Figure 8:
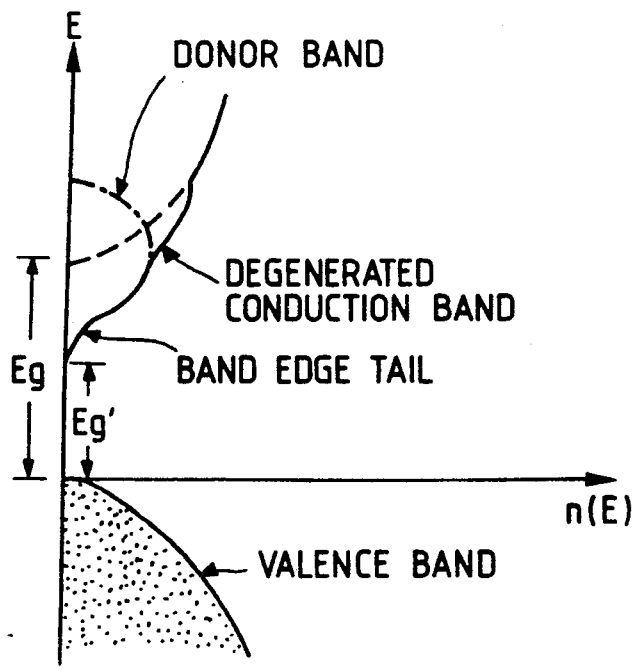

FIG. 8 shows a relationship between the width $x_p$ (μm) and the width $W_{BC}$ of the depletion layer when the collector impurity densities $N_B$ are $1 \times 10^{16}$ cm$^{-3}$, $3 \times 10^{16}$ cm$^{-3}$, and $6 \times 20^{16}$ cm$^{-3}$ under the conditions of $\Delta E_g = 0.1$ eV, room temperature, and $V_R = 5$ V (constant). For example, if $N_C = 3 \times 10^{16}$ cm$^{-3}$, then $W_{BC} = 0.35$, and $\tau_{VC}$ in equation (29) is 1.75 psec, thus posing no problem. Since $W_B$ must be 0.1 μm or less according to equation (27), when a voltage of 5 V is applied across the base-collector path, $x_p$ satisfies at least condition $x_p < W_B$. The concentration $N_B$ must be almost $2 \times 10^{17}$ cm$^{-3}$ or more from FIG. 11.

As can be apparent from the above description, in the BPT of the present invention, when the current drive condition is given such that $J_C = 5 \times 10^4$ A/cm$^2$, the impurity concentrations can be summarized as follows:

Collector impurity density: $N_C > 3 \times 10^{16}$ cm$^{-3}$
Base impurity density: $N_B > 2 \times 10^{17}$ cm$^{-3}$
(provided that the base width $W_B = 0.1$ μm)
Emitter impurity density: $N_D > 2 \times 17^{17}$ cm$^{-3}$ When the emitter size, the base area, and the emitter-base voltage as a forward-biasing base-collector voltage are given as $A_E = 1.5 \times 1.5$ μm$^2$, $A_B = 4 \times 4$ μm$^2$, and $+5$ V, respectively, $C_{be} = 3.6$ fF
$C_{bc} = 4.9$ fF
$W_{BC} = 0.35$ μm therefore, $C_{VC}$ and $\tau_c$ can be sufficiently reduced. $\tau_e$ is basically in inverse proportion to $\tau_c$ and can be minimized in a large-current region. The lower limit of $\tau_{ec}$ is determined by the travel time $\tau_B$ of the base. Normally, $\tau_B$ determines the upper limit of $f_T$ because motion is caused by diffusion.

Embodiment 1

Figure 35:
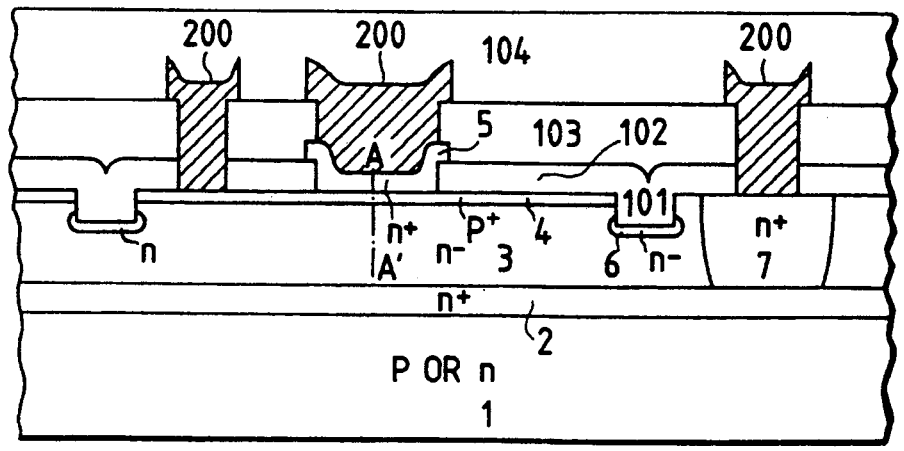
FIGS. 35, 38, 39, 40, 42, 44, 45, 46, 48, 50, 51, 53, 54, 55 and 56 respectively show schematic sectional view of BPT according to embodiments of the present invention.

As an embodiment of the present invention, a BPT having an arrangement as shown in FIG. 35 is formed by using an ion implantation method.

Figure 36:
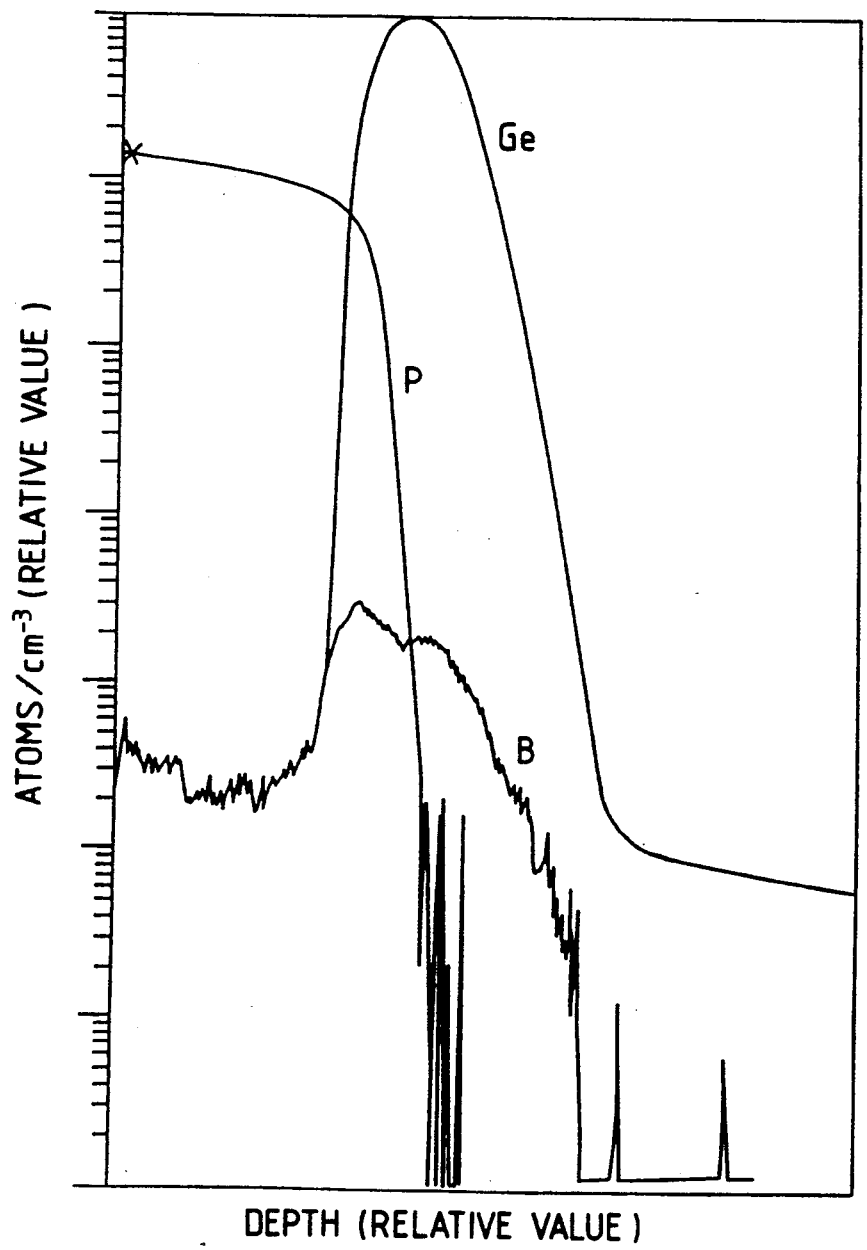
FIG. 36 shows a graph of an example of impurity Ge distribution at A—A' section in FIG. 35.

FIG. 36 is a graph showing impurity distributions and a Ge distribution at a portion indicated by A—A' in FIG. 35. Referring to FIG. 12, the abscissa represents a depth, and the ordinate represents impurity concentrations of Ge, P, and B. Note that the ordinate represents logarithmic values while the abscissa represents linear indications.

Phosphorus (P) is an impurity in an emitter region, B is an impurity in a base region, and Ge represents the concentration of $Si_{l-x}Ge_x$ in Si. In this case, P, B, and Ge does not always represent an absolute relationship.

Note that in this embodiment, P and B are used as impurities. The impurities, however, are not limited to those used in this embodiment.

Since an Si density is about $5 \times 10^{22}$ cm$^{-3}$, $Ge = 5 \times 10^{21}$ cm$^{-3}$ if $X = 0.1$.

For example, when ion implantation is performed under the conditions of $SiO_2 = 200$ Å and $Ge_{74}$ of 150 keV to obtain a dose of $Ge = 5 \times 10^{16}$ cm$^{-2}$, a Ge peak value of $5 \times 10^{21}$ cm$^{-3}$ is obtained at a portion separated from the surface of Si by 700 Å.

A relationship between the Ge peak value and the depth is uniquely determined by a relationship between the dose and the acceleration voltage. The thickness of a transition region between Si and $Si_{l-x}Ge_x$ is mainly determined by the acceleration voltage and annealing in the following process.

An emitter-base junction surface (E-B surface) is preferably close to a Ge peak concentration.

A ratio $\gamma$ of minority carriers to the base with respect to those to the emitter at the E-B junction is approximated by the following equation:

$$\gamma = (L_p D_n N_D / W_B D_P N_A) \exp(\Delta E_g / kT) \quad (1)$$

where $N_D/N_A$ is a doping ratio between the emitter and the base, $D_N/D_P$ is a diffusion coefficient ratio between the base and emitter minority carriers, $W_B$ is a base width, and $\Delta E_g$ is an emitter-base band gap reduction width. $\exp(\Delta E_g/kT)$ represents an effect of the E-B heterojunction. Assuming that $\Delta E_g \approx 0.1$ V and a temperature is room temperature, $\exp(\Delta E_g/kT) \approx 54.5$, and $\Delta E_C \approx 0$ in $Si_{l-x}Ge_x$. Therefore, $\Delta E_g \approx \Delta E_V$ is obtained.

Figure 37:
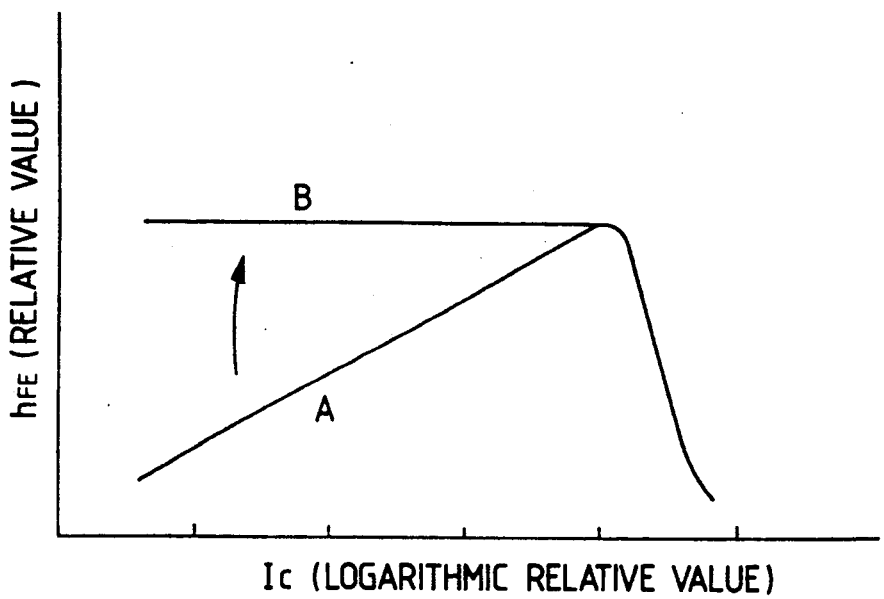
FIG. 37 shows property of BPT improved by the present invention.

In a normal BPT constituted by only Si, a base current is determined by a recombination current $J_{Brec}$ of electrons from an emitter and an injection current $J_{Binj}$ from a base to the emitter. Since $J_B = J_{Brec} + J_{Binj}$, $h_{FE} \approx J_C/J_{Brec}$ is obtained when $J_{Brec} >> J_{Binj}$. That is, $h_{FE}$ is increased as compared with that of a homojunction BPT. In a conventional $Si_{l-x}Ge_x$ heterojunction BPT, however, a stress is increased, and dislocation occurs in an extreme case. In addition, since many recombination centers are present in the interface between $Si_{l-x}Ge_x$ and Si, an overcurrent flows. $I_B$ is increased at a low current side, and $h_{FE}$ is significantly reduced in a region in which $I_C$ is small. FIG. 37 shows an improvement according to the present invention. Referring to FIG. 37, A represents a conventional HBT; and B, an HBT of the present invention.

In this embodiment, X is preferably 0.5 or less. If X exceeds 0.5, it is difficult to manufacture a good BPT. In addition, X of 0.5 or less is sufficient in the BPT.

A process of manufacturing the BPT of this embodiment will be described below.

(1) A buried region (n$^+$) 2 is formed on a p- or n-type substrate 1.

(2) An n$^-$-type region is formed by an epitaxial technique or the like.

(3) A 200-Å thick oxide film and a 1,500-Å thick nitride film are deposited on the entire surface.

(4) A recessed portion of an element isolation region 101 is formed by patterning and etching the nitride film.

(5) A channel stopper 6 is formed by ion implantation.

(6) The element isolation region 101 is formed by selectively oxidizing only the recessed portion.

(7) The nitride film and $SiO_2$ (200 Å) are removed.

(8) An oxide film 102 is formed on the entire surface.

(9) Ge is ion-implanted (Ge concentration: $5 \times 10^{16}/150$ keV) on the entire surface. Ge penetrates in only a thin portion of the oxide film.

(10) Annealing is performed at 1,100° C. for one hour (Ge depth $X_j = 0.2$ μm).

(11) B is ion-implanted (B concentration: $1 \times 10^{14}/5$ keV) on the entire surface. B penetrates in only a thin portion of the oxide film.

(12) Annealing is performed at 850° C. for 30 minutes (B depth $X_j = 0.1$ μm).

(13) The oxide film is patterned and etched to form an opening in a portion of an emitter 5.

(14) Polysilicon is deposited on the entire surface to form the emitter 5.

(15) P is ion-implanted (concentration: $5 \times 10^{15}/60$ keV).

(16) Annealing is performed.

(17) Polysilicon is processed.

(18) Additional annealing is performed.

(19) $SiO_2$ 103 is formed.

(20) An opening of a contact portion of the $SiO_2$ 103 is formed.

(21) Al-Si is deposited in the opening of the contact portion.

(22) The deposited Al-Si is patterned.

(23) Al-Si is alloyed.

The manufacturing process of this embodiment is as briefly described above. The most important part of this embodiment is a base region formation step described in item (5).

Although a heterojunction having an inclined transition region can be formed without using ion implantation, ion implantation is preferably used.

For example, a heterojunction having an inclined transition region can be formed by a vapor-phase growth method. In this case, an $H_2 + SiH_2Cl_2 + GeH_4$-based gas, for example, is used, and a gas concentration of $GeH_4$ is continuously changed to form a base region. If a temperature is 900° C. or less, a gas pressure is 100 Torr or less, and an epitaxial rate is 500 Å/min, the heterojunction can be formed more easily. In addition, the heterojunction is assumed to be obtained by an epitaxial technique in vacuum.

Ion implantation, however, is superior because a mixed crystal ratio can be stably set, a Ge concentration distribution can be correctly reproduced, and a mass production property is good.

In addition, since Si is in the form of amorphous after ion implantation of Ge, it can be easily subjected to solid-phase epitaxy, thereby reducing the temperature of a process. Furthermore, since a diffusion constant of Ge or Si is very small, the Ge concentration distribution does not almost change upon ion implantation in an annealing step at 1,000° C. or less.

As described above, formation of a mixed crystal of $Si_{1-x}Ge_x$ by ion implantation has may advantages.

A distribution function with respect to a depth direction X in a semiconductor upon ion implantation is approximated as follows:

$$N(X) \simeq (N_o/2.5R_P)\exp(-(X-R_P)^2/(\Delta R_P)^2) \quad (2)$$

where $N_o$ is an implantation amount per unit area, $R_P$ is a peak position, and $\Delta R_P$ is a distance from the peak to one diffusion amount (1 $\sigma$). $R_P$ and $\Delta R_P$ are changed by an acceleration voltage.

By forming the hetero BPT as described above, a point defect and dislocation in the hetero interface can be prevented to increase the current gain.

Embodiment 2

Figure 38:
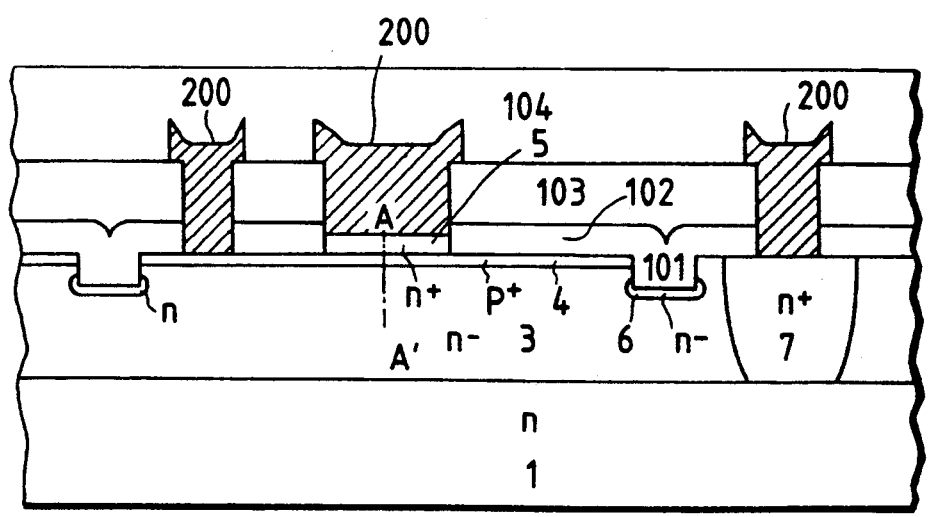

FIG. 38 shows another embodiment of the present invention.

A hetero BPT according to this embodiment is the same as that of Embodiment 1 except that an emitter has a buried structure, a substrate 1 has an n conductivity type, and no buried region is formed.

In such a hetero BPT, $h_{FE}$ can be increased as in the hetero BPT shown in Embodiment 1.

Embodiment 3

Figure 39:
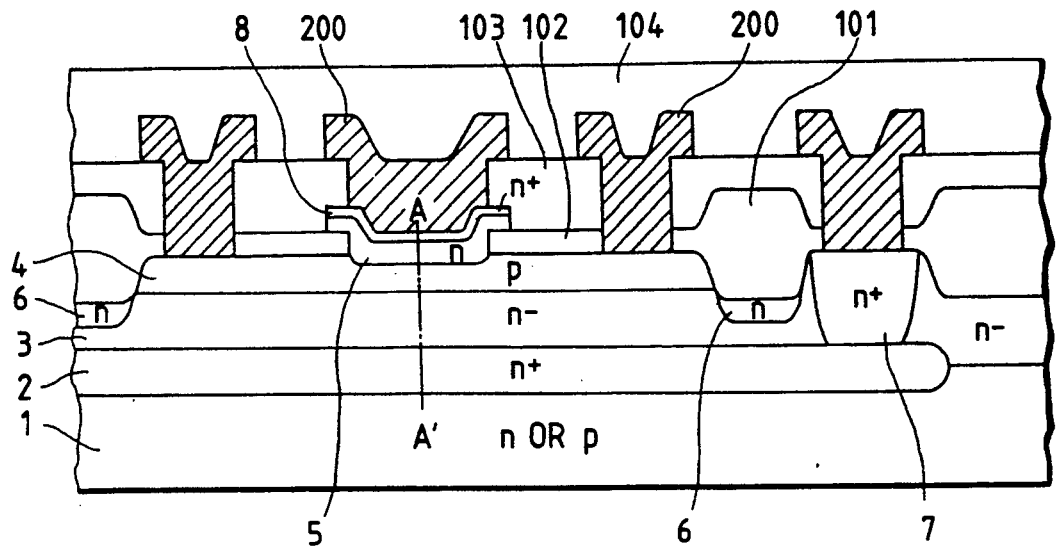

FIG. 39 shows the third embodiment of the present invention.

A hetero BPT according to this embodiment differs from Embodiment 1 in that an n+-type contact 8 is formed. The n+-type contact 8 is formed to reduce an ohmic resistance of an emitter 5. An impurity concentration of the n+-type contact 8 is preferably $10^{19}$ to $10^{21}$ cm$^{-3}$.

In such a hetero BPT, $h_{FE}$ can be increased as in the hetero BPT shown in Embodiment 1.

Embodiment 4

Figure 40:
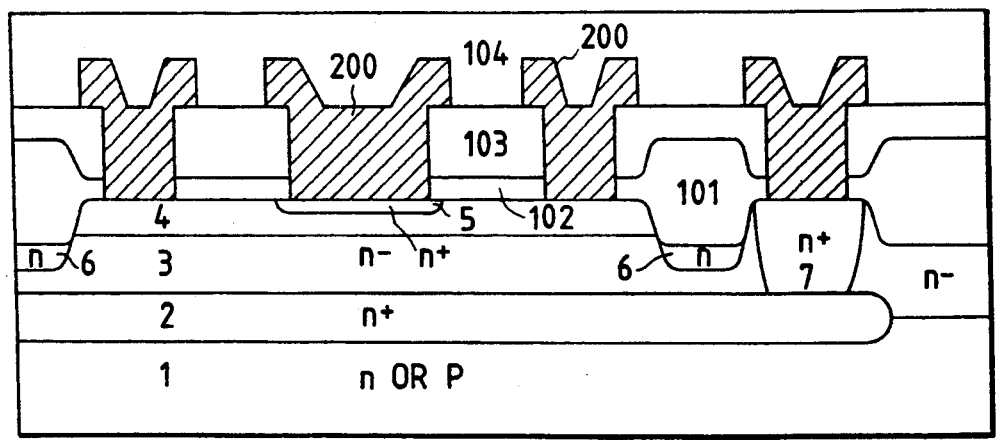

FIG. 40 shows an embodiment in which an emitter 5 is formed on a substrate.

In such a hetero BPT, $h_{FE}$ can be increased.

Embodiment 5

Figure 41:
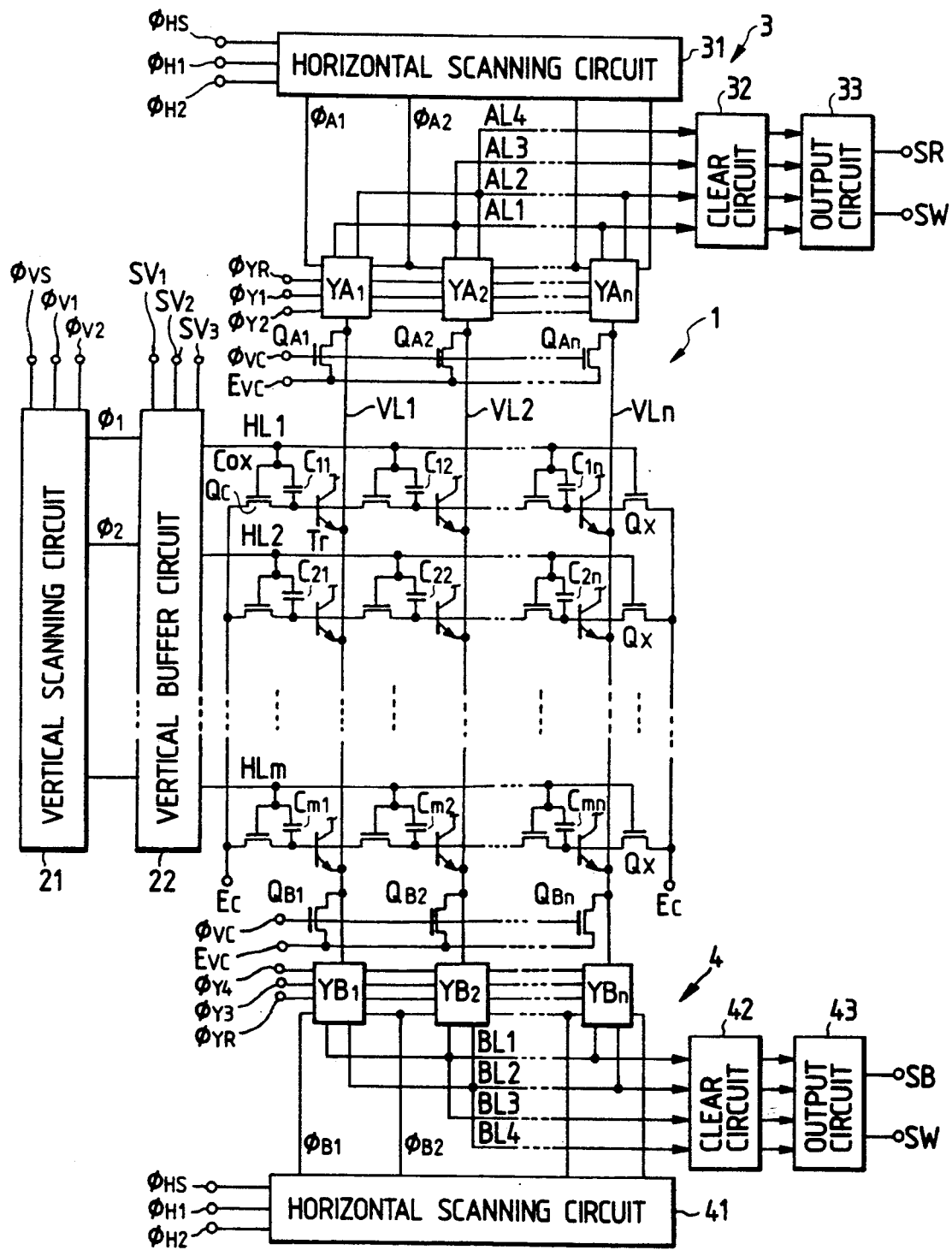
FIG. 41 shows a schematic circuit diagram for explaining a photoelectric conversion apparatus using BPT according to the present invention.

FIG. 41 is a circuit diagram showing a case in which the hetero BPT shown in the first embodiment is applied to a solid-state image pickup apparatus in Patent Application (2) filed by the present applicant on Dec. 21, 1987. Referring to FIG. 41, the hetero BPT shown in Embodiment 1 is used in a portion indicated by Tr.

That is, in this embodiment, the hetero BPT is used as a photoelectric transducer element.

Since the present invention can improve $f_T$ (frequency) of a semiconductor device, the present invention is very effective when it is applied to a photoelectric transducer apparatus.

In the photoelectric transducer apparatus, $F_T$ is determined by a read rate.

A current photoelectric transducer apparatus (area sensor) has $500 \times 640$ elements. An HD (High Division: an area sensor corresponding to a high vision) has $1,000 \times 2,000$ elements. In an operation of a current television, a horizontal scanning period $HT \simeq 50$ $\mu$sec, and a horizontal blanking period HALK is 8 to 10 $\mu$sec. In the HD, however, $HT = 3$ to 3.7 $\mu$sec and $HBLK = 26$ $\mu$sec. Horizontal scanning is conventionally $T_H = 50$ $\mu$sec/640 = 80 nsec, while that of the HD is $T_H = 26$ nsec/2,000 = 13 nsec.

A frequency must be at least six times that of a current television. That is, since a frequency is currently $f_T \simeq 1$ to 2 GHz, $f_T > 6$ to 16 GHz.

For the above reasons, $\Delta E_g$ is preferably 0.15 eV or less.

When the area sensor shown in FIG. 41 is to be used as a color camera, optical information of the same photoelectric transducer element is read a plurality of times. Since information is read from the same element a plurality of times, a ratio between electrical outputs upon first reading and reading from the second time is important. If this value is reduced, correction must be performed.

The ratio between the first and second read outputs is defined as a nondestructive degree.

Figure 7:
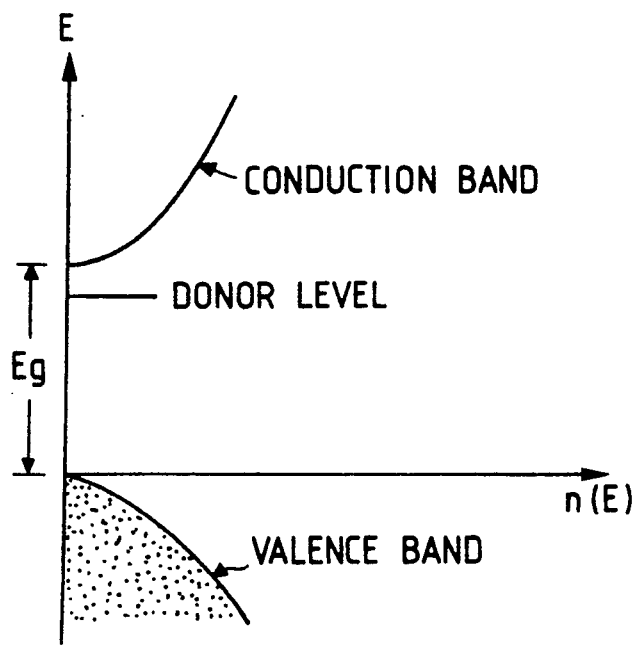
FIGS. 7 and 8 show a band structure of the semiconductor.

The nondestructive degree is given by the following equation:

Nondestructive degree $= (C_{tot} \times h_{FE})/(C_{tot} \times h_{FE} + C_V)$ where $C_{tot}$ is a total capacitance connected to the bases of the photoelectric transducer elements indicated by Tr in FIG. 7 and is determined by a base-emitter capacitance $C_{be}$, a base-collector capacitance $C_{bc}$, and $C_{ox}$. $C_V$ is a stray capacitance of read lines represented by $VL_1$ ... $VL_n$. Note that $C_{ox}$ is not present depending on circuit systems.

The nondestructive degree can be easily improved by increasing $h_{FE}$. That is, when $h_{FE}$ is increased, the nondestructive degree can be increased.

In the HD-corresponding area sensor, $C_{tot}=10$ fF and $C_V=2.5$ PF. Therefore, in order to obtain the nondestructive degree of 0.90 or more, for example, $h_{FE}$ must be 2,250 or more. In order to assure a sufficient nondestructive degree, $h_{FE}$ must be 2,000 or more.

To the contrary, in a conventional homojunction BPT, for example, $h_{FE}$ is about 1,000. Therefore, no sufficient nondestructive degree can be obtained. In the semiconductor device of the present invention, however, a high nondestructive degree is obtained since $h_{FE}$ can be sufficiently increased.

The nondestructive degree is more preferably 0.98 or more. At this time, $h_{FE}$ must be about 10,000. This value cannot be achieved by a conventional hetero BPT or homo BPT. That is, this value can be achieved by only the hetero BPT of the present invention.

Note that although the area sensor is exemplified in this embodiment, the present invention can be applied to a line sensor.

As has been described above, according to the present invention, since a heterojunction having an inclined transition region is formed in an interface between an $Si_{1-x}Ge_x$ mixed crystal and Si of a semiconductor device, the number of point defects and dislocations can be significantly reduced. Therefore, a current gain can be significantly improved in a region having a very small collector current.

In addition, according to the present invention, an ion implantation method is used. Therefore, a semiconductor device can be very easily manufactured and mass production can be facilitated.

That is, according to the Embodiments 1-5, a high-performance semiconductor device and a photoelectric transducer apparatus using the same can be provided at very low cost.

Embodiment 6

Figure 42:
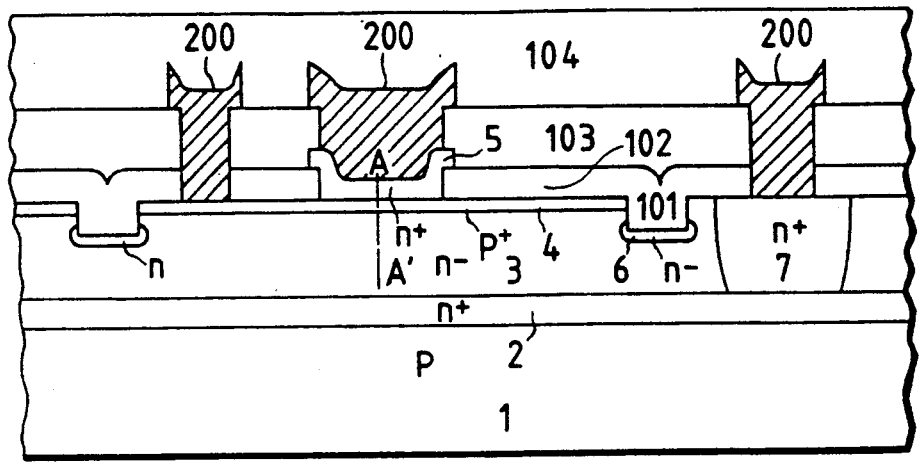

A BPT having the same structure as in FIG. 42 was manufactured as an embodiment of the present invention by using an ion doping method.

The manufacturing process of the BPT of this embodiment is shown.

① An $n^+$-type buried region 2 was formed in a p-type substrate 1.

② An $n^-$-type region 3 was formed on the buried region 2 by epitaxial techniques.

③ An $n^+$-type region 7 was formed to decrease a collector resistance of the BPT.

④ An element isolation region 101 was formed together with a channel stopper region 6.

⑤ A p-type impurity region containing Ge and B or Ga was formed on the $n^-$-type region 3 (formation of the base region) by ion implantation. When the distribution of the doped impurity in the $n^-$-type region 3 was measured, results shown in FIG. 2 were obtained, and this will be described in detail later.

⑥ After an emitter contact hole is formed, impurity-doped polysilicon or single-crystal silicon was deposited by low-pressure chemical vapor deposition (LPCVD) or epitaxy, and the region 5 was patterned (formation of the emitter region). In this case, when P was doped by ion implantation. When an impurity (P) concentration was measured, the distribution shown in FIG. 43 was obtained.

⑦ An insulator 103 was deposited, contact holes were formed therein, a wiring electrode material such as Al was deposited, and the electrode material was patterned.

⑧ An insulator 104 was deposited, and external lead openings are formed.

The above general steps constitute the manufacturing process of this embodiment. The most important step in this embodiment is step ⑤, i.e., the base formation step. The ion implantation method has advantages in that a mixed crystal can be stably set, the Ge concentration distribution can be accurately reproduced, and mass production can be facilitated. In addition, after Ge is ion-implanted, Si is amorphous, and solid-phase epitaxial growth can be easily performed. Therefore, a low-temperature process can be performed. In addition, Ge has a small diffusion constant in Si and an advantage in that the Ge concentration distribution at the time of ion implantation is rarely changed when annealing is performed at 1,000° C. or less.

A distribution function of the semiconductor in a direction X of depth during ion implantation can be approximated as follows:

$$N(X) \approx (N_o/2.5R_p) \exp(-(X-R_p)^2/(\Delta R_p)^2) \quad (18)$$

where $N_o$ is an implantation amount per unit area, $R_P$ is a peak position, and $\Delta R_p$ is a distance at which an implantation amount is reduced to one diffusion amount (1 $\sigma$) from the peak. The position $R_p$ and the distance $\Delta R_p$ are changed in accordance with an acceleration voltage.

FIG. 43 is a graph showing B, Ge, and P distributions when ion implantation is performed as described above. The depth (relative value) is plotted along the abscissa, and the atomic number/cm$^{-3}$ is plotted along the ordinate in FIG. 43.

As a result of formation of the hetero BPT described above, there is provided a semiconductor device having a high base-emitter breakdown voltage, a small base-emitter capacitance, and a high $h_{FE}$.

Embodiment 7

Figure 44:
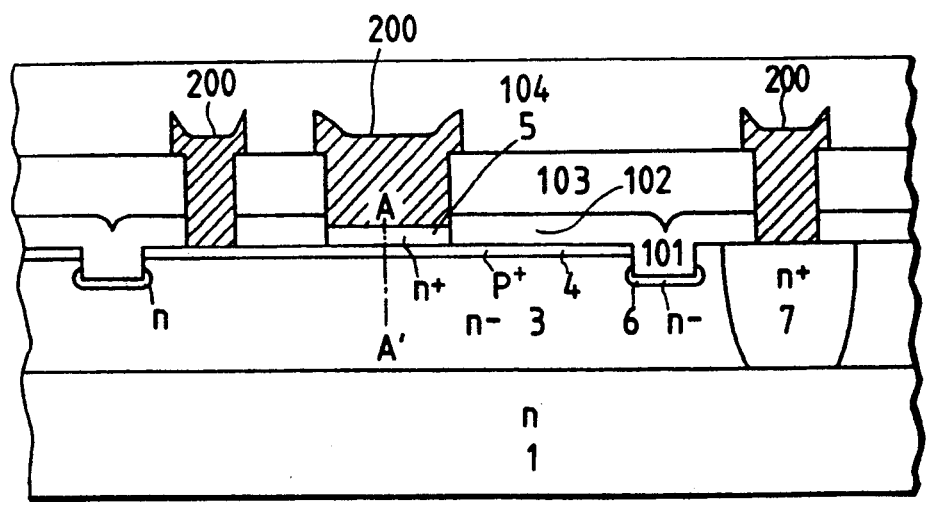

FIG. 44 is a view showing another embodiment of the present invention.

A hetero BPT according to this embodiment is different from that of Embodiment 6 except that an emitter has a buried structure, a substrate 1 has an n conductivity type, and a buried region is eliminated.

The same effect as in the BPT of Embodiment 1 can be obtained in this hereto BPT.

Embodiment 8

Figure 45:
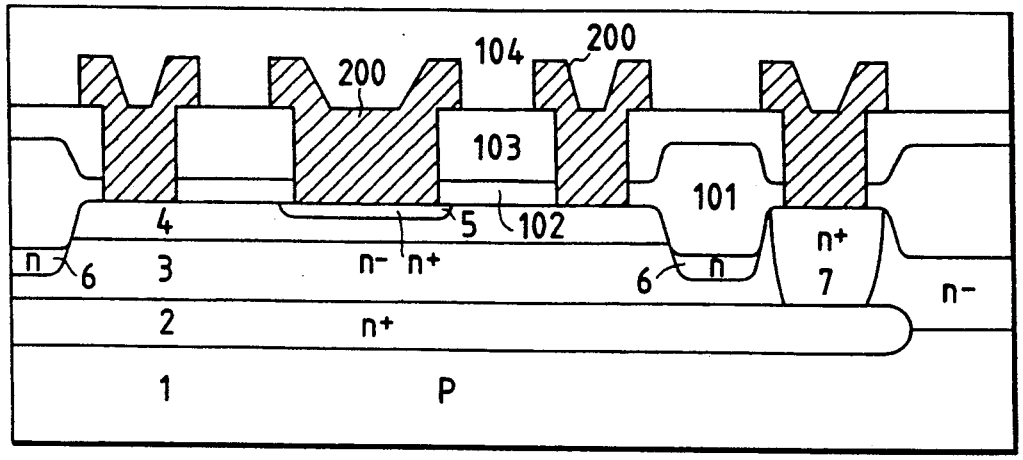

FIG. 45 shows a structure wherein an emitter region 5 is formed on a substrate 1 side.

The same effect as in the BPT of Embodiment 6 can be obtained in this hereto BPT.

Embodiment 9

Figure 46:
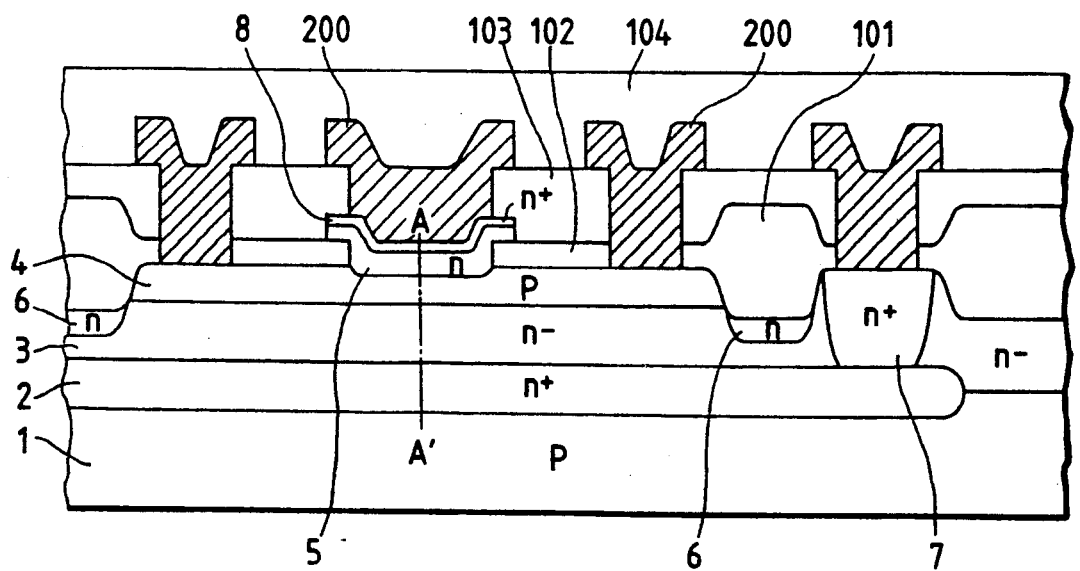

FIG. 46 is a view showing the 8th embodiment of the present invention.

A hetero BPT of this embodiment is different from that of Embodiment 6 except that $n^+$-type contact 8 is formed. The $n^+$-type contact 8 is formed to decrease an ohmic resistance of an emitter 5. The $n^+$-type contact 8 has an impurity concentration of $10^{20}$ cm$^{-3}$.

The same effect as in the BPT of Embodiment 6 can be obtained in this hetero BPT.

Embodiment 10

FIG. 41 is a circuit diagram wherein the BPT shown in Embodiment 6 is used in a solid-state image pickup apparatus. The BPT shown in Embodiment 6 is used in a portion represented by Tr in FIG. 41.

In this embodiment, the BPT shown in Embodiment 6 is used as a photoelectric transducer element.

According to the present invention, $f_T$ (frequency) of the semiconductor device can be increased. Therefore, when the semiconductor device is used in the photoelectric transducer apparatus, it is very effective.

The frequency $f_T$ in the photoelectric transducer apparatus is determined by a read rate.

An existing photoelectric transducer apparatus (area sensor) has 500×640 elements. An HD (High Diffusion; an area sensor corresponding to high vision) has 1,000×2,000 elements. In an existing television operation scheme, a horizontal scan period is HT≃50 μsec, and a horizontal blanking period HALK is 8 to 10 μsec. In the HD, HT=3 to 3.7 μsec, and HBLK=26 μsec. When horizontal scanning is taken into consideration, TH=50 μsec/640=80 nsec in the conventional arrangement, whereas TH=26 nsec/2,000=13 nsec in the HD.

The frequency is required to be at least six times. That is, in the existing scheme, $f_T$≃1 to 2 GHz. Therefore, $f_T$>6 to 16 GHz or more is required.

When an area sensor shown in FIG. 41 is used as a color camera, optical information of the same photoelectric transducer element is read a plurality of times. In this case, since the optical information is read from the same element by a plurality of times, a ratio of the first read output to the second read output is very important. When this ratio is reduced, correction is required.

The ratio of the first read output to the second read output is defined as a nondestructive degree.

The nondestructive degree is represented by the following equation.

$$\text{Nondestructive Degree} = (C_{tot} \times h_{FE})/(C_{tot} \times h_{FE} + C_V)$$

where $C_{tot}$ is a total capacitance connected to the bases of the photoelectric transducer elements represented by Tr in FIG. 41. The total capacitance $C_{tot}$ is determined by a base-emitter capacitance $C_{be}$, a base-collector capacitance $C_{bc}$, and $C_{Ox}$. $C_V$ is a stray capacitance of read lines represented by $VL_1 \ldots VL_n$. Note that $C_{ox}$ is not present depending on circuit systems.

The nondestructive degree can be easily improved by increasing the current gain $h_{FE}$. That is, when $h_{FE}$ is increased, the nondestructive degree can be increased.

$C_{tot}$ is represented by the capacitances of the BPT SENSOR, i.e., the base-emitter capacitance and the base-collector capacitance. That is, $C_{tot}=C_{be}+C_{bc}$. Normally, if $C_{be}>C_{bc}$ and the impurity concentration of the base is increased, $C_{be}$ becomes the main factor for determining the nondestructive degree.

In the above equation, $C_V$ is a stray capacitance of vertical lines, and $h_{FE}$ is a BPT current gain. Since condition $C_{tot}<10fF$ is given for two million pixels, $C_{be}<10fF$ must be satisfied. Whether $C_{be}<10fF$ is established is determined by an emitter concentration. If the emitter size is given as 1.5 μm² (an area S), $C_{be} = \epsilon \cdot S/d$ (where d is the thickness of the depletion layer)

$\epsilon = \epsilon_s \epsilon_0$ ($\epsilon_s = 11.8$ in Si)

Figure 47:
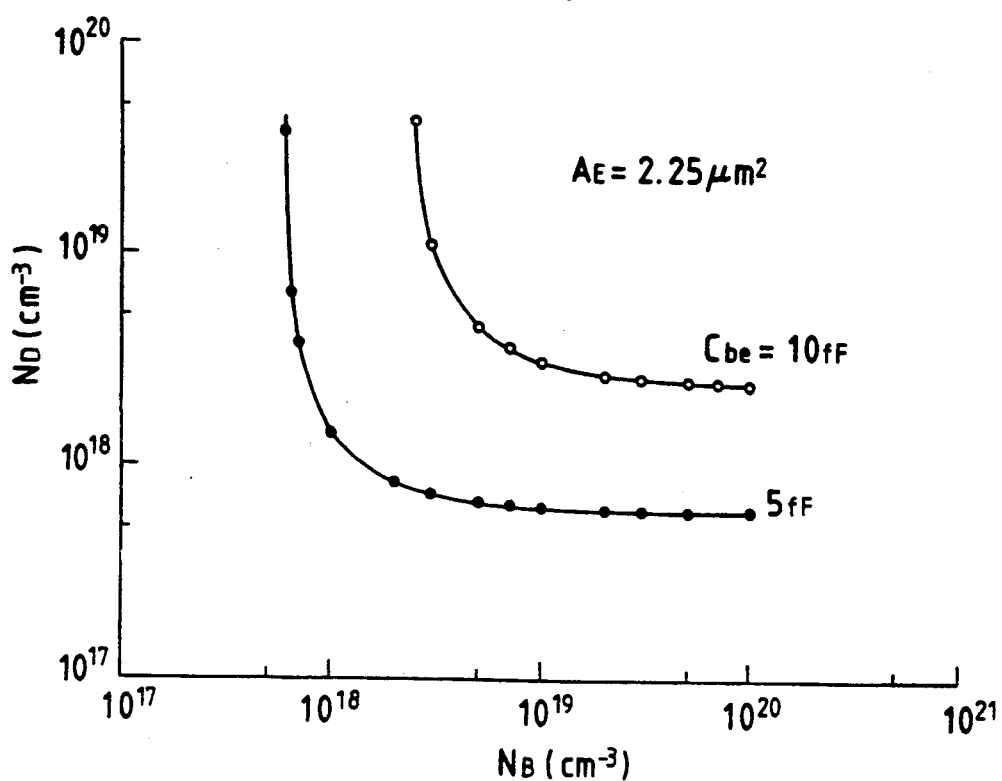
FIG. 47 shows a graph of lower and upper limits of $N_D$.

Since $S=2.25\times10^{-8}$ cm² is given, $d \geq 235$ Å. FIG. 47 shows upper limit values of concentrations $N_D$ (impurity concentrations of the emitter region) when the impurity concentrations of the emitter region with respect to the impurity concentration of the base region are given as $C_{be}=10fF$ and 5fF. For example, if $N_B=10^{19}$ cm$^{-3}$, $N_D=3\times10^{18}$ cm$^{-3}$ or less for $C_{be}=10fF$, and $6.3\times10^{17}$ cm$^{-3}$ for $C_{be}=5fF$.

In the area sensor corresponding to the HD, since $C_{tot}=10fF$ and $C_V=2.5$ pF, $h_{FE}$ must be 2,250 or more to obtain the nondestructive degree of 0.90 or more. In order to assure a sufficiently high nondestructive degree, $h_{FE}$ is assumed to be 2,000 or more.

To the contrary, since $h_{FE}$ is about 1,000 in a conventional homo BPT, a sufficiently high nondestructive degree could not be obtained. In the semiconductor device of the present invention, since a sufficient high $h_{FE}$ can be obtained, an excellent nondestructive degree can be obtained.

More preferably, the nondestructive degree is 0.98 or more. In this case, $h_{FE}$ must be about 10,000. In the conventional homo BPT, this value cannot be obtained but can be obtained by only the BPT of the present invention.

The above embodiment exemplifies an area sensor, but the present invention is also applicable to a line sensor.

As has been described above, according to the present embodiments, the impurity concentration of the emitter can be suppressed to be $10^{19}$ cm$^{-3}$ or less. Therefore, band-gap narrowing can be suppressed, and efficiency of injection from the emitter can be improved.

A band-gap narrowing effect obtained by a high boron concentration of the base and a mixed crystal effect obtained by using B together with Ge can cause to decrease a base band gap smaller than the emitter band gap. Therefore, the $h_{FE}$ of the BPT can be increased. In addition, the lattice distortion can be moderated, and therefore, defects at the interface can be minimized.

Embodiment 11

Figure 48:
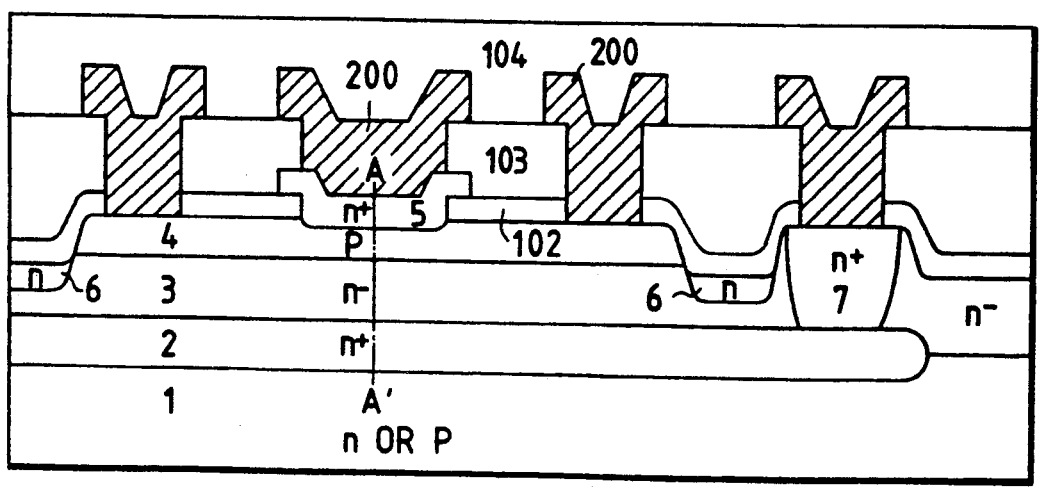

FIG. 48 is a view showing a semiconductor device according to an embodiment of the present invention. The same reference numerals as in FIG. 4 denote the same parts in FIG. 48. The semiconductor device of this embodiment is different from the semiconductor device of FIG. 4 in that an emitter region 5 is formed by growing a single crystal by epitaxial techniques or the like and the oxide 102 is not formed between a base region 4 and the emitter region 5.

A manufacturing process of the BPT of this embodiment is shown below.

① An n+-type buried region 2 (impurity concentration: $1\times10^{16}$ to $10^{19}$ cm$^{-3}$) is formed on a p- or n-type substrate 1 by ion implantation, impurity diffusion, or the like.

② An n⁻-type region 3 (impurity concentration: $1\times10^{14}$ to $10^{17}$ cm$^{-3}$) is formed by epitaxial techniques.

③ A recessed portion of an element isolation region 101 is formed.

④ A channel stopper 6 is formed by ion implantation.

⑤ An element isolation region 101 is formed by selectively oxidizing the recessed portion.

⑥ A base region 4 (impurity concentration: $1\times10^{16}$ to $10^{19}$ cm$^{-3}$) is formed.

⑦ An oxide film 102 is formed on the entire surface.

⑧ A hole serving as an emitter contact hole is formed in the oxide film 102 by etching.

⑨ An n+-type region (impurity concentration: $1\times10^{17}$ to $10^{21}$ cm$^{-3}$) serving as an emitter is formed by epitaxial techniques (self-aligned emitter region).

⑩ SiO$_2$ 103 is formed.

⑪ Electrodes 200 are formed.

⑫ Passivation 104 is formed.

The above steps constitute the manufacturing process of this embodiment. The most important steps in this embodiment are steps ⑧ and ⑨ which represent the manufacturing process of the emitter region. In these steps, after the silicon oxide film on the silicon surface constituting the surface base region is removed, single-crystal silicon is formed as the emitter region on the surface base region.

Single-crystal silicon can be grown by an epitaxial method using SiH$_4$, Si$_2$H$_6$, SiCl$_4$, SiHCl$_3$, or SiH$_3$Cl gas and a carrier gas. In this epitaxial method, the Si surface must be cleaned beforehand by a gas mixture of H$_2$ gas or HCl gas, or a gas mixture of a halogen gas such as HBr or HF. Cleaning and crystal growth can be performed at a low temperature and a low pressure of 10 to 100 Torr. The lower the temperature of cleaning and crystal growth is, the higher the packing density is. Surface cleaning can be performed by sputtering of a gas (e.g., Ar) or heating. In epitaxial growth, it is very important to perform perfect surface cleaning.

In order to cause a single crystal to epitaxially grow, the oxide film on the base region 4 must be removed. Although it is difficult to perfectly remove the oxide film, more perfect epitaxial growth can be performed in a smaller content of oxygen contained in the base surface.

The current gain h$_{FE}$ of the resultant BPT was measured, and a higher gain than the conventional BPT could be obtained.

Figure 49:
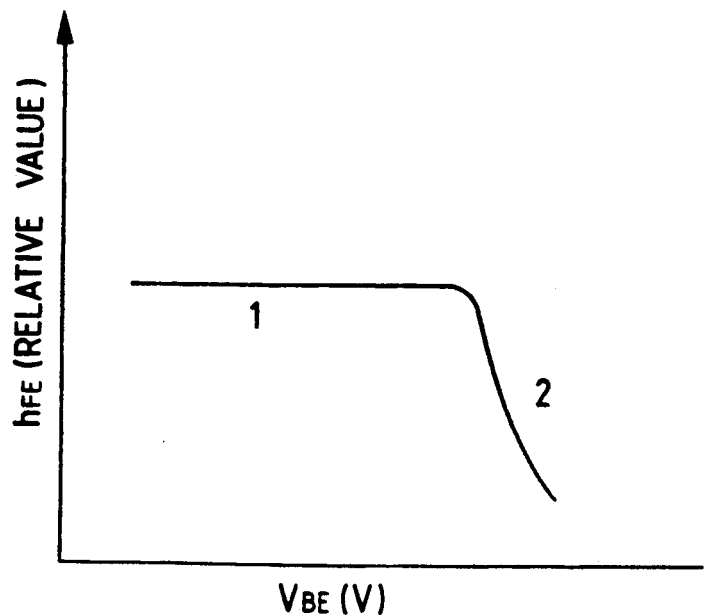
FIG. 49 shows a graph of relation between $h_{FE}$ and $h_{BE}$ of BPT in FIG. 48.

Measurement results of V$_{BE}$ dependency of h$_{FE}$ are shown in FIG. 49. As can be apparent from FIG. 49, the current gain h$_{FE}$ rarely depended on V$_{BE}$ under the condition $\exp(V_{BE}/kT) \gg 1$.

Embodiment 12

Figure 50:
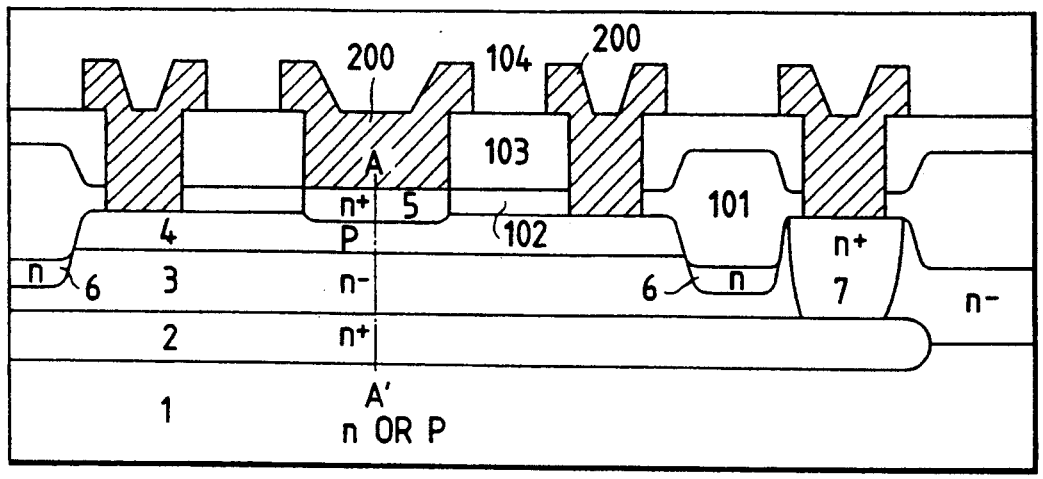

FIG. 50 shows another embodiment of the present invention.

A BPT of this embodiment is different from Embodiment 11 except that an emitter has a buried structure.

Since an end portion of an emitter region 5 in the BPT of Embodiment 11 is deposited on the oxide film (insulator 102), the substance on the oxide film is polysilicon. However in Embodiment 2, the entire emitter region 5 consists of a single crystal, and the current gain h$_{FE}$ can be further increased.

Embodiment 13

Figure 51:
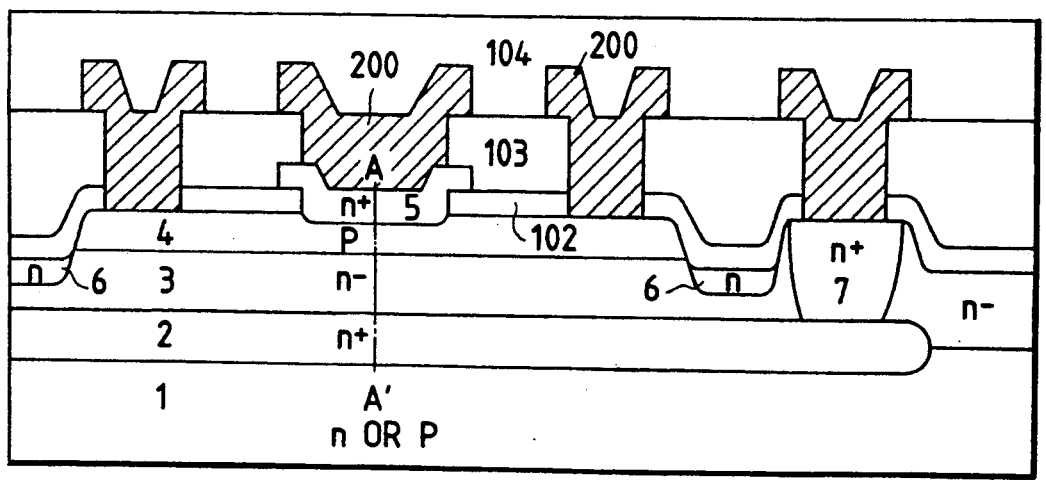

FIG. 51 is a view showing the embodiment 13 of the present invention. This embodiment exemplifies a BPT in which an element isolation region is a groove isolation structure.

The current gain h$_{FE}$ of this BPT can also be increased.

Embodiment 14

FIG. 41 is a circuit diagram wherein the BPT of the embodiment 11 is used in a solid-state image pickup apparatus. Referring to FIG. 41, the BPT shown in Embodiment 11 is used in a portion represented by Tr.

In this embodiment, the BPT is used as a photoelectric transducer element.

Figure 6:
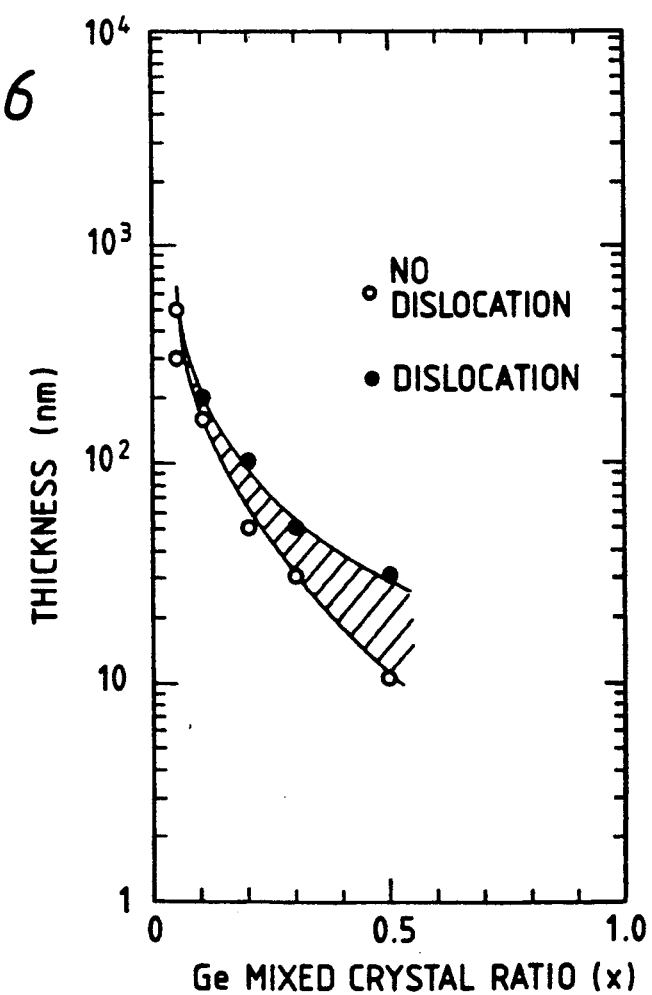
FIG. 6 shows a graph explaining a relation between a mixed crystal ratio X and a thickness of a layer without dislocation.

For example, when an area sensor shown in FIG. 6 is used as a color camera, optical information of the same photoelectric transducer element is read a plurality of times. In this case, since the optical information is read from the same element by a plurality of times, a ratio of the first read output to the second read output is very important. When this ratio is reduced, correction is required.

Figure 4:
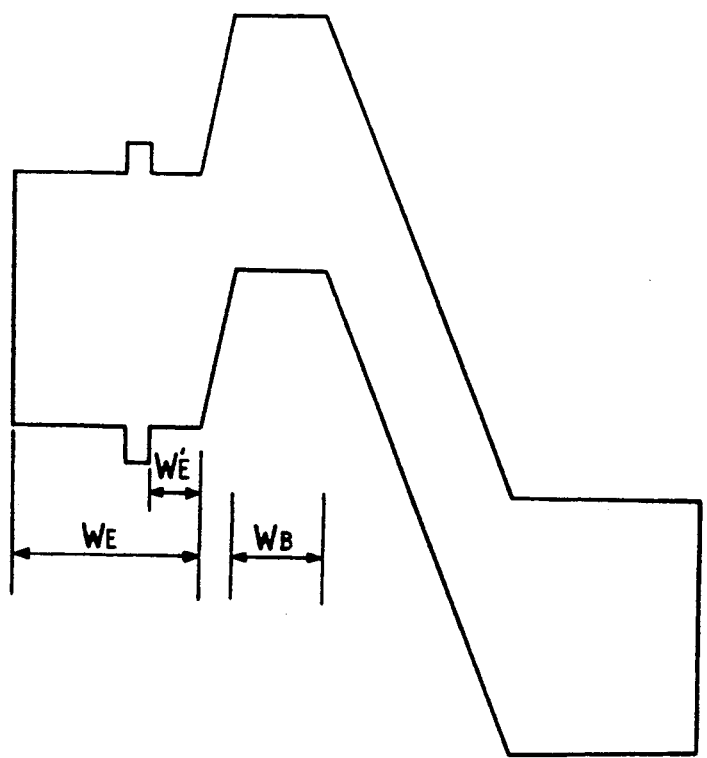
FIG. 4 shows a potential of normal operation of A—A' section of BPT in FIG. 3.
Figure 5:
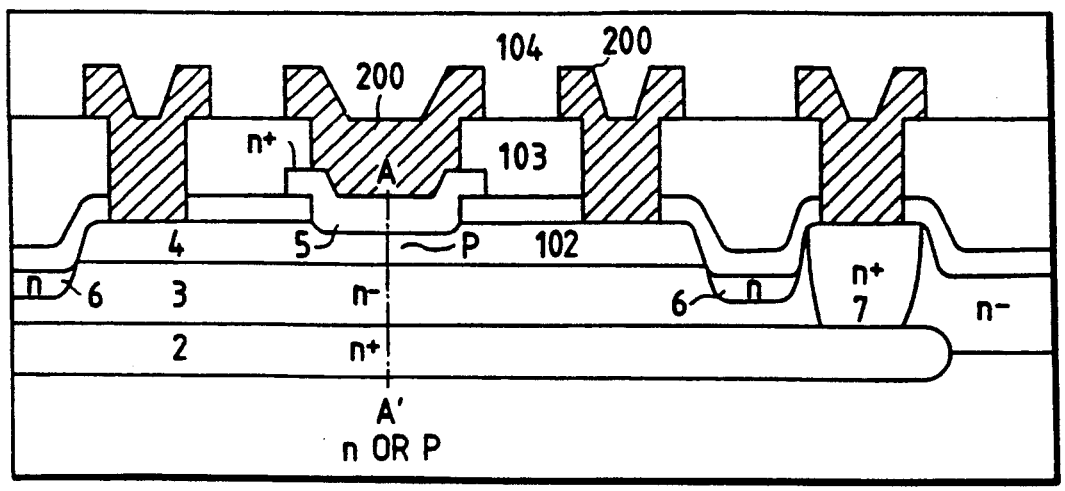

If the ratio of the first read output to the second read output is defined as a nondestructive degree, the nondestructive degree is represented by the following equation:

Nondestructive Degree $= (C_{tot} \times h_{FE})/(C_{tot} \times h_{FE} + C_V)$ where $C_{tot}$ is a total capacitance connected to the bases of the photoelectric transducer elements represented by Tr in FIG. 4. The total capacitance $C_{tot}$ is determined by a base-emitter capacitance $C_{be}$, a base-collector capacitance $C_{bc}$, and $C_{ox}$. $C_V$ is a stray capacitance of read lines represented by V$_{L1}$...V$_{Ln}$. Note that $C_{ox}$ is not present depending on circuit systems.

The nondestructive degree can be easily improved by increasing the current gain h$_{FE}$. That is, when h$_{FE}$ is increased, the nondestructive degree can be increased.

This embodiment exemplifies an area sensor. However, the present invention is also applicable to a line sensor.

As has been described above, according to the present Embodiments 11–14, since an oxide film is not formed between emitter and base regions, characteristic variations between the BPTs can be eliminated. Therefore, when the BPT is used as a line sensor, an area sensor, or any other semiconductor device, the product yield can be increased.

In addition, according to the present invention, since the emitter region consists of single-crystal silicon, the current gain h$_{FE}$ can be higher than that of the conventional structure although the oxide film is not formed between the emitter and base regions.

According to the present invention, there are provided a high-performance semiconductor device and a photoelectric transducer apparatus using the same at low cost.

Embodiment 15

As an embodiment of the present invention, a BPT having an arrangement as shown in FIG. 35 is formed by using an ion implantation method.

FIG. 24 is a graph showing impurity distributions and a Ge distribution at a portion indicated by A—A' in FIG. 35. Referring to FIG. 24, the abscissa represents a depth, and the ordinate represents impurity concentrations of Ge, P, and B. Note that the ordinate represents logarithmic values while the abscissa represents linear indications. Note that arsenic (As) is an impurity of an emitter region, B is an impurity of a base region, and Ge represents the concentration of Si$_{1-x}$Ge$_x$ in Si. In this case, As, B, and Ge does not always represent an absolute relationship.

Note that in this embodiment, As and B are used as impurities. The impurities, however, are not limited to those used in this embodiment.

Since an Si density is about $5 \times 10^{22}$ cm$^{-3}$, Ge = $5 \times 10^{21}$ cm$^{-3}$ if X = 0.1.

For example, when ion implantation is performed under the conditions of SiO$_2$ = 200 Å and Ge$_{74}$ of 150 keV to obtain a dose of Ge = $5 \times 10^{16}$ cm$^{-2}$, a Ge peak value of $5 \times 10^{21}$ cm$^{-3}$ is obtained at a portion separated from the surface of Si by 700 Å.

A relationship between the Ge peak value and the depth is uniquely determined by a relationship between the dose and the acceleration voltage. The thickness of a transition region between Si and Si$_{1-x}$Ge$_x$ is mainly determined by the acceleration voltage and annealing in the following process.

An emitter-base junction surface (E-B surface) is preferably close to a Ge peak concentration.

A ratio $\gamma$ of minority carriers to the base with respect to those to the emitter at the E-B junction is approximated by the following equation:

$$\gamma = (L_P D_n N_D / W_B D_P N_A) exp(\Delta E_g / kT) \qquad (26)$$

where $N_D/N_A$; a doping ratio between the emitter and the base, $D_N/D_P$; a diffusion coefficient ratio between the base and emitter minority carriers, $W_B$; a base width, and $E_g$; an emitter-base band gap reduction width.

In addition, $$exp(\Delta E_g / kT)$$

is an effect of an E-B heterojunction.

Assuming that $\Delta E_g \approx 0.1$ V and a temperature is room temperature, $exp(\Delta E_g/kT) \approx 54.5$, and $\Delta E_C \approx 0$ in $Si_{1-x}Ge_x$. Therefore, $\Delta E_g \approx \Delta E_V$ is obtained.

In a normal BPT constituted by only Si, a base current is determined by a recombination current $J_{Brec}$ of electrons from an emitter and an injection current $J_{Binj}$ from a base to the emitter.

Since $$J_B = J_{Brec} + J_{Binj}.$$

$h_{FE} \approx J_C/J_{Brec}$ is obtained when $J_{Brec} \gg J_{Binj}$. That is, $h_{FE}$ is increased as compared with that of a homojunction BPT. In a conventional $Si_{1-x}Ge_x$ heterojunction BPT, however, a stress is increased, and dislocation occurs in an extreme case. In addition, since many recombination centers are present in the interface between $Si_{1-x}Ge_x$ and Si, an overcurrent flows. $I_B$ is increased at a low current side, and $h_{FE}$ is significantly reduced in a region in which $I_C$ is small. FIG. 3 shows an improvement according to the present invention. Referring to FIG. 3, A represents a conventional HBT; and B, an HBT of the present invention.

In this embodiment, X is preferably 0.5 or less. If X exceeds 0.5, it is difficult to manufacture a good BPT. In addition, X of 0.5 or less is sufficient in the BPT.

A process of manufacturing the BPT of this embodiment will be described below.

① A buried region (n+) 2 is formed on a p- or n-type substrate 1.

② An n⁻-type region is formed by an epitaxial technique or the like.

③ An n+-type region 7 for reducing a collector resistance of a BPT is formed.

④ An element isolation region 101 is formed together with a channel stopper region.

⑤ A p-type impurity such as Ge and B or Ga or the like is formed on an n⁻-type region 3 by ion implantation to serve as a base region.

⑥ After a contact as an emitter is formed, polycrystalline or single-crystal silicon is deposited by low-pressure chemical vapor deposition or an epitaxial device, an impurity is doped, and a region 5 is patterned to form an emitter region.

⑦ After an insulator 103 is deposited, a contact hole is formed, and an Al material is deposited and patterned.

⑧ After an insulator 104 is deposited, an external extraction hole is formed.

The manufacturing process of this embodiment is as briefly described above. The most important part of this embodiment is a base region formation step described in item ⑤.

Although a heterojunction having an inclined transition region can be formed without using ion implantation, ion implantation is preferably used.

For example, a heterojunction having an inclined transition region can be formed by a vapor-phase growth method. In this case, an $H_2+SiH_2Cl_2+GeH_4$-based gas, for example, is used, and a gas concentration of $GeH_4$ is continuously changed to form a base region. If a temperature is 900° C. or less, a gas pressure is 100 Torr or less, and an epitaxial rate is 500 Å/min, the heterojunction can be formed more easily. In addition, the heterojunction is assumed to be obtained by an epitaxial technique in vacuum.

Ion implantation, however, is superior because a mixed crystal ratio can be stably set, a Ge concentration distribution can be correctly reproduced, and a mass production property is good.

In addition, since Si is in the amorphous form after ion implantation of Ge, it can be easily subjected to solid-phase epitaxy, thereby reducing the temperature of a process. Furthermore, since a diffusion constant of Ge or Si is very small, the Ge concentration distribution does not almost change upon ion implantation in an annealing step at 1,000° C. or less.

As described above, formation of a mixed crystal of $Si_{1-x}Ge_x$ by ion implantation has may advantages.

A distribution function with respect to a depth direction X in a semiconductor upon ion implantation is approximated as follows:

$$N(X) \approx (N_O/2.5R_P) exp(-(X-R_P)^2/(\Delta R_P)^2) \qquad (27)$$

where $N_o$ is an implantation amount per unit area, $R_P$ is a peak position, and $\Delta R_P$ is a distance from the peak to one diffusion amount (1 $\sigma$). $R_P$ and $\Delta R_P$ are changed by an acceleration voltage.

By forming the hetero BPT as described above, a point defect and dislocation in the hetero interface can be prevented to increase the current gain.

Embodiment 16

Another embodiment will be described below.

In the present invention, since Ge is ion-implanted in Si, an arbitrary impurity distribution can be easily formed by changing an acceleration voltage of ions. Therefore, by changing an acceleration voltage upon Ge ion implantation, X of $Si_{1-x}Ge_x$ can take different values in shallow and deep regions of the base.

In this embodiment, by changing an acceleration voltage upon Ge ion implantation, a transistor in which X of $Si_{1-x}Ge_x$ is larger in a deep region than in a shallow region of the base is manufactured.

Figure 52:
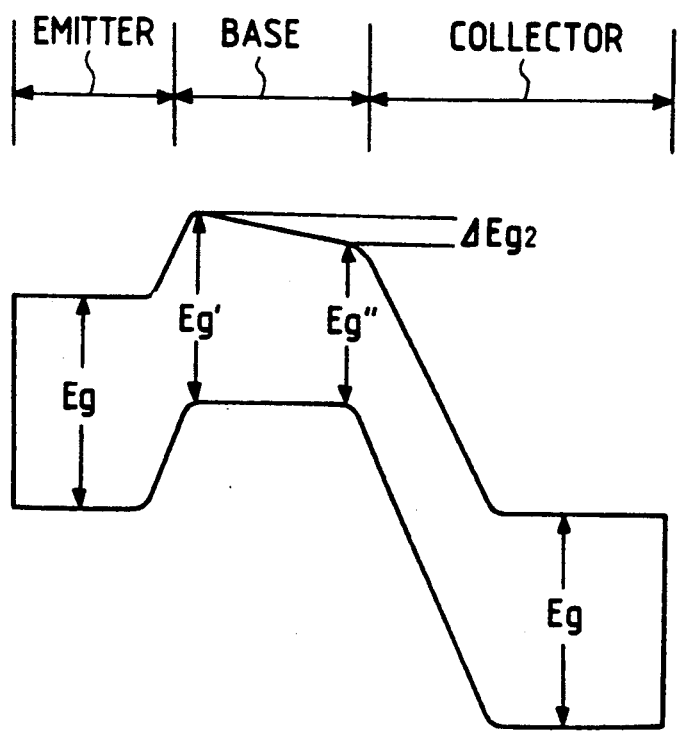
FIG. 52 shows potential of BPT of Embodiment 16.

FIG. 52 is a potential view of a BPT according to this embodiment. In the base close to the emitter, a band gap is $E_g'$ ($\Delta E_G = E_g - E_g'$) which is smaller than that of the emitter. In the base close to the collector, the band gap is $E_g''$ ($E_g' > E_g''$).

A propagation velocity of minority carriers in the base upon normal diffusion can be approximated by the following relation:

$$V_{di} \approx D_n/W_E = (kT/q) \cdot (1/W_B) \cdot \mu_n \qquad (28)$$

As shown in FIG. 52, when a potential inclination is present in the base, the minority carriers are moved by a drift, and the propagation velocity can be approximated by the following relation:

$$V_{di} \approx \mu_n E = \mu_n \cdot \Delta E_{g2}/W_B \quad (29)$$

Therefore, the drift effect is significant within the range of $\Delta E_{g2} > kT/q$. Since $kT/q$ is 0.025 eV at room temperature, an effect is obtained if the value is larger than that (i.e., a transit velocity V is increased). This effect becomes significant at a lower temperature. When the transit velocity V is increased, carriers in the base move rapidly to improve RF characteristics. In addition, in a drift structure, a moving velocity is not influenced by an operation temperature of a BPT.

Embodiment 17

Figure 53:
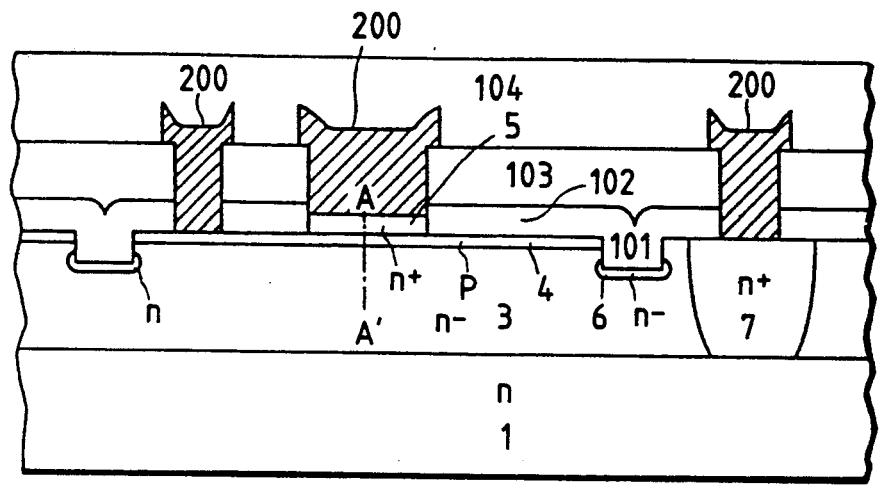

FIG. 53 shows the embodiment 17 of the present invention.

A hetero BPT according to this embodiment is the same as that of Embodiment 1 except that an emitter has a buried structure, a substrate 1 has an n conductivity type, and no buried region is formed.

In such a hetero BPT, $h_{FE}$ can be increased as in the hetero BPT shown in Embodiment 16.

Embodiment 18

Figure 54:
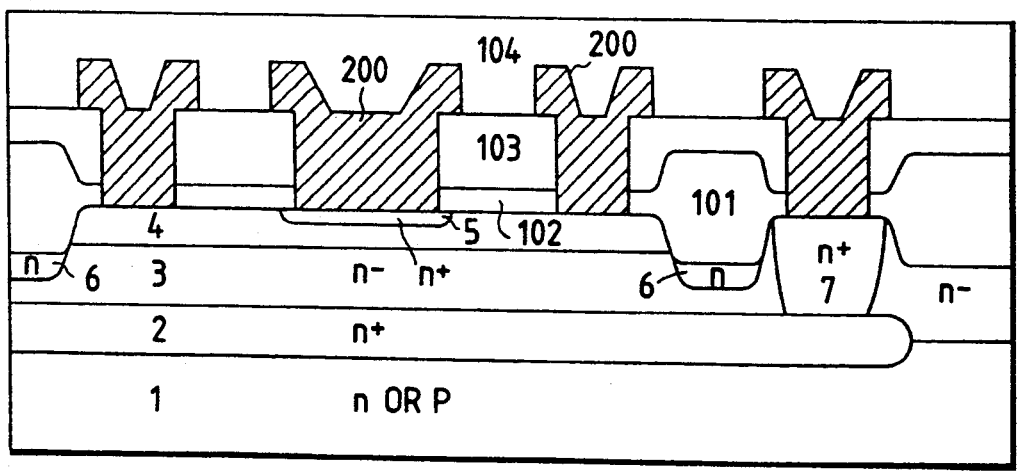

FIG. 54 shows an embodiment in which an emitter 5 is formed on a substrate.

In such a hetero BPT, $h_{FE}$ can be increased as in the hetero BPT of Embodiment 16.

Embodiment 19

FIG. 41 is a circuit diagram showing a case in which the hetero BPT shown in the first embodiment is applied to a solid-state image pickup apparatus. Referring to FIG. 41, the hetero BPT shown in Embodiment 16 is used in a portion indicated by Tr.

That is, in this embodiment, the hetero BPT is used as a photoelectric transducer element.

Since the present invention can improve $f_T$ (frequency) of a semiconductor device, the present invention is very effective when it is applied to a photoelectric transducer apparatus.

In the photoelectric transducer apparatus, $f_T$ is determined by a read rate.

A current photoelectric transducer apparatus (area sensor) has 500×640 elements. An HD (High Division: an area sensor corresponding to a high vision) has 1,000×2,000 elements. In an operation of a current television, a z horizontal scanning period HT≈50 μsec, and a horizontal blanking period HALK is 8 to 10 μsec. In the HD, however, HT=3 to 3.7 μsec and HBLK=26 μsec. Horizontal scanning is conventionally $T_H = 50$ μsec/640 = 80 nsec, while that of the HD is $T_H = 26$ nsec/2,000 = 13 nsec.

A frequency must be at least six times that of a current television. That is, since a frequency is currently $f_T \approx 1$ to 2 GHz, $f_T > 6$ to 16 GHz.

For the above reasons, $\Delta E_g$ is preferably 0.15 eV or less.

When the area sensor shown in FIG. 41 is to be used as a color camera, optical information of the same photoelectric transducer element is read a plurality of times. Since information is read from the same element a plurality of times, a ratio between electrical outputs upon first reading and reading from the second time is important. If this value is reduced, correction must be performed.

The ratio between the first and second read outputs is defined as a nondestructive degree.

The nondestructive degree is given by the following equation:

Nondestructive degree $= (C_{tot} \times h_{FE})/(C_{tot} \times h_{FE} + C_V)$ where $C_{tot}$ is a total capacitance connected to the bases of the photoelectric transducer elements indicated by Tr in FIG. 41 and is determined by a base-emitter capacitance $C_{be}$, a base-collector capacitance $C_{bc}$, and $C_{ox}$. $C_V$ is a stray capacitance of read lines represented by $VL_1 \ldots VL_n$. Note that $C_{ox}$ is not present depending on circuit systems.

The nondestructive degree can be easily improved by increasing $h_{FE}$. That is, when $h_{FE}$ is increased, the nondestructive degree can be increased.

In the HD-corresponding area sensor, $C_{tot} = 10$ fF and $C_V = 2.5$ PF. Therefore, in order to obtain the nondestructive degree of 0.90 or more, for example, $h_{FE}$ must be 2,250 or more. In order to assure a sufficient nondestructive degree, $h_{FE}$ must be 2,000 or more.

To the contrary, in a conventional homojunction BPT, for example, $h_{FE}$ is about 1,000. Therefore, no sufficient nondestructive degree can be obtained. In the semiconductor device of the present invention, however, a high nondestructive degree is obtained since $h_{FE}$ can be sufficiently increased.

The nondestructive degree is more preferably 0.98 or more. At this time, $h_{FE}$ must be about 10,000. This value cannot be achieved by a conventional hetero BPT or homo BPT. That is, this value can be achieved by only the hetero BPT of the present invention.

Note that although the area sensor is exemplified in this embodiment, the present invention can be applied to a line sensor.

As has been described above, according to the present Embodiments 16-18, since a heterojunction having an inclined transition region is formed in an interface between an $Si_{1-x}Ge_x$ mixed crystal and Si of a semiconductor device, the number of point defects and dislocations can be significantly reduced. Therefore, a current gain can be significantly improved in a region having a very small collector current.

In addition, according to the present invention, an ion implantation method is used. Therefore, a semiconductor device can be very easily manufactured to maintain a good mass production property.

That is, according to the present invention, a high-performance semiconductor device and a photoelectric transducer apparatus using the same can be provided at very low cost.

Embodiment 19

Figure 55:
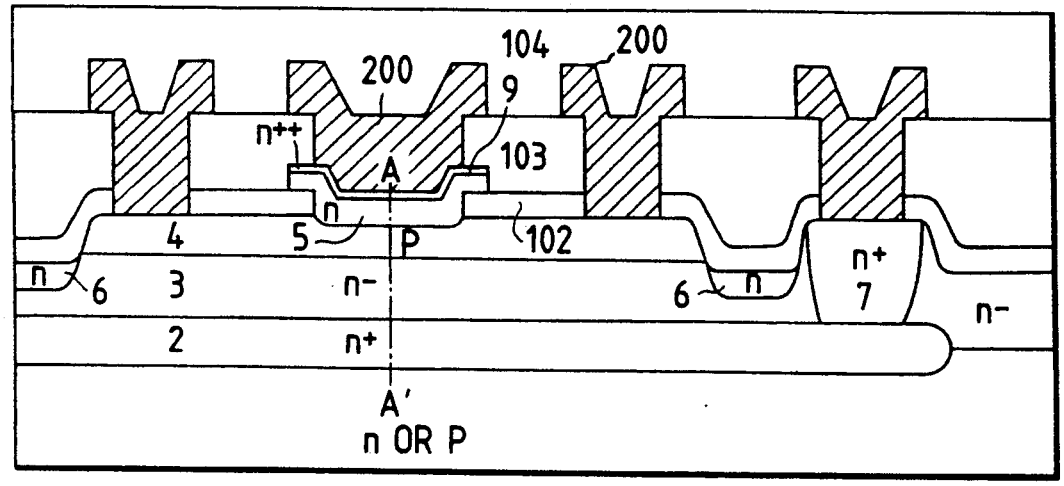

FIG. 55 is a schematic sectional view showing a semiconductor device according to an embodiment of the present invention. The same reference numerals as in FIG. 6 denote the same parts in FIG. 55. The semiconductor device of this embodiment differs from the convention semiconductor device in the following points.

(a) The silicon oxide film formed at the interface between a base region 4 and an emitter region 5 is eliminated.

(b) The emitter region 5 is made of single-crystal silicon.

(c) An impurity concentration near an interface between the emitter region and the base region 4 in the emitter region 5 is set to be $1 \times 10^{19}$ cm$^{-3}$ or less to prevent band-gap narrowing.

(d) An emitter region 9 having a high impurity concentration of $1 \times 10^{19}$ to $1 \times 10^{21}$ cm$^{-3}$ is formed between an emitter electrode 200 and the emitter region 5.

(e) B and Ge as impurities are doped in the base region 4 to correct lattice distortion of the base region, thereby decreasing the band gap.

A manufacturing process of the semiconductor device shown in FIG. 55 will be described below.

(1) As, Sb, P, or the like was doped in a p- or n-type substrate 1 by ion implantation or impurity diffusion to form an n$^+$-type buried region 2 (impurity concentration: $1 \times 10^{16}$ to $10^{19}$ cm$^{-3}$).

(2) An n$^-$-type region 3 (impurity concentration: $1 \times 10^{14}$ to $10^{17}$ cm$^{-3}$) was formed by epitaxial techniques.

(3) An n$^+$-type region 7 (impurity concentration: $1 \times 10^{17}$ to $10^{20}$ cm$^{-3}$) was formed to decrease a collector resistance.

(4) A channel stopper 6 was formed by ion implantation or thermal diffusion.

(5) An element isolation region 101 was formed by selective oxidation or CVD.

(6) A base region 4 was formed, Ge and B (BF$_2$, Gu, or the like may be used in place of B) were ion-implanted ($3 \times 10^{14}$/cm$^2$ at 40 keV for, e.g., B), and annealing was performed at 900° C. for 20 minutes.

(7) An emitter contact hole was formed in an oxide film 102, and an emitter region 5 was formed without being through a thin oxide film. In this embodiment, surface cleaning was performed by epitaxial techniques in an H$_2$ atmosphere at 900° C. and 10 Torr. Then, epitaxial growth was performed in an atmosphere of SiH$_2$Cl$_2$+H$_2$ at 900° C. and 50 Torr, thereby forming the emitter layer 5. In this case, the emitter opening portion consisted of single-crystal silicon. SiO$_2$ was converted into polysilicon.

(8) An n-type impurity such as As or Ph was ion-implanted in silicon (e.g., an impurity dose of $2.5 \times 10^{14}$ cm$^{-2}$ at an acceleration voltage of 60 kV for Ph), and annealing was performed at 1,000° C. for 30 minutes. An n-type impurity was ion-implanted in the surface again, and rapid annealing was performed (1,000° C. for 30 minutes) so as not to disturb the impurity distribution of the emitter and base.

(9) Additional annealing was performed, an insulating film 103 was deposited and then annealed, and contact holes are formed.

(10) Al-Si was sputtered to form electrodes 200, and the Al-Si layer was patterned.

(11) A passivation film 104 was formed after the Al-Si electrodes were alloyed.

The BPT shown in FIG. 55 was manufactured by the above steps. The most important steps in the present invention are step (6) of forming the base, step (7) of forming the single-crystal emitter, and step (8) of forming an impurity distribution in the emitter. These steps will be described in more detail below.

Step (6) of forming the base has effects wherein the shallow base is formed by forming a pre-amorphous base region upon ion implantation of Ge, and crystallization can be achieved upon doping of Ge. In order to obtain a high-speed BPT, the base must have a high impurity concentration and must be shallow.

In step (7) of forming the emitter, when a thin oxide film is formed on underlying silicon, good single-crystal silicon cannot be deposited. In this process, the natural oxide film is removed by a reduction action in a low-pressure H$_2$ atmosphere. However, surface cleaning may be performed by sputtering or the like using element ions in an HF gas or in a vacuum. In addition, film formation may be plasma CVD, CVD by sputtering, or the like. It is very important to suppress impurity diffusion from the base to the emitter during film formation. If the process is performed at 900° C. or less, this diffusion can be sufficiently suppressed.

In step (8) of forming the impurity distribution in the emitter, as a method of forming a region (LO) having a low impurity concentration and an surface area (HI) having a high impurity concentration from the emitter-base junction, an impurity doping method, annealing, or the like may be utilized to form the distribution.

Deposition of emitter Si, the impurity distribution, impurity activation, and the like can be performed by low-temperature annealing (less than about 900° C.) or a rapid annealing (e.g., lamp annealing and laser annealing).

The characteristics of the BPTs manufactured as described above were evaluated, and the current gains and frequency characteristics were improved.

Embodiment 20

Figure 56:
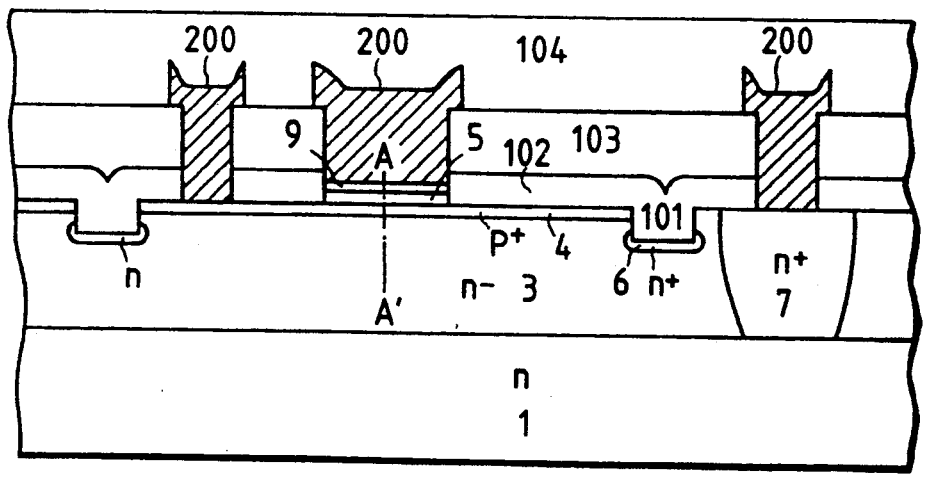

FIG. 56 shows another embodiment of the present invention.

This embodiment is different from Embodiment 19 except that an emitter is embedded in an insulating film 102.

The characteristics of the BPT of this type were evaluated, and the same characteristics as in the BPT of Embodiment 19 could be exhibited.

Embodiment 21

A photoelectric transducer apparatus using the BPT of Embodiment 19 will be described as the embodiment 21 of the present invention.

Figure 57:
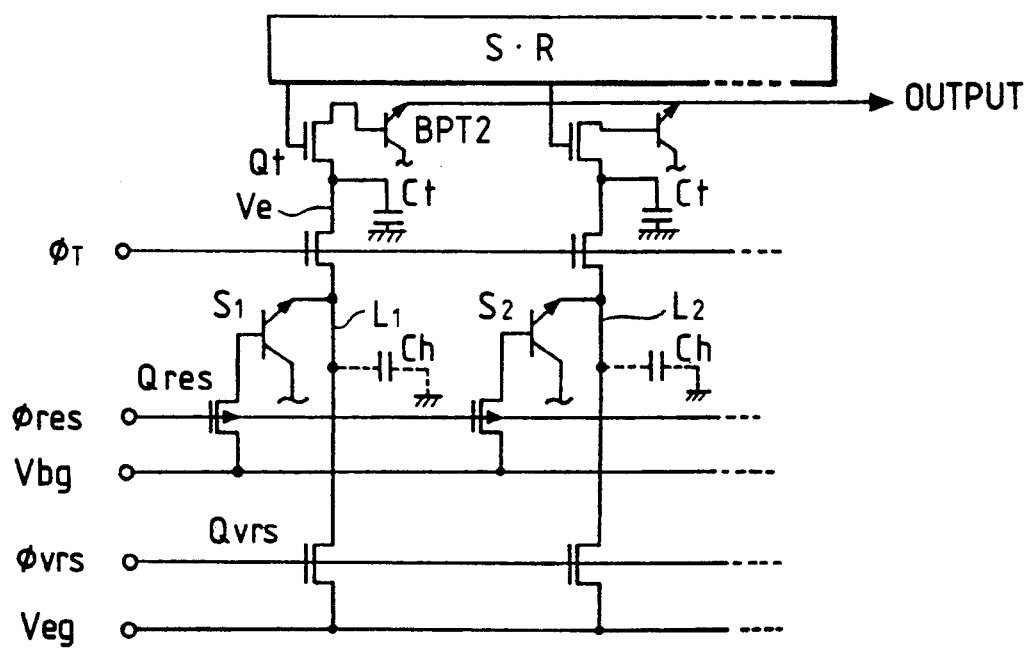
FIG. 57 shows a schematic circuit diagram of photoelectric conversion apparatus according to Embodiment 16.

FIG. 57 is a schematic circuit diagram of the photoelectric transducer apparatus of this embodiment.

This embodiment exemplifies a line sensor in which sensors S (S$_1$, S$_2$, ...) are aligned linearly.

Each sensor S consists of a bipolar transistor and a reset transistor Q$_{res}$ connected to the base of the bipolar transistor. Carriers excited by light incident on the base of the bipolar transistor are accumulated and are read to the emitter. The reset transistor Q$_{res}$ is turned on to reset the bipolar transistor to a predetermined potential.

A predetermined positive voltage is kept applied to the collector electrode of each sensor S, and emitter electrodes of the respective sensors S are connected to vertical lines L (L$_1$, L$_2$, ...).

A predetermined voltage V$_{eg}$ is applied to each vertical line L through a transistor Q$_{vrs}$, and a pulse $\phi_{vrs}$ for controlling the ON/OFF operation is input to the gate electrode of the transistor Q$_{vrs}$.

Each vertical line L is connected to an accumulation capacitor C$_t$, and a signal is output from a transistor BPT$_2$ through the transistor Q$_t$.

Embodiment 22

FIG. 41 is a circuit diagram in which the BPT shown in the embodiment 19 is used in a solid-state image pickup apparatus. The BPT shown in Embodiment 19 is used in a portion represented by Tr.

In this embodiment, the BPT is used as a photoelectric transducer element.

For example, when an area sensor shown in FIG. 11 is used as a color camera, optical information of the same photoelectric transducer element is read a plurality of times. In this case, since the optical information is read from the same element by a plurality of times, a ratio of the first read output to the second read output is very important. When this ratio is reduced, correction is required.

If the ratio of the first read output to the second read output is defined as a nondestructive degree, the nondestructive degree is represented by the following equation:

Nondestructive
Degree = $(C_{tot} \times h_{FE})/(C_{tot} \times h_{FE} + C_V)$ (30)

where $C_{tot}$ is a total capacitance connected to the bases of the photoelectric transducer elements represented by Tr in FIG. 14. The total capacitance $C_{tot}$ is determined by a base-emitter capacitance $C_{be}$, a base-collector capacitance $C_{bc}$ and $C_{ox}$. $C_V$ is a stray capacitance of read lines represented by $VL_1 \ldots VL_n$. Note that $C_{ox}$ is not present depending on circuit systems.

The nondestructive degree can be easily improved by increasing the current gain $h_{FE}$. That is, when $h_{FE}$ is increased, the nondestructive degree can be increased.

As has been described, according to the present Embodiments 19-22, the current gain and the frequency characteristics of the semiconductor device can be greatly improved.

According to the present invention, therefore, there is provided a high-performance semiconductor device and a photoelectric transducer apparatus using the same.

I claim:

1. A semiconductor device comprising a base region of a second conductivity type, at least an emitter region of a first conductivity type on a first side of said base region, a collector region of the first conductivity type on a second side of said base region, and an emitter electrode disposed on said emitter region, wherein said emitter region consists essentially of a single crystal,
an impurity concentration at least near an interface between said emitter region and said base region in said emitter region is not more than $1 \times 10^{19}$ cm$^{-3}$,
an emitter region having a high impurity concentration of $1 \times 10^{19}$ to $1 \times 10^{21}$ cm$^{-3}$ between said emitter electrode and said emitter region, and
B and Ge are doped as impurities in said base region, a Ge concentration is higher than a B concentration and said Ge being in a portion of said collector region at said second side of said base region.

2. A semiconductor device according to claim 1, characterized in that the impurity concentration of said base region is not less than $1 \times 10^{18}$ cm$^{-3}$.

3. A semiconductor device according to claim 2, characterized in that the impurity concentration of said base region is not more than $1 \times 10^{20}$ cm$^{-3}$.

4. A semiconductor device according to claim 1, wherein said base region includes B, and the Ge concentration is 8.25 times greater than the B concentration.

5. A semiconductor device having a base of a second conductivity type, at least an emitter of a first conductivity type on a first side of said base region and a collector of the first conductivity type on a second side of said base region, wherein
at least said base consists essentially of an $Si_{1-x}Ge_x$ crystal ($0 < x < 1$),
an interface between the $Si_{1-x}Ge_x$ crystal and an Si crystal is an inclined hetero interface, and
a depth of $Si_{1-x}Ge_x$ is larger than a depth of said base.

6. A semiconductor device according to claim 5, characterized in that in at least said base region, a Ge composition X is smaller in a shallow portion and larger in a deeper portion.

7. A semiconductor device according to claim 5, wherein Ge is an ion implant.

8. A photoelectric transducer apparatus characterized by using a semiconductor device of claim 5, wherein said base region is a light receiving region, said semiconductor device being capable of increasing frequency.

9. A semiconductor device having a base region of a first conductivity type, at least an emitter region of a second conductivity type on a first side of said base region and a collector region of a second conductivity type on a second side of said base region, wherein
(a) at least B and Ge are doped in said base region; and
(b) $N_D \leq 10^{19}$ cm$^{-3}$ and $N_{Ge} > N_B$ where $N_D$ is an impurity concentration within said emitter region in contact with said base region, $N_B$ is a B concentration of said base region, and $N_{Ge}$ is a Ge concentration in said base region and a portion of said collector region at said second side of said base region.

10. A semiconductor device according to claim 9, characterized in that $N_D$ falls within a range of $10^{17}$ to $10^{19}$ cm$^{-3}$.

11. A semiconductor device according to claim 9, characterized in that an Si layer having an impurity concentration of $10^{19}$ to $10^{21}$ cm$^{-3}$ is formed between said emitter region and an electrode.

12. A semiconductor device according to claim 9 characterized in that condition $N_D < N_B$ is established.

13. A semiconductor device comprising:
a first region comprising a film of Si as a matrix material and having a first conductivity;
a second region comprising a film of Si and Ge as a matrix material disposed on said first region, wherein at least one portion of said second region has said first conductivity and a second portion of said second region has a second conductivity;
a third region having said first conductivity comprising a film of Si as a matrix material disposed on said second region;
an emitter region defined at least by said first region;
a base region defined by the second portion of said second region having said second conductivity; and
a collector region defined by said third region and by the portion of the second region having said first conductivity, wherein an interface between said second region and said third region is disposed in said collector region.

14. A semiconductor device according to claim 13, characterized in that $Si_{1-x}Ge_x$ is $0.0625 \leq X \leq 0.375$.

15. A photoelectric transducer apparatus characterized by using a semiconductor device of claim 13, wherein said base region is a light receiving region, said semiconductor device being capable of increasing frequency.

16. A semiconductor device according to claim 13, characterized in that the Ge concentration is 8.25 times the B concentration.

17. A semiconductor device according to claim 13, characterized in that when an impurity concentration near an interface with said emitter region having the high impurity concentration in said emitter region is defined as $N_{E1}$ and an impurity concentration of said emitter region having the high impurity concentration is defined as $N_{E2}$, condition $N_{E2} > eN_{E1}$ is satisfied.

18. A photoelectric transducer apparatus characterized by using said semiconductor device of claim 13.

19. A photoelectric transducer apparatus using the semiconductor device of claim 13 or 1, wherein said base region is a light receiving region, said semiconductor device being capable of increasing frequency.

20. A semiconductor device according to claim 13, wherein said region including at least Si and Ge comprises $Si_{1-x}Ge_x$, wherein $0 < x < 1$.

21. A semiconductor device according to claim 13, wherein the quantity of Ge in said base region is greater than the quantity of Ge in said collector regions.

22. A semiconductor device comprising:
a base region of a first conductivity type, at least an emitter region of a second conductivity type on a first side of said base region, and a collector region of a second conductivity type on a second side of said base region, wherein between a first region and a second region having a desired energy band gap, a third region with an energy band gap narrower than said desired energy band gap of said first region and said second region is formed between said first region and said second region, said base region is formed within said third region, and an interface between said first and said third region is formed within said collector region.

23. A semiconductor device according to claim 22, wherein said third region comprises $Si_{1-x}Ge_x$ as a matrix material, wherein $0 < x < 1$, and said first and said second region comprises Si as a matrix material.

24. A semiconductor device according to claim 23, wherein x satisfies a condition that $0.0625 \leq x \leq 0.375$.

25. A photoelectric transducer apparatus comprising a semiconductor device as defined in claim 22, wherein said base region is a light receiving region and said semiconductor device being capable of increasing frequency.

26. A semiconductor device according to claim 22, wherein said base region includes B, and the Ge concentration is 8.25 times greater than the B concentration.

27. A semiconductor device according to claim 22, wherein an interface between said second region and said third region is formed.

* * * * *

UNITED STATES PATENT AND TRADEMARK OFFICE
CERTIFICATE OF CORRECTION

PATENT NO. : 5,159,424
DATED : October 27, 1992
INVENTOR(S) : MASAKAZU MORISHITA It is certified that error appears in the above-identified patent and that said Letters Patent is hereby corrected as shown below:

COLUMN 1

Line 67, "20 ° Å" should read --20 Å--.

COLUMN 2

Line 21, "region" should read --region 3--.

COLUMN 5

Line 11, "e" should read --$e_g$--.
Line 12, "s" should be deleted.
Line 18, "$\Delta E_g=22.5(N/10^{18})^{178}meV$" should read
--$\Delta E_g=22.5(N/10^{18})^{1/2}meV$--.
Line 32, "esp" should read --exp--.
Line 46, "esp" should read --exp--.
Line 51, "about to" should read --about $10^{20}$ to--.
Line 64, "(high" should read --(High--.

COLUMN 7

Line 53, "$Si_{1-xGex}$" should read --$Si_{1-x}Ge_x$--.

COLUMN 8

Line 63, "narrowering" should read --narrowing--.

COLUMN 9

Line 27, "fermi" should read --Fermi--.

UNITED STATES PATENT AND TRADEMARK OFFICE
CERTIFICATE OF CORRECTION

PATENT NO. : 5,159,424
DATED : October 27, 1992
INVENTOR(S) : MASAKAZU MORISHITA It is certified that error appears in the above-identified patent and that said Letters Patent is hereby corrected as shown below:

COLUMN 10

Line 30, "ni" should read --$n_i$--.
Line 40, "$J_{Bing} >> J_{Brec}$" should read --$J_{Bing} << J_{Brec}$--.
Line 44, "$h_{FE} \neq 2(L_N/W_B)^2$" should read --$h_{FE}=2(L_N/W_B)^2$--.

COLUMN 12

Line 56, "exp[(-4(m8)" should read --exp[(-4($m^*$)--.

COLUMN 14

Line 14, "lower N" should read --lower $N_D$--.
Line 17, "N" should read --$N_D$--.
Line 51, "$\Delta E_g = E_g = E_g'$." should read --$\Delta E_g = E_g - E_g'$.--.

COLUMN 15

Line 1, "N=cm$^{-3}$" should read --N=$10^{18}$cm$^{-3}$--.
Line 4, "esp" should read --exp--.
Line 28, "ni" should read --$n_i$--.
Line 41, "kT)9" should read --kT)--.
Line 47, "terms $n_i^2$" should read --terms $n_i^2$--.

COLUMN 17

Line 32, "does not" should read --does not form--.
Line 61, "VBE" should read --$V_{BE}$--.
Line 63, "VBE" should read --$V_{BE}$--.
Line 64, "exp($V_{BE}$/kT)>1." should read --exp($V_{BE}$/kT)>>1.--.

UNITED STATES PATENT AND TRADEMARK OFFICE
CERTIFICATE OF CORRECTION

PATENT NO. : 5,159,424
DATED : October 27, 1992
INVENTOR(S) : MASAKAZU MORISHITA It is certified that error appears in the above-identified patent and that said Letters Patent is hereby corrected as shown below:

COLUMN 18

Line 63, "$e^{1/2}/3h)$" should read --$e^{1/2})/3h$--.
Line 66, "$m^8$" should read $m^*$--.

COLUMN 21

Line 32, "r" should read --$r_{EE}$--.
Line 39, "depends of" should read --depends on--.
Line 52, "A inflection" should read --An inflection--.

COLUMN 23

Line 51, "$W_B>>L_n$ and $V_{BE}<<kT$," should read
--$W_B<<L_n$ and $V_{BE}>>kT$,--.

COLUMN 24

Line 1, "/kt" should read --/kT--.
Line 36, "untill" should read --until--.

COLUMN 27

Line 66, "$\exp(V_{BE}/kT)\geqq 1$)." should read --$\exp(V_{BE}/kT>>1)$.--.

COLUMN 28

Line 31, "$J_B\approx J_{BO}\cdot\exp(V_{BE}/kT($" should read --$J_B\approx J_{BO}\cdot\exp(V_{BE}/kT)$--.
Line 53, "ration" should read --ratio--.
Line 67, "$(NA/n_i)$" should read --$(N_A/n_i)$--.

UNITED STATES PATENT AND TRADEMARK OFFICE
CERTIFICATE OF CORRECTION

PATENT NO. : 5,159,424
DATED : October 27, 1992
INVENTOR(S) : MASAKAZU MORISHITA It is certified that error appears in the above-identified patent and that said Letters Patent is hereby corrected as shown below:

COLUMN 29

Line 19, "band band" should read --band--.
Line 20, "$2.1 \times 10^{-3}$" should read --$2.1 \times 10^{19} cm^{-3}$--.
Line 27, "is" should read --are--.

COLUMN 30

Line 60, "more the" should read --more than--.

COLUMN 31

Line 30, "where is" should read --where $\epsilon$ is--.
Line 57, "$\exp(V_{BE}/kT($" should read --$\exp(V_{BE}/kT)$--.

COLUMN 32

Line 3, "$J_c = q$" should read --$J_c \approx q$--.
Line 36, "$(i\ N_B \cdot N_D)$" should read --$(N_B \cdot N_D)$--.

COLUMN 34

Line 63, "$N_B > n_1^2$" should read --$N_B >> n_1^2$--.

COLUMN 37

Line 41, "has may" should read --has many--.

COLUMN 38

Line 25, "$F_T$" should read --$f_T$--.

UNITED STATES PATENT AND TRADEMARK OFFICE
CERTIFICATE OF CORRECTION

PATENT NO. : 5,159,424
DATED : October 27, 1992
INVENTOR(S) : MASAKAZU MORISHITA It is certified that error appears in the above-identified patent and that said Letters Patent is hereby corrected as shown below:

COLUMN 41

Line 8, "(High Diffusion;" should read --(High Division)--.
Line 15, "TH=50" should read --$T_H$=50--.
Line 16, "TH=26" should read --$T_H$=26--.

COLUMN 44

Line 16, "$V_{L1}$...$VL_n$" should read --$VL_1$...$VL_n$--.

COLUMN 46

Line 32, "has may" should read --has many--.

COLUMN 47

Line 49, "z" should be deleted.

COLUMN 52

Line 29, "9 ," should read --9,--.
Line 32, "an electrode." should read --an emitter electrode.--.

COLUMN 53

Line 5, "claim 13." should read --claim 1.--.
Line 8, "light receiving region," should read --light receiving station,--.

UNITED STATES PATENT AND TRADEMARK OFFICE
CERTIFICATE OF CORRECTION

PATENT NO.    : 5,159,424

DATED         : October 27, 1992

INVENTOR(S)   : MASAKAZU MORISHITA

It is certified that error appears in the above-identified patent and that said Letters Patent is hereby corrected as shown below:

COLUMN 53

Line 15, "regions." should read --region.--.

Signed and Sealed this

Second Day of August, 1994

Attest:

BRUCE LEHMAN

Attesting Officer          Commissioner of Patents and Trademarks